(12) United States Patent
Arakida et al.

(10) Patent No.: US 12,300,969 B2
(45) Date of Patent: May 13, 2025

(54) SURFACE EMITTING LASER, ELECTRONIC DEVICE, AND METHOD FOR MANUFACTURING SURFACE EMITTING LASER

(71) Applicants: SONY GROUP CORPORATION, Tokyo (JP); SONY SEMICONDUCTOR SOLUTIONS CORPORATION, Kanagawa (JP)

(72) Inventors: Takahiro Arakida, Kanagawa (JP); Shinichi Agatuma, Kanagawa (JP); Rintaro Koda, Tokyo (JP); Yasutaka Higa, Tokyo (JP); Osamu Maeda, Kanagawa (JP); Kota Tokuda, Kanagawa (JP)

(73) Assignees: Sony Group Corporation, Tokyo (JP); Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 18/268,873

(22) PCT Filed: Jan. 6, 2022

(86) PCT No.: PCT/JP2022/000231
§ 371 (c)(1),
(2) Date: Jun. 21, 2023

(87) PCT Pub. No.: WO2022/158301
PCT Pub. Date: Jul. 28, 2022

(65) Prior Publication Data
US 2024/0055833 A1 Feb. 15, 2024

(30) Foreign Application Priority Data
Jan. 20, 2021 (JP) .................................. 2021-007040

(51) Int. Cl.
*H01S 5/183* (2006.01)
*H01S 5/30* (2006.01)
*H01S 5/323* (2006.01)

(52) U.S. Cl.
CPC ...... *H01S 5/18311* (2013.01); *H01S 5/18361* (2013.01); *H01S 5/18397* (2013.01); *H01S 5/3095* (2013.01); *H01S 5/32308* (2013.01)

(58) Field of Classification Search
CPC ............ H01S 5/18311; H01S 5/18361; H01S 5/18397; H01S 5/3095; H01S 5/32308
See application file for complete search history.

(56) References Cited

U.S. PATENT DOCUMENTS

| | | | | |
|---|---|---|---|---|
| 6,317,446 B1 * | 11/2001 | Wipiejewski | ....... | H01S 5/18313 |
| | | | | 372/96 |
| 2001/0050934 A1 * | 12/2001 | Choquette | ............ | H01S 5/1833 |
| | | | | 372/50.11 |

(Continued)

FOREIGN PATENT DOCUMENTS

| | | |
|---|---|---|
| CN | 111224320 A | 6/2020 |
| JP | 2006019679 | 1/2006 |

(Continued)

OTHER PUBLICATIONS

Written Opinion of the International Search Authority dated Feb. 15, 2022.

(Continued)

*Primary Examiner* — Yuanda Zhang
(74) *Attorney, Agent, or Firm* — K&L Gates LLP

(57) ABSTRACT

The present technology provides a surface emitting laser capable of suppressing a decrease in luminous efficiency. The present technology provides a surface emitting laser including: first and second multilayer film reflectors; a plurality of active layers laminated together between the first and second multilayer film reflectors; a tunnel junction (Continued)

disposed between two active layers adjacent to each other in a lamination direction among the plurality of active layers; and an oxide confinement layer disposed between one active layer of the two adjacent active layers and the tunnel junction. According to the present technology, it is possible to provide a surface emitting laser capable of suppressing a decrease in luminous efficiency.

19 Claims, 47 Drawing Sheets

(56) References Cited

U.S. PATENT DOCUMENTS

| | | |
|---|---|---|
| 2005/0094692 A1 | 5/2005 | Kim |
| 2006/0285566 A1 | 12/2006 | Ueki |
| 2013/0188659 A1 | 7/2013 | Kondo et al. |
| 2017/0256915 A1* | 9/2017 | Ghosh .................. H01S 5/1833 |
| 2018/0261979 A1* | 9/2018 | Gerlach ............. H01S 5/18308 |
| 2020/0406544 A1* | 12/2020 | Rubin Ben Haim ....................... G03G 15/342 |
| 2021/0184432 A1* | 6/2021 | Berk ................... H01S 5/18377 |
| 2023/0130341 A1* | 4/2023 | Kang ................. H01S 5/02345 372/44.01 |

FOREIGN PATENT DOCUMENTS

| | | |
|---|---|---|
| JP | 2006019679 A | 1/2006 |
| JP | 2006351798 | 12/2006 |
| JP | 2006351798 A | 12/2006 |
| JP | 2007194561 | 8/2007 |
| JP | 2007194561 A | 8/2007 |
| JP | 2008180719 A | 8/2008 |
| JP | 2009238815 A | 10/2009 |
| JP | 2013175712 | 9/2013 |
| JP | 2013175712 A | 9/2013 |
| JP | 2014075569 A | 4/2014 |
| JP | 2018125404 A | 8/2018 |
| JP | 2019016628 | 1/2019 |
| JP | 2019016628 A | 1/2019 |
| JP | 2020524910 A | 8/2020 |
| JP | 2020155403 A | 9/2020 |
| WO | 2002045223 A1 | 6/2002 |
| WO | 2002245223 | 6/2002 |

OTHER PUBLICATIONS

International Search Report from corresponding PCT application PCT/JP2022/000231, dated Feb. 15, 2022.
T. Knodl et al., "CW room temperature operation of a diode cascade InGaAs / AlGaAs quantum well VCSEL", IEEE , 1999, p. 143-144, United States.

* cited by examiner

FIG. 44
A
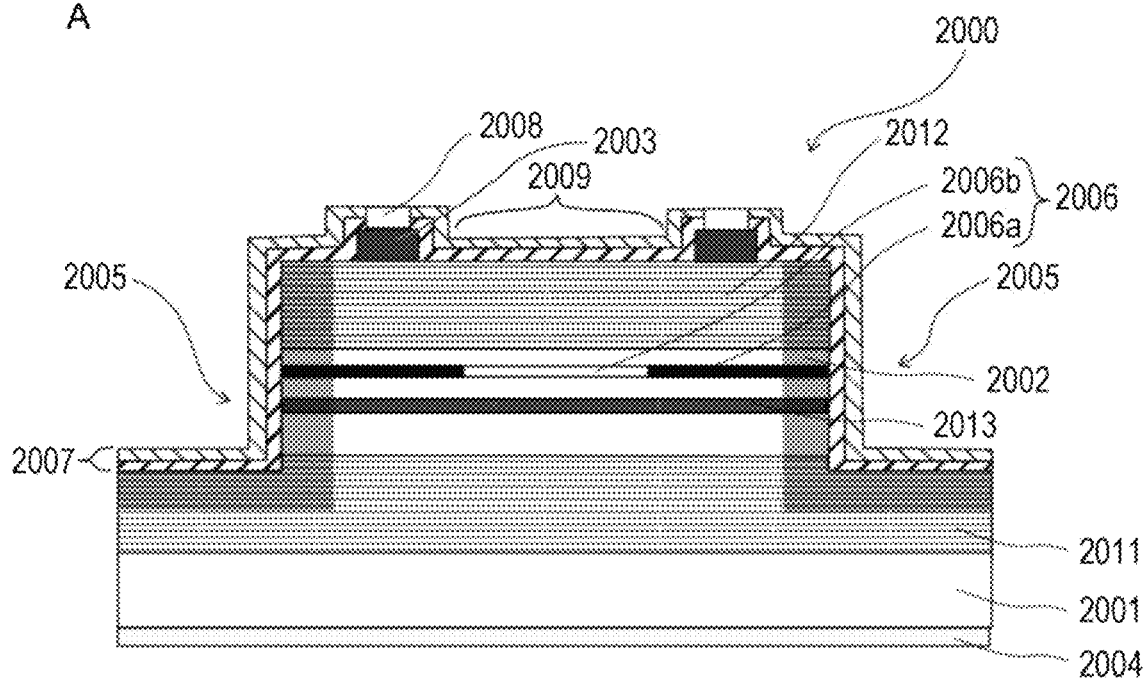
B
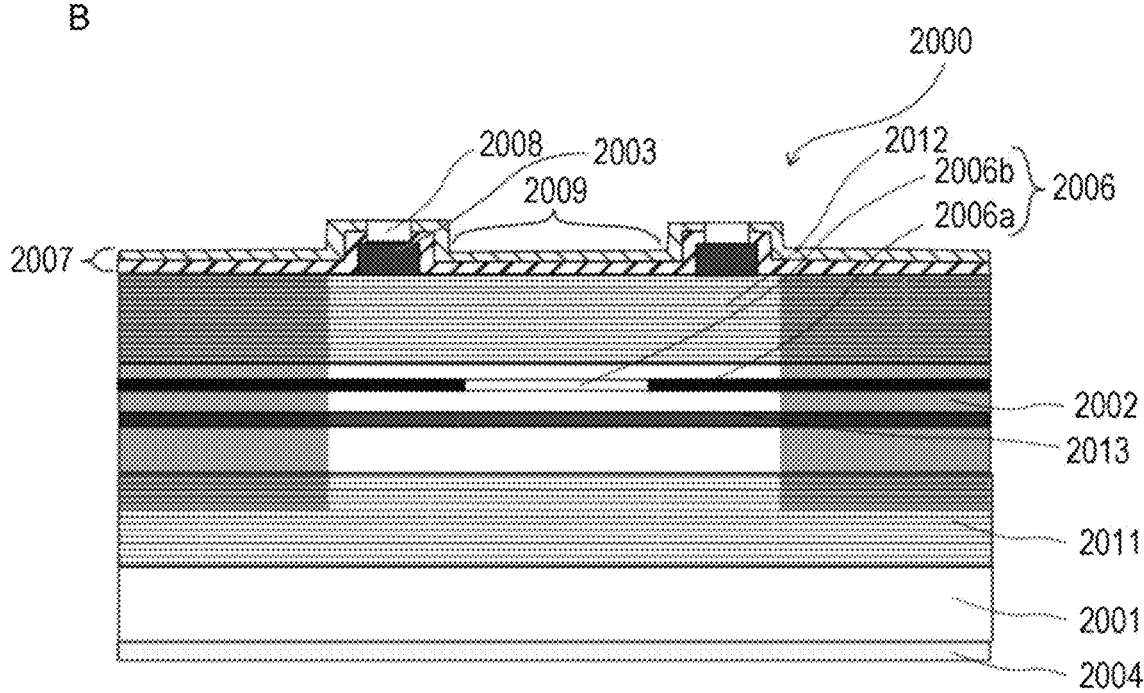

SURFACE EMITTING LASER, ELECTRONIC DEVICE, AND METHOD FOR MANUFACTURING SURFACE EMITTING LASER

TECHNICAL FIELD

The technology according to the present disclosure (hereinafter also referred to as "the present technology") relates to a surface emitting laser, an electronic device, and a method for manufacturing a surface emitting laser.

BACKGROUND ART

Conventionally, a surface emitting laser in which an active layer is disposed between first and second multilayer film reflectors is known. Among these surface emitting lasers, there is a surface emitting laser in which a tunnel junction, an active layer, and a current confinement layer are laminated in that order between first and second multilayer film reflectors (see, for example, Patent Document 1).

CITATION LIST

Patent Document

Patent Document 1: Japanese Patent Application Laid-Open No. 2006-351798

SUMMARY OF THE INVENTION

Problems to be Solved by the Invention

However, in the conventional surface emitting lasers, there is room for improvement in suppressing a decrease in luminous efficiency.

Therefore, a main object of the present technology is to provide a surface emitting laser capable of suppressing a decrease in luminous efficiency.

Solutions to Problems

The present technology provides a surface emitting laser including:
first and second multilayer film reflectors;
a plurality of active layers laminated together between the first and second multilayer film reflectors;
a tunnel junction disposed between two active layers adjacent to each other in a lamination direction among the plurality of active layers; and
an oxide confinement layer disposed between one active layer of the two adjacent active layers and the tunnel junction.

The one active layer may be disposed at a position farther from an emission surface of the surface emitting laser than another active layer of the two adjacent active layers.

The one active layer may be disposed at a position closer to one of the first and second multilayer film reflectors that is farther from the emission surface than another of the first and second multilayer film reflectors that is closer to the emission surface.

The one active layer may be disposed at a position closer to one of the first and second multilayer film reflectors that is closer to the emission surface than another of the first and second multilayer film reflectors that is farther from the emission surface.

The one active layer may be disposed at a position closer to an emission surface of the surface emitting laser than another active layer of the two adjacent active layers.

The one active layer may be disposed at a position closer to one of the first and second multilayer film reflectors that is farther from the emission surface than another of the first and second multilayer film reflectors that is closer to the emission surface.

The one active layer may be disposed at a position closer to one of the first and second multilayer film reflectors that is closer to the emission surface than another of the first and second multilayer film reflectors that is farther from the emission surface.

The plurality of active layers may be at least three active layers, the tunnel junction may be disposed between two adjacent active layers of each set of at least two sets of two adjacent active layers among the plurality of active layers, and the oxide confinement layer may be disposed between one active layer of at least one set of two adjacent active layers of the at least two sets of two adjacent active layers and the tunnel junction disposed between the two adjacent active layers.

The at least three active layers may include first, second, and third active layers, the first, second, and third active layers may be laminated in that order, a first tunnel junction, which is the tunnel junction, may be disposed between the first and second active layers, a second tunnel junction, which is the tunnel junction, may be disposed between the second and third active layers, and the oxide confinement layer may be disposed between the first active layer and the first tunnel junction and/or between the second active layer and the second tunnel junction.

The first active layer may be an active layer disposed at a position farthest from an emission surface of the surface emitting laser among the plurality of active layers.

A first oxide confinement layer, which is the oxide confinement layer, may be disposed between the first active layer and the first tunnel junction.

A second oxide confinement layer, which is the oxide confinement layer, may be disposed between the second active layer and the second tunnel junction.

The oxide confinement layer may not be disposed between the second active layer and the second tunnel junction.

Another oxide confinement layer may be disposed inside one of the first and second multilayer film reflectors closer to an emission surface of the surface emitting laser.

Both the oxide confinement layer and the another oxide confinement layer may be formed by selectively oxidizing a layer formed by an AlGaAs-based compound semiconductor.

The oxide confinement layer and the another oxide confinement layer may be different from each other in Al composition and/or optical thickness.

The tunnel junction may have a layer structure in which a p-type semiconductor layer and an n-type semiconductor layer are laminated together, and the oxide confinement layer may be disposed on the p-type semiconductor layer side.

If an oscillation wavelength of the surface emitting laser is $\lambda$, the one active layer, the tunnel junction, and the oxide confinement layer may be disposed within an optical thickness of $3\lambda/4$.

The present technology also provides an electronic device including the surface emitting laser.

The present technology also provides a method for manufacturing a surface emitting laser, the method including:
- a step of laminating a structure including a laminated structure in which a first active layer, a selected oxide layer, a tunnel junction, and a second active layer are laminated in that order on a first multilayer film reflector, and laminating at least a second multilayer film reflector on the structure to generate a laminate;
- a step of etching the laminate until at least a side surface of the selected oxide layer is exposed to form a mesa; and
- a step of selectively oxidizing the selected oxide layer from the side surface side to form an oxide confinement layer.

BRIEF DESCRIPTION OF DRAWINGS

FIG. 44A is a cross-sectional view along line X-X of FIG. 43. FIG. 44B is a cross-sectional view along line Y-Y of FIG. 43.

MODE FOR CARRYING OUT THE INVENTION

Figure 1:
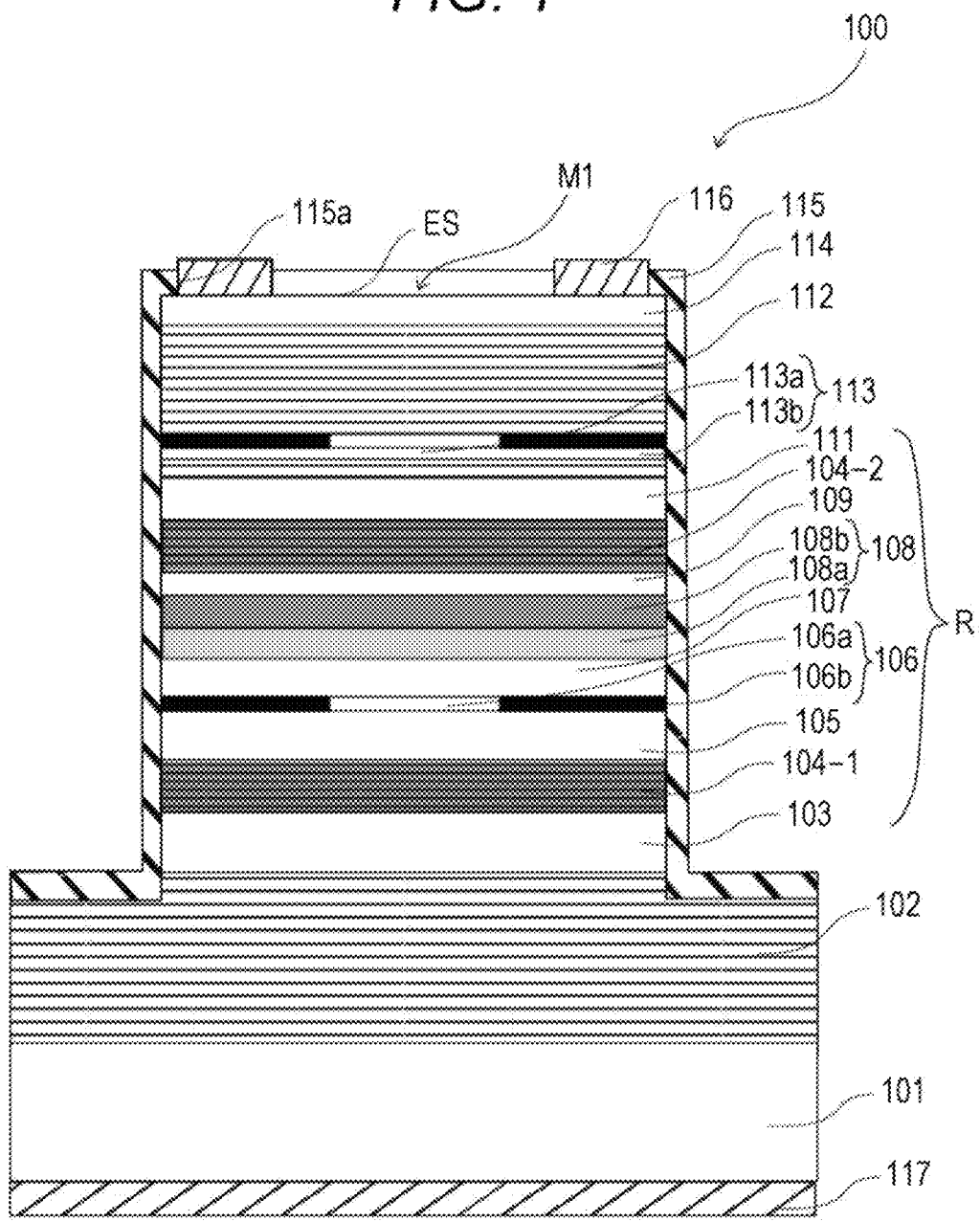
FIG. 1 is a cross-sectional view illustrating a configuration of a surface emitting laser according to a first embodiment of the present technology.

Hereinafter, preferred embodiments of the present technology will be described in detail with reference to the accompanying drawings. Note that, in the present specification and the drawings, components having substantially the same functional configuration are denoted by the same reference numerals, and redundant description will be omitted. The embodiments described below illustrate representative embodiments of the present technology, and the scope of the present technology is not to be narrowly interpreted according to these embodiments. In the present specification, even in a case where it is described that a surface emitting laser, an electronic device, and a method for manufacturing a surface emitting laser according to the present technology exhibit a plurality of effects, it is sufficient if the surface emitting laser, the electronic device, and the method for manufacturing a surface emitting laser according to the present technology exhibit at least one effect. The effects described in the present specification are merely examples and are not limiting, and other effects may be provided.

In addition, description will be given in the following order.
1. Surface Emitting Laser According to First Embodiment of Present Technology
   (1) Configuration of Surface Emitting Laser
   (2) Operation of Surface Emitting Laser
   (3) Method for Manufacturing Surface Emitting Laser (4) Effects of Surface Emitting Laser and Method for Manufacturing the Same
2. Surface Emitting Lasers According to Modifications 1 to 5 of First Embodiment of Present Technology
3. Surface Emitting Laser According to Second Embodiment of Present Technology
 (1) Configuration of Surface Emitting Laser
 (2) Operation of Surface Emitting Laser
 (3) Method for Manufacturing Surface Emitting Laser
 (4) Effects of Surface Emitting Laser
4. Surface Emitting Lasers According to Modifications 1 to 4 of Second Embodiment of Present Technology
5. Configuration Example of Surface Emitting Laser to Which Present Technology Can Be Applied
6. Modification of Present Technology
7. Application Example to Electronic Device
8. Example in Which Surface Emitting Laser Is Applied to Distance Measuring Device
9. Example in Which Distance Measuring Device Is Mounted on Mobile Body 1. Surface Emitting Laser According to First Embodiment of Present Technology (1) Configuration of Surface Emitting Laser FIG. 1 is a cross-sectional view illustrating a configuration of a surface emitting laser 100 according to a first embodiment of the present technology. Hereinafter, for the sake of convenience, the upper part in the cross-sectional view of FIG. 1 and the like will be described as an upper side, and the lower part in the cross-sectional view of FIG. 1 and the like will be described as a lower side.

As an example, as illustrated in FIG. 1, the surface emitting laser 100 includes first and second multilayer film reflectors 102 and 112, a plurality of (for example, two) active layers (for example, first and second active layers 104-1 and 104-2), a tunnel junction 108, and an oxide confinement layer 106.

As an example, each component of the surface emitting laser 100 is formed on a substrate 101 (semiconductor substrate).

As an example, the first and second multilayer film reflectors 102 and 112 are laminated together on the substrate 101. Here, the second multilayer film reflector 112 is disposed above the first multilayer film reflector 102.

The first and second active layers 104-1 and 104-2 are laminated together between the first and second multilayer film reflectors 102 and 112.

The tunnel junction 108 is disposed between the first and second active layers 104-1 and 104-2 which are two active layers adjacent to each other in the lamination direction (vertical direction) among the plurality of active layers.

As an example, the oxide confinement layer 106 is disposed between the tunnel junction 108 and the first active layer 104-1 which is one active layer of the first and second active layers 104-1 and 104-2 which are two active layers adjacent to each other in the lamination direction.

In the surface emitting laser 100, as an example, the first multilayer film reflector 102, the first active layer 104-1, the oxide confinement layer 106, the tunnel junction 108, the second active layer 104-2, and the second multilayer film reflector 112 are laminated in that order from the substrate 101 side (lower side) on the substrate 101.

Here, a resonator R includes the first and second active layers 104-1 and 104-2, the tunnel junction 108, and the oxide confinement layer 106. That is, the surface emitting laser 100 has a resonator structure in which the resonator R is disposed between the first and second multilayer film reflectors 102 and 112.

As an example, a mesa M1 including a part (upper portion) of the first multilayer film reflector 102, the first and second active layers 104-1 and 104-2, the tunnel junction 108, the oxide confinement layer 106, and the second multilayer film reflector 112 is formed on the substrate 101. The mesa M1 constitutes a resonator structure (excluding the other part (lower part) of the first multilayer film reflector 102). The height direction of the mesa M1 substantially coincides with the lamination direction. The mesa M1 has, for example, a substantially cylindrical shape, but may have another shape such as, for example, a substantially elliptical columnar shape, a substantially prismatic shape, a substantially truncated pyramidal shape, a substantially truncated conical shape, or a substantially truncated elliptical cone shape.

As an example, the surface emitting laser 100 emits light from an emission surface ES at the top of the mesa M1. That is, as an example, the surface emitting laser 100 is a front surface emitting type surface emitting laser.

The first active layer 104-1 is disposed at a position farther from the emission surface ES of the surface emitting laser 100 than the other active layer 104-2 of the two adjacent active layers.

The first active layer 104-1 is disposed at a position closer to the first multilayer film reflector 102, which is the other of the first and second multilayer film reflectors 102 and 112 farther from the emission surface ES, than the second multilayer film reflector 112, which is the one of the first and second multilayer film reflectors 102 and 112 closer to the emission surface ES. The first active layer 104-1 is disposed, for example, in the lower half portion of the resonator R. More specifically, the first active layer 104-1 is disposed, for example, near the downstream end of the current path in the resonator R.

The second active layer 104-2 is disposed at a position closer to the second multilayer film reflector 112 than the first multilayer film reflector 102. The second active layer 104-2 is disposed, for example, in the upper half portion of the resonator R. More specifically, the second active layer 104-2 is disposed, for example, near the upstream end of the current path in the resonator R.

The oxide confinement layer 106 is disposed at a position closer to the first multilayer film reflector 102 than the second multilayer film reflector 112. That is, the oxide confinement layer 106 is disposed, for example, in the lower half portion of the resonator R.

[Substrate]

As an example, the substrate 101 is a semiconductor substrate (for example, a GaAs substrate) of a first conductivity type (for example, n-type). A cathode electrode 117, which is an n-side electrode, is provided on the back surface (lower surface) of the substrate 101.

The cathode electrode 117 may have a single layer structure or a laminated structure.

The cathode electrode 117 is formed by, for example, AuGe/Ni/Au.

[First Multilayer Film Reflector]

As an example, the first multilayer film reflector 102 is disposed on the substrate 101.

As an example, the first multilayer film reflector 102 is a semiconductor multilayer film reflector. The multilayer film reflector is also referred to as a distributed Bragg reflector. A semiconductor multilayer film reflector, which is a type of multilayer film reflector (distributed Bragg reflector), has low light absorption, high reflectance, and conductivity.

More specifically, as an example, the first multilayer film reflector 102 is a semiconductor multilayer film reflector of a first conductivity type (for example, n-type), and has a structure in which a plurality of types (for example, two types) of semiconductor layers having different refractive indexes are alternately laminated with an optical thickness of a ¼ wavelength of an oscillation wavelength. Each refractive index layer of the first multilayer film reflector 102 is formed by an AlGaAs-based compound semiconductor of the first conductivity type (for example, n-type).

[First Active Layer]

As an example, the first active layer 104-1 is disposed on the first multilayer film reflector 102 via a first cladding layer 103 formed by a non-doped AlGaAs-based compound semiconductor. Note that the "cladding layer" is also referred to as a "spacer layer".

As an example, the first active layer 104-1 has a laminated structure in which an active region formed by a non-doped InGaAs-based compound semiconductor (for example, $In_{0.10}GaAs$) and a guide/barrier region (where both ends in the lamination direction are guide regions, and an intermediate portion in the lamination direction is a barrier region) formed by a non-doped AlGaAs-based compound semiconductor (for example, $Al_{0.10}GaAs$) are alternately laminated. Here, the first active layer 104 has, for example, two guide regions, two barrier regions, and three active regions.

The thickness of each active region is, for example, 7 nm. The thickness of the guide regions at both ends in the lamination direction is, for example, 10 nm. The thickness of the intermediate barrier region in the lamination direction is, for example, 8 nm.

Since the first active layer 104-1 has the laminated structure, the surface emitting laser 100 can perform laser oscillation with an oscillation wavelength in a 900 nm band, for example.

[Oxide Confinement Layer]

As an example, the oxide confinement layer 106 is disposed on the first active layer 104-1 via a spacer layer 105 formed by a non-doped AlGaAs-based compound semiconductor. Note that the spacer layer is also referred to as a "cladding layer".

As an example, the oxide confinement layer 106 includes a non-oxidized region 106a formed by an AlGaAs-based compound semiconductor (for example, AlGaAs, AlAs, or the like) and an oxidized region 106b formed by an oxide of an AlGaAs-based compound semiconductor (for example, $Al_2O_3$) surrounding the non-oxidized region 106a. It is preferable to use an AlGaAs film having an Al composition of 90% or more as a base material of the oxide confinement layer 106 (a selected oxide layer 106S to be described later).

If an oscillation wavelength of the surface emitting laser 100 is λ, the first active layer 104-1, the tunnel junction 108, and the oxide confinement layer 106 are disposed within an optical thickness of $3\lambda/4$.

The oxide confinement layer is also called a "current confinement layer".

[Tunnel Junction]

As an example, the tunnel junction 108 is disposed on the oxide confinement layer 106 via a spacer layer 107 formed by a non-doped AlGaAs-based compound semiconductor.

The tunnel junction 108 includes a p-type semiconductor layer 108a and an n-type semiconductor layer 108b laminated together. As an example, the p-type semiconductor layer 108a is disposed on the substrate 101 side (lower side) of the n-type semiconductor layer 108b. More specifically, as an example, the p-type semiconductor layer 108a is disposed between the oxide confinement layer 106 and the n-type semiconductor layer 108b in contact with the n-type semiconductor layer 108b.

(p-Type Semiconductor Layer)

As an example, the p-type semiconductor layer 108a is formed by a GaAs-based compound semiconductor, an AlGaAs-based compound semiconductor, an InGaAs-based compound semiconductor, or an AlGaInP-based compound semiconductor having a high carrier concentration. As a dopant material of the p-type semiconductor layer 108a, for example, C, Zn, Mg, or the like can be used. As the p-type semiconductor layer 108a, for example, a GaAs layer doped with carbon (C) at a high concentration (for example, $1\times10^{20}$ $cm^{-3}$) and having a thickness of 10 nm can be used.

(n-Type Semiconductor Layer)

As an example, the n-type semiconductor layer 107b is formed by an n-type GaAs-based compound semiconductor, an AlGaAs-based compound semiconductor, an InGaAs-based compound semiconductor, or an AlGaInP-based compound semiconductor having a high carrier concentration. As a dopant material of the n-type semiconductor layer 108b, Si, Te, Se, or the like can be used. As the n-type semiconductor layer 108b, for example, a GaAs layer doped with silicon (Si) at a high concentration (for example, $5\times10^{19}$ $cm^{-3}$) and having a thickness of 20 nm can be used.

[Second Active Layer]

As an example, the second active layer 104-2 is disposed on the tunnel junction 108 via a spacer layer 109 formed by a non-doped AlGaAs-based compound semiconductor.

As an example, the second active layer 104-2 has a layer configuration similar to that of the first active layer 104-1. That is, as an example, the second active layer 104-2 has a laminated structure in which an active region formed by a non-doped InGaAs-based compound semiconductor (for example, $In_{0.10}GaAs$) and a guide/barrier region (where both ends in the lamination direction are guide regions, and an intermediate portion in the lamination direction is a barrier region) formed by a non-doped AlGaAs-based compound semiconductor (for example, $Al_{0.10}GaAs$) are alternately laminated. Here, the second active layer 104-2 has, for example, two guide regions, two barrier regions, and three active regions.

The film thickness of each active region is, for example, 7 nm. The film thickness of the guide regions at both ends in the lamination direction is, for example, 10 nm. The film thickness of the intermediate barrier region in the lamination direction is, for example, 8 nm.

Since the second active layer 104-2 has the laminated structure, the surface emitting laser 100 can perform laser oscillation with an oscillation wavelength in a 900 nm band, for example.

[Second Multilayer Film Reflector]

As an example, the second multilayer film reflector 112 is disposed on the second active layer 104-2 via a second cladding layer 111 formed by a non-doped AlGaAs-based compound semiconductor.

As an example, the second multilayer film reflector 112 is a semiconductor multilayer film reflector. The multilayer film reflector is also referred to as a distributed Bragg reflector. A semiconductor multilayer film reflector, which is a type of multilayer film reflector (distributed Bragg reflector), has low light absorption, high reflectance, and conductivity.

More specifically, as an example, the second multilayer film reflector 112 is a semiconductor multilayer film reflector of a second conductivity type (for example, p-type), and has a structure in which a plurality of types (for example, two types) of semiconductor layers having different refractive indexes are alternately laminated with an optical thickness of a ¼ wavelength of an oscillation wavelength. Each refractive index layer of the second multilayer film reflector 112 is formed by an AlGaAs-based compound semiconductor of the second conductivity type (for example, p-type). As an example, the reflectance of the second multilayer film reflector 112 is set to be slightly lower than that of the first multilayer film reflector 102.

An oxide confinement layer 113, which is another oxide confinement layer, is disposed inside the second multilayer film reflector 112. As an example, the second multilayer film reflector 112 is one of the first and second multilayer film reflectors 102 and 112 closer to the emission surface ES of the surface emitting laser 100. As an example, the oxide confinement layer 113 includes a non-oxidized region 113a formed by an AlGaAs-based compound semiconductor (for example, AlGaAs, AlAs, or the like) of the second conductivity type (for example, n-type) and an oxidized region 113b formed by an oxide of an AlGaAs-based compound semiconductor (for example, $Al_2O_3$) surrounding the non-oxidized region 113a. It is preferable to use an AlGaAs film having an Al composition of 90% or more as a base material of the oxide confinement layer 113 (a selected oxide layer 113S to be described later).

As described above, each of the oxide confinement layers 106 and 113 is formed by selectively oxidizing a selected oxide layer formed by an AlGaAs-based compound semiconductor as an example. The oxide confinement layers 106 and 113 are preferably different from each other in Al composition and/or optical thickness. This is because the oxidation state of the base material (selected oxide layer) is different between the inside of the resonator R including the oxide confinement layer 106 and the inside of the second multilayer film reflector 112 including the oxide confinement layer 113 in the same oxidation atmosphere, and thus it is necessary to individually set the oxidation rate in order to obtain a desired oxide confinement diameter in each oxide confinement layer. The oxide confinement diameters of the oxide confinement layers 106 and 113 may be the same or different. Note that, in the selected oxide layer, the oxidation rate tends to increase as the Al composition increases, and the oxidation rate tends to increase as the optical thickness increases.

As an example, a contact layer 114 formed by a GaAs layer of the second conductivity type (for example, p-type) is disposed on the second multilayer film reflector 112. Here, as an example, the contact layer 114 constitutes the top of the mesa M1, and the central portion (the portion excluding the peripheral portion) of the upper surface of the contact layer 114 constitutes the emission surface ES.

The mesa M1 is covered with an insulating film 115 except for the central portion of the upper surface of the contact layer 114. The insulating film 115 is formed by a dielectric such as $SiO_2$, SiN, or SiON.

That is, a contact hole 115a is formed in the insulating film 115 on the top (for example, the contact layer 114) of the mesa M1, and an annular anode electrode 116, which is a p-side electrode, is provided in the contact hole 115a in contact with the top (for example, the contact layer 114) of the mesa M1. As an example, the anode electrode 116 is disposed in the contact hole 115a such that the center thereof substantially coincides with the center of the oxide confinement layer 113 as viewed from the lamination direction. The inside of the anode electrode 116 serves as an emission port of laser light.

The anode electrode 116 may have a single layer structure or a laminated structure.

The anode electrode 116 is formed by, for example, Ti/Pt/Au.

(2) Operation of Surface Emitting Laser

In the surface emitting laser 100 illustrated in FIG. 1, if a voltage is applied between the anode electrode 116 and the cathode electrode 117 and a current flows from the anode electrode 116 into the resonator structure including the mesa M1, the current is confined by the oxide confinement layer 113 and injected into the second active layer 104-2, and a current having substantially the same current value as the injected current is confined by the oxide confinement layer 106 and injected into the first active layer 104-1 due to a tunnel effect by the tunnel junction 108. Accordingly, when the first and second active layers 104-1 and 104-2 emit light with substantially the same emission intensity, and these light beams reciprocate while being amplified by the respective active layers between the first and second multilayer film reflectors 102 and 112 to satisfy the oscillation conditions, the light beams are emitted as laser light from the top of the mesa M1.

(3) Method for Manufacturing Surface Emitting Laser

Figure 2:
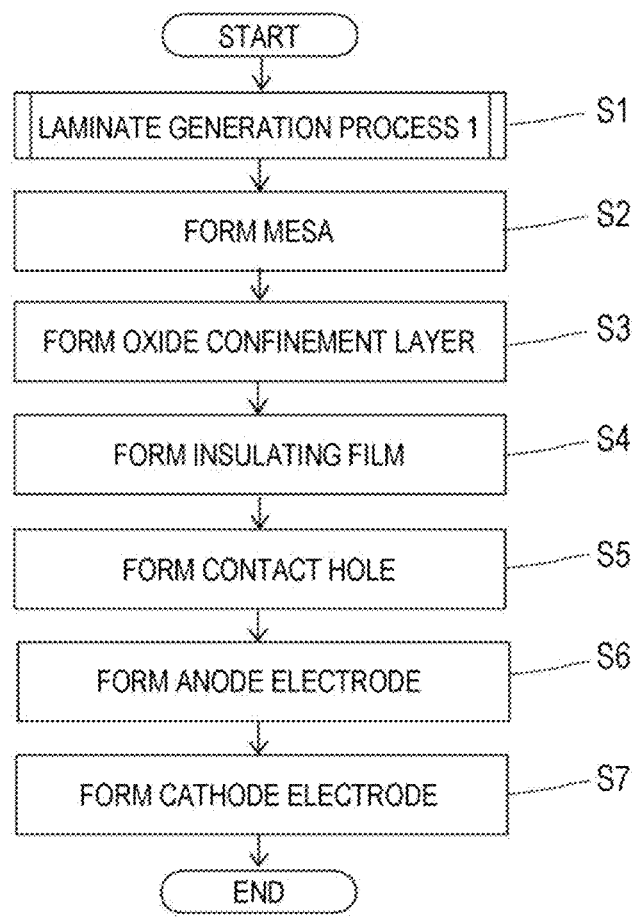
FIG. 2 is a flowchart for describing a method for manufacturing the surface emitting laser according to the first embodiment of the present technology.

Hereinafter, a method for manufacturing the surface emitting laser 100 will be described with reference to the flowchart (steps S1 to S7) in FIG. 2. FIG. 2 illustrates a procedure in which not only the surface emitting laser 100 but also a derivative of the surface emitting laser 100 can be manufactured. Here, as an example, a plurality of surface emitting laser arrays in which a plurality of surface emitting lasers 100 is two-dimensionally arranged is simultaneously generated on one wafer which is a base material of the substrate 101 by a semiconductor manufacturing method using a semiconductor manufacturing apparatus. Next, a series of a plurality of integrated surface emitting laser arrays is separated by dicing to obtain a plurality of chip-shaped surface emitting laser arrays (surface emitting laser array chips). Note that, by the manufacturing method described below, it is also possible to simultaneously generate a plurality of surface emitting lasers 100 on one wafer which is a base material of the substrate 101, and separate a series of the plurality of integrated surface emitting lasers 100 by dicing to obtain a chip-shaped surface emitting laser (surface emitting laser chip). The following series of steps is executed by the CPU of the semiconductor manufacturing apparatus.

<Step S1: Laminate Generation Process 1>

In the first step S1, a laminate generation process 1 is performed. In the laminate generation process 1, as an example, the layers constituting the surface emitting laser 100 are sequentially laminated in a growth chamber by a chemical vapor deposition (CVD) method, for example, a metal organic chemical vapor deposition (MOCVD) method to generate a laminate L1 (see FIG. 11). Specifically, as described in detail below, for example, a structure including a laminated structure in which the first active layer 104-1, the selected oxide layer 106S, the tunnel junction 108, and the second active layer 104-2 are laminated in that order is laminated on the first multilayer film reflector 102, and the second multilayer film reflector 112 including the selected oxide layer 113S therein is laminated on the structure to generate the laminate L1.

Figure 3:
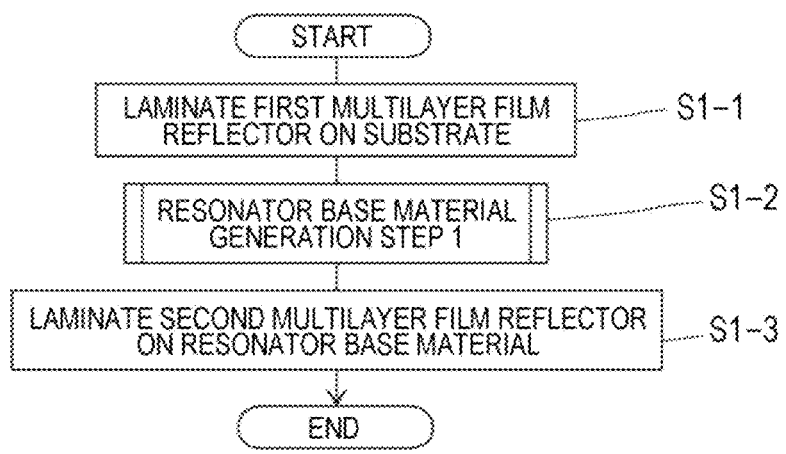
FIG. 3 is a flowchart for describing a first step (laminate generation process 1) in FIG. 2.

Hereinafter, the laminate generation process 1 (step S1 in FIG. 2) will be described with reference to the flowchart in FIG. 3.

(Step S1-1)

Figure 4:
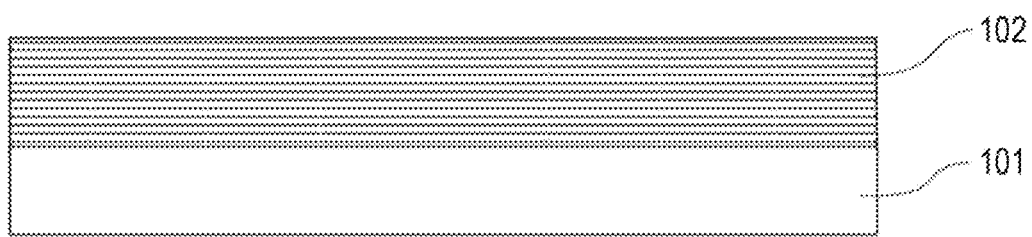
FIG. 4 is a first step diagram of FIG. 3.

In step S1-1, the first multilayer film reflector 102 is laminated on the substrate 101 (see FIG. 4).

(Step S1-2: Resonator Base Material Generation Step 1)

In step S1-2, a resonator base material generation step 1 is performed. As described in detail below, the resonator base material generation step 1 is a step of generating a resonator base material serving as the resonator R on the first multilayer film reflector 102.

Hereinafter, the resonator base material generation step 1 will be described with reference to the flowchart in FIG. 5 and FIGS. 6 to 10 (first lamination step diagram to fifth lamination step diagram).

Figure 6:
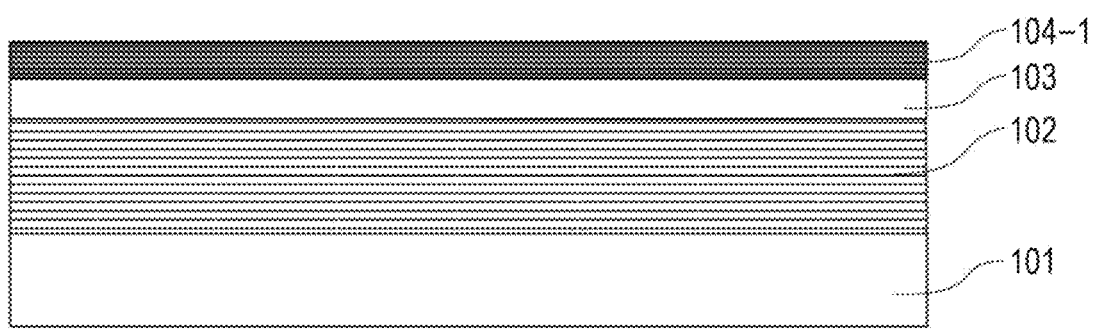
FIG. 6 is a first lamination step diagram of FIG. 5.

In step S1-2-1, the first active layer 104-1 is laminated on the first multilayer film reflector 102 (see FIG. 6). More specifically, the first active layer 104-1 is laminated on the first multilayer film reflector 102 with the first cladding layer 103 interposed therebetween.

In step S1-2-2, n is set to 1.

Figure 7:
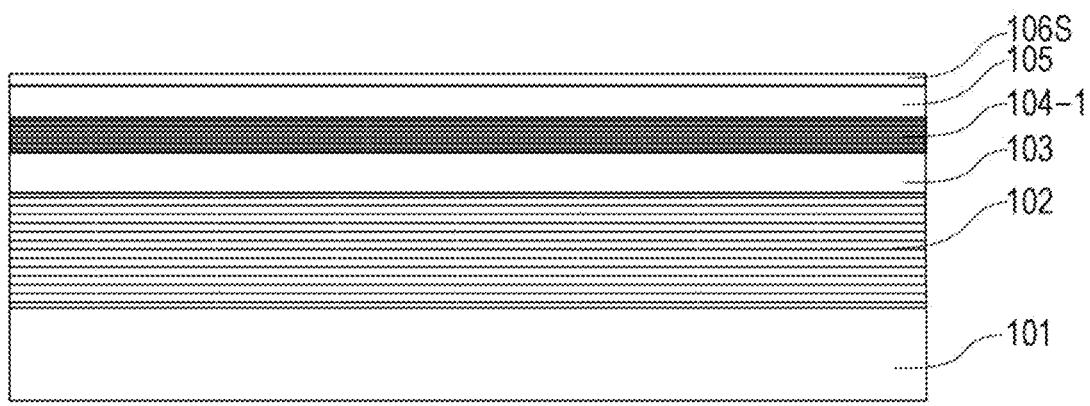
FIG. 7 is a second lamination step diagram of FIG. 5.

In step S1-2-3, the n-th selected oxide layer 106S-n is laminated on the n-th active layer 104-n (see FIG. 7). More specifically, the n-th selected oxide layer 106S-n is laminated on the first active layer 104-1 with the spacer layer 105 interposed therebetween. Here, the first selected oxide layer 106S-1 is the selected oxide layer 106S illustrated in FIG. 7.

Figure 8:
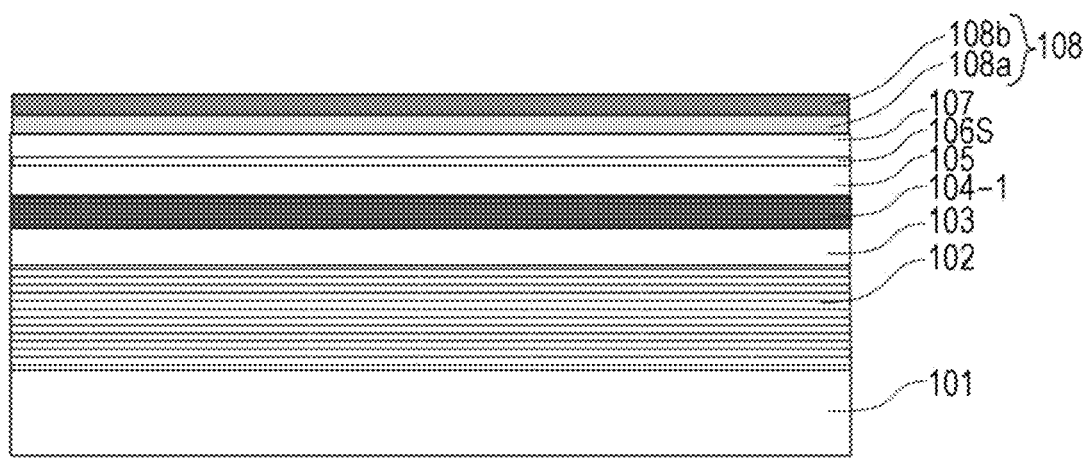
FIG. 8 is a third lamination step diagram of FIG. 5.

In step S1-2-4, the n-th tunnel junction 108-n is laminated on the n-th selected oxide layer 106S-n (see FIG. 8). More specifically, the p-type semiconductor layer 108a and the n-type semiconductor layer 108b constituting the n-th tunnel junction 108-n are laminated in that order on the n-th selected oxide layer 106S with the spacer layer 107 interposed therebetween.

Figure 9:
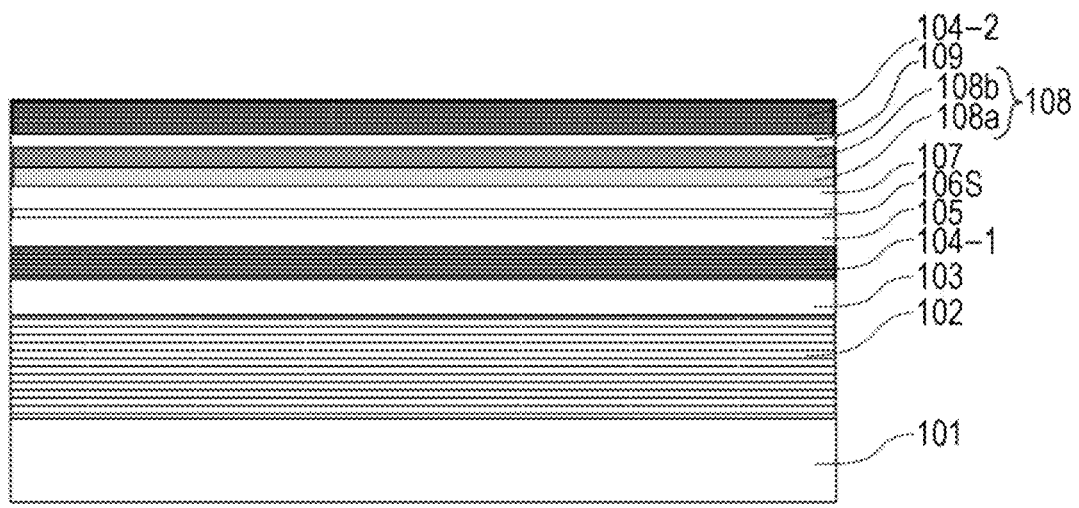
FIG. 9 is a fourth lamination step diagram of FIG. 5.

In step S1-2-5, the n+1-th active layer 104-(n+1) is laminated on the n-th tunnel junction 108-n (see FIG. 9). More specifically, the n+1-th active layer 104-(n+1) is laminated on the n-th tunnel junction 108-n with the spacer layer 109 interposed therebetween.

In step S1-2-6, it is determined whether or not n<N is satisfied. If the determination here is positive, the process proceeds to step S1-2-7, and if the determination is negative, the process proceeds to step S1-2-8. Here, N means the number of oxide confinement layers in the resonator. In the case of the surface emitting laser 100, since the number of oxide confinement layers in the resonator is one and N=1, when n=1, the determination in step S1-2-6 is negative, and the process proceeds to step S1-2-8.

In step S1-2-7, n is incremented. After step S1-2-7 is executed, the process returns to step S1-2-3, and a series of processes of S1-2-3 to S1-2-5 is executed again. Accordingly, the selected oxide layer, the tunnel junction, and the active layer can be further laminated in that order on the second active layer 104-2 to generate a resonator base material for manufacturing a derivative of the surface emitting laser 100.

Figure 10:
FIG. 10 is a fifth lamination step diagram of FIG. 5.

In step S1-2-8, the second cladding layer 111 is laminated on the n+1-th active layer 104-(n+1) (see FIG. 10). As a result, a resonator base material serving as a resonator is generated.

(Step S1-3)

Figure 11:
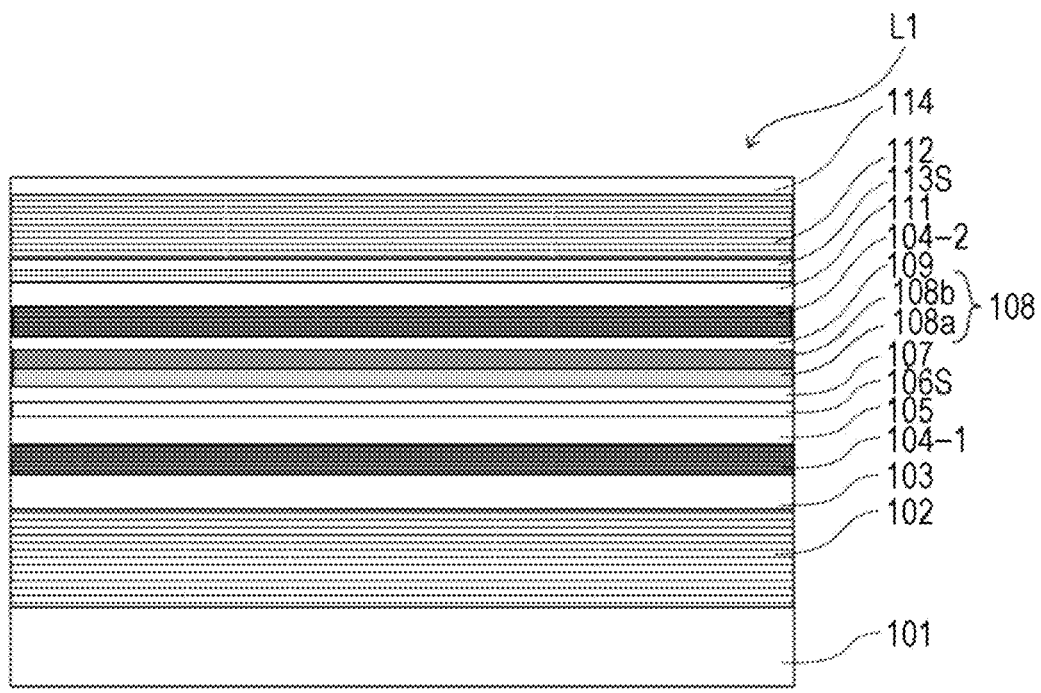
FIG. 11 is a third step diagram of FIG. 3.

In step S1-3, the second multilayer film reflector 112 is laminated on the resonator base material (see FIG. 11). More specifically, the second multilayer film reflector 112 including the selected oxide layer 113S therein and the contact layer 114 are laminated in that order on the second cladding layer 111 of the resonator base material. As a result, a laminate (for example, the laminate L1) is generated. If step S1-3 is executed, the laminate generation process 1 ends.

<Step S2>

Figure 12:
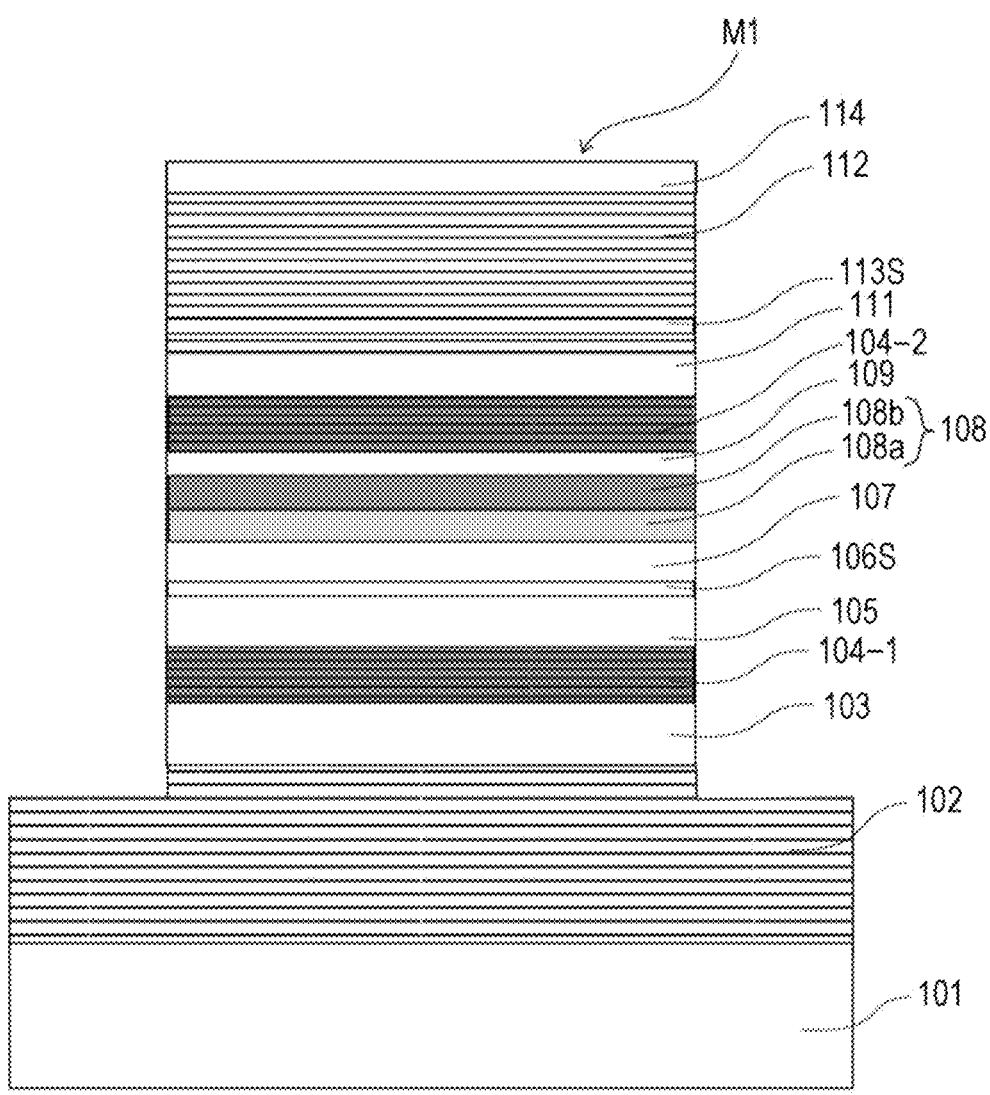
FIG. 12 is a second step diagram of FIG. 2.

In step S2, the laminate (for example, the laminate L1) is etched to form a mesa (for example, the mesa M1) (see FIG. 12).

Specifically, for example, a resist pattern is formed by photolithography on the laminate L1 taken out from the growth chamber. Next, using this resist pattern as a mask, the laminate L1 is etched by, for example, RIE etching (reactive ion etching) until at least the side surface of the selected oxide layer 106S is exposed, thereby forming the mesa M1. Here, as an example, the etching is performed until the side surface of the first cladding layer 103 is completely exposed (for example, until the etching bottom surface is located in the first multilayer film reflector 102). Thereafter, the resist pattern is removed.

<Step S3>

Figure 13:
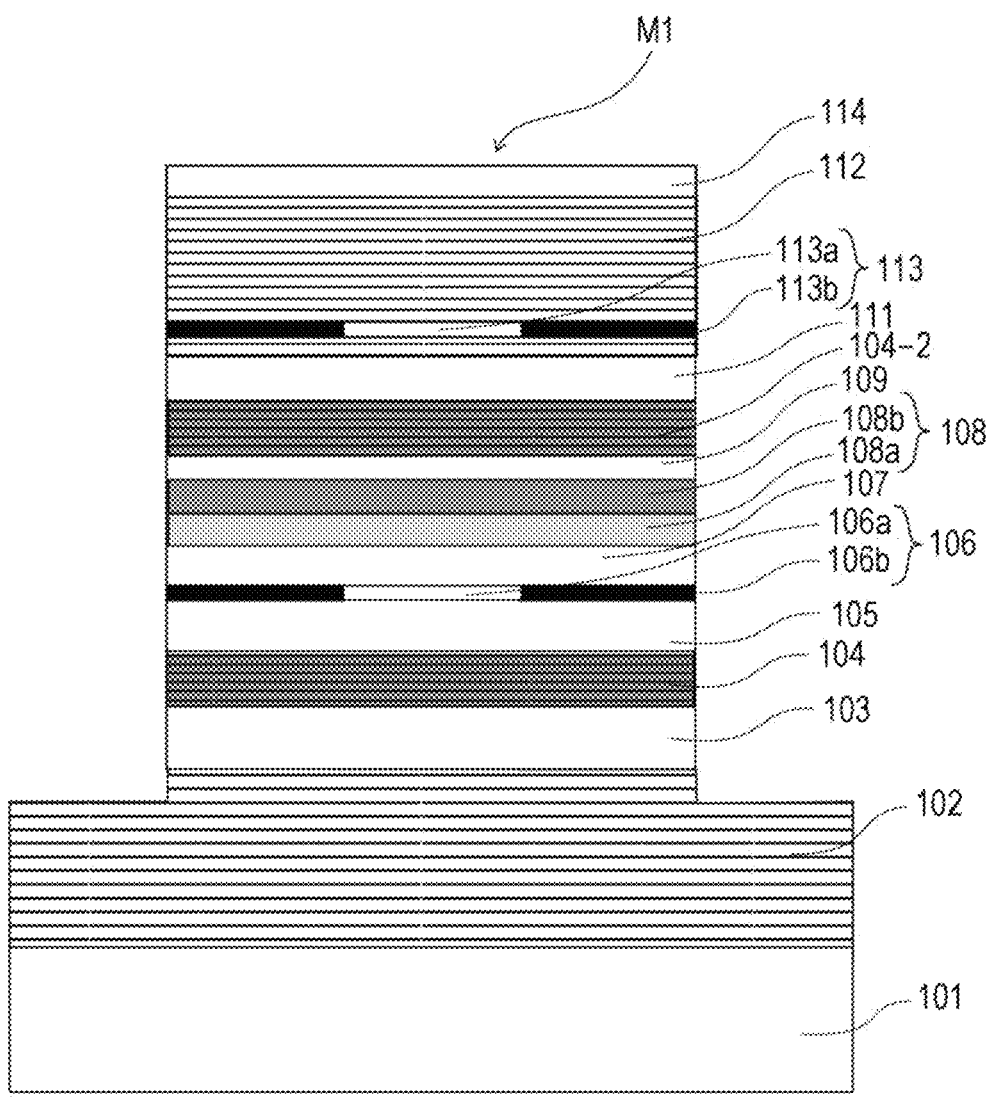
FIG. 13 is a third step diagram of FIG. 2.

In step S3, peripheral portions of the selected oxide layers 106S and 113S (see FIG. 12) are oxidized to generate oxide confinement layers 106 and 113 (see FIG. 13).

Specifically, for example, the mesa M1 is exposed to a water vapor atmosphere, and the selected oxide layers 106S and 113S are oxidized (selectively oxidized) from the side surfaces to form the oxide confinement layer 106 in which the periphery of the non-oxidized region 106a is surrounded by the oxidized region 106b and to form the oxide confinement layer 113 in which the periphery of the oxidized region 113a is surrounded by the oxidized region 113b.

<Step S4>

Figure 14:
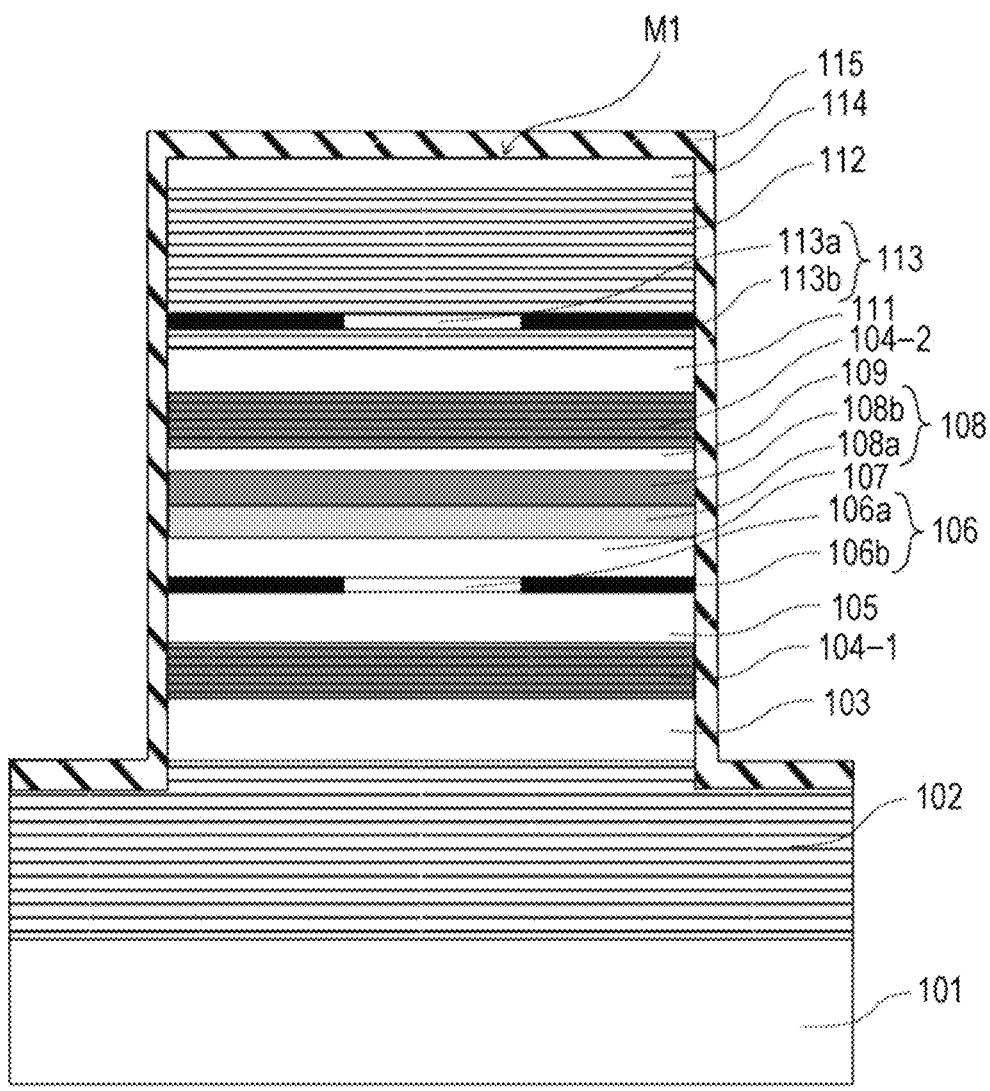
FIG. 14 is a fourth step diagram of FIG. 2.

In step S4, the insulating film 115 is formed (see FIG. 14). Specifically, for example, the insulating film 115 is formed over substantially the entire area of the laminate on which the mesa M1 is formed.

<Step S5>

Figure 15:
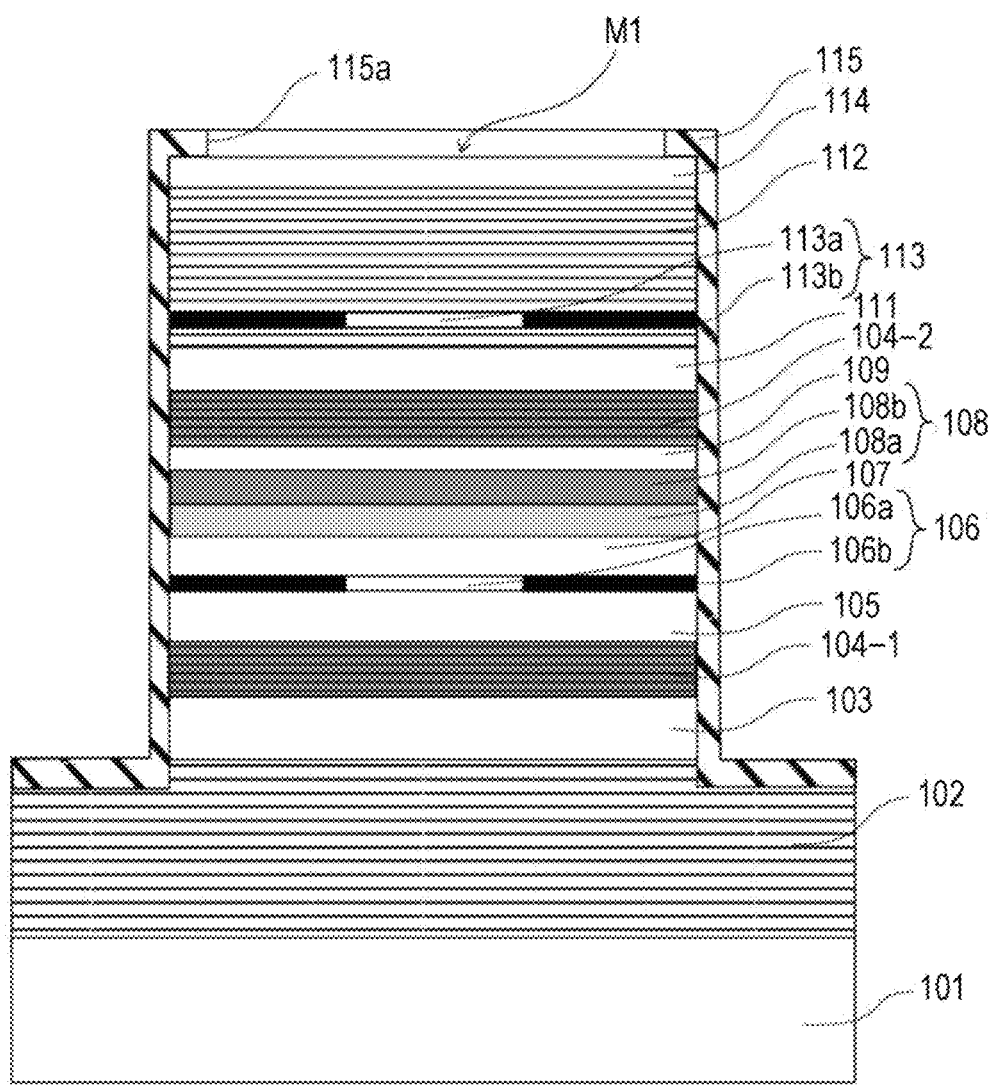
FIG. 15 is a fifth step diagram of FIG. 2.

In step S5, the contact hole 115a is formed (see FIG. 15). Specifically, for example, a resist pattern is formed by photolithography on the insulating film 115 other than the insulating film 115 formed on the top of the mesa M1. Next, using this resist pattern as a mask, the insulating film 115 formed on the top of the mesa M1 is removed by etching using, for example, a hydrofluoric acid-based etchant. Thereafter, the resist pattern is removed. As a result, the contact hole 115a is formed, and the contact layer 114 is exposed.

<Step S6>

Figure 16:
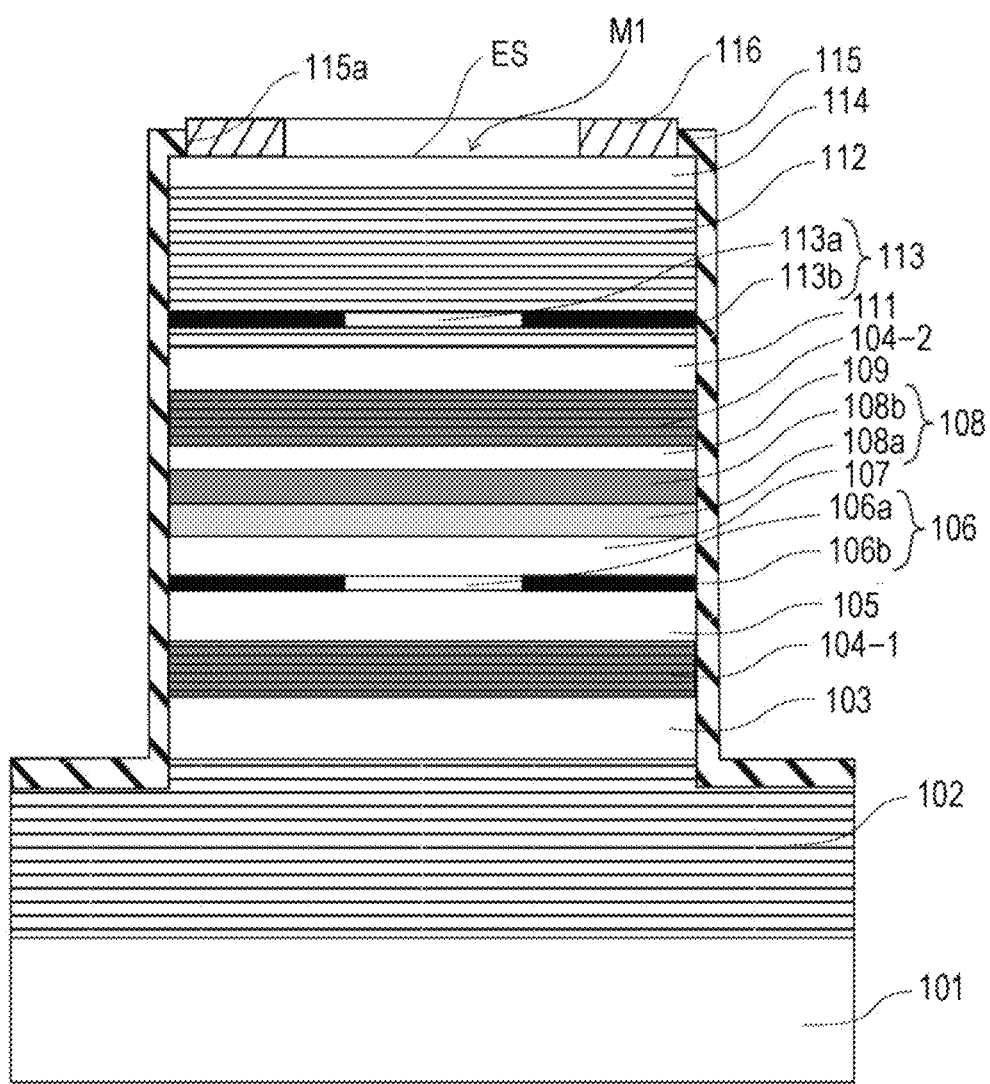
FIG. 16 is a sixth step diagram of FIG. 2.

In step S6, the anode electrode 116 is formed (see FIG. 16). Specifically, for example, a Ti/Pt/Au film is formed on the contact layer 114 via the contact hole 115a by an EB vapor deposition method, and the resist and, for example, Ti/Pt/Au on the resist are lifted off to form the annular anode electrode 116 in the contact hole 115a.

<Step S7>

Figure 17:
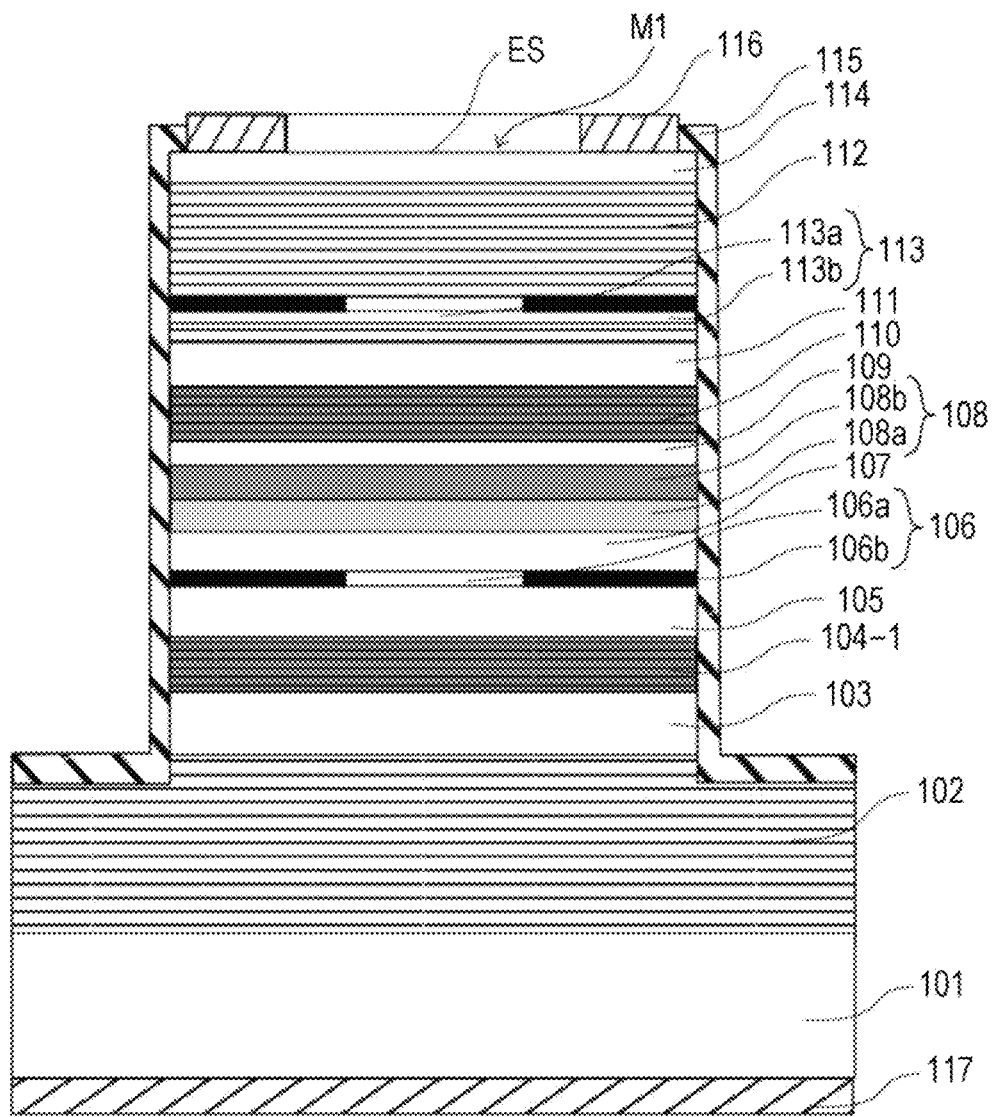
FIG. 17 is a seventh step diagram of FIG. 2.

In step S7, the cathode electrode 117 is formed (see FIG. 17). Specifically, after the back surface (lower surface) of the substrate 101 is polished, for example, an AuGe/Ni/Au film is formed on the back surface. If step S7 is executed, the flow of FIG. 2 ends.

(4) Effects of Surface Emitting Laser and Method for Manufacturing the Same

The surface emitting laser 100 according to the first embodiment of the present technology is a surface emitting laser including: the first and second multilayer film reflectors 102 and 112; the plurality of active layers (for example, the first and second active layers 104-1 and 104-2) laminated together between the first and second multilayer film reflectors 102 and 112; the tunnel junction 108 disposed between the first and second active layers 104-1 and 104-2 which are two active layers adjacent to each other in a lamination direction among the plurality of active layers; and the oxide confinement layer 106 disposed between the first active layer 104-1 which is one active layer of the two adjacent active layers and the tunnel junction 108.

In this case, for example, a current injected into the second active layer 104-2 via the tunnel junction 108 is confined by the oxide confinement layer 106 and injected into the first active layer 104-1. Accordingly, a current can be efficiently injected into the first active layer 104-1, and a decrease in luminous efficiency in the first active layer 104-1 can be suppressed.

As a result, according to the surface emitting laser 100 of the first embodiment, it is possible to provide a surface emitting laser capable of suppressing a decrease in luminous efficiency.

Further, according to the surface emitting laser 100, when the light generated in each of the first and second active layers 104-1 and 104-2 reciprocates between the first and second multilayer film reflectors 102 and 112, a light confinement effect is increased by the oxide confinement layer 106, and thus the control range of the emission angle of the laser light (emission light) can be expanded.

The first active layer 104-1, which is the one active layer (active layer sandwiching the oxide confinement layer 106 with the tunnel junction 108), is disposed at a position farther from the emission surface ES of the surface emitting laser 100 than the second active layer 104-2, which is the other active layer of the two adjacent active layers. Accordingly, the oxide confinement layer 106 can be disposed at a position farther from the emission surface ES (at least a position farther from the emission surface ES than the tunnel junction 108), and a current confinement effect at the position can be obtained. That is, in the resonator R provided between the first and second multilayer film reflectors 102 and 112, it is possible to confine the current injected into the first active layer 104-1 disposed at the position farther from the emission surface ES (at least the position farther from the emission surface ES than the oxide confinement layer 106), and it is possible to improve the current injection efficiency into the first active layer 104-1.

Note that, if the oxide confinement layer 106 is not provided in the resonator, for example, the current supplied from the side of the emission surface ES to the resonator is injected into the second active layer 104-2 and the first active layer 104-1 in that order while spreading in the resonator. In this case, since the first active layer 104-1 is located on the downstream end side of the current path in the resonator with respect to the second active layer 104-2, a wider current is injected. That is, the first active layer 104-1 is at a more disadvantageous position than the second active layer 104-2 in terms of current injection efficiency. For this reason, it is significant that the current injected into the first active layer 104-1 can be confined.

The first active layer 104-1, which is the one active layer (the active layer sandwiching the oxide confinement layer 106 with the tunnel junction 108), is disposed at a position (for example, the lower half portion of the resonator R) closer to the first multilayer film reflector 102, which is the other of the first and second multilayer film reflectors 102 and 112 farther from the emission surface ES, than the second multilayer film reflector 112, which is the one of the first and second multilayer film reflectors 102 and 112 closer to the emission surface ES. Accordingly, for example, the current injected into the first active layer 104-1 disposed in the lower half portion of the resonator R can be effectively confined by the oxide confinement layer 106.

Note that the first active layer 104-1, which is the one active layer (the active layer sandwiching the oxide confinement layer 106 with the tunnel junction 108), may be disposed at a position (for example, the upper half portion of the resonator R) closer to the second multilayer film reflector 112, which is the other of the first and second multilayer film reflectors 102 and 112 closer to the emission surface ES, than the first multilayer film reflector 102, which is the one of the first and second multilayer film reflectors 102 and 112 farther from the emission surface ES. In this case, the oxide confinement layer 106, the tunnel junction 108, and the second active layer 104-2 may also be disposed at a position (for example, the upper half portion of the resonator R) closer to the second multilayer film reflector 112 than the first multilayer film reflector 102.

The oxide confinement layer 113 (another oxide confinement layer) is disposed inside one of the first and second multilayer film reflectors 102 and 112 closer to the emission surface ES of the surface emitting laser 100. Accordingly, it is possible to effectively confine the current injected into the second active layer 104-2 disposed at the position closer to the emission surface ES (for example, the upper half portion of the resonator R (specifically, for example, near the upstream end of the current path in the resonator R)), of the first and second active layers 104-1 and 104-2.

It is preferable that both the oxide confinement layers 106 and 113 be formed by selectively oxidizing a layer formed by an AlGaAs-based compound semiconductor.

The oxide confinement layers 106 and 113 are different from each other in Al composition and/or optical thickness. Accordingly, in a case where the selective oxidation process is performed in the same oxidation atmosphere (for example, in the same water vapor atmosphere), the oxide confinement diameter of each of the oxide confinement layers 106 and 113 can be set to a desired size.

The tunnel junction 108 has a layer structure in which the p-type semiconductor layer 108a and the n-type semiconductor layer 108b are laminated together, and the oxide confinement layer 106 is disposed on the p-type semiconductor layer 108a side. Accordingly, the oxide confinement layer 106 can be disposed at a position closer to the first multilayer film reflector 102 that is an n-type multilayer film reflector (a position farther from the emission surface ES).

If an oscillation wavelength of the surface emitting laser 100 is A, the first active layer 104-1, the tunnel junction 108, and the oxide confinement layer 106 are disposed within an optical thickness of 3λ/4. In this case, for example, in the resonator, the first active layer 104-1 can be disposed in the antinode of a standing wave having a wavelength A or in the vicinity thereof, and each of the tunnel junction 108 and the oxide confinement layer 106 can be disposed in the node of the standing wave or in the vicinity thereof. Accordingly, attenuation of the standing wave can be suppressed as much as possible, and furthermore, a decrease in output of the emission light of the surface emitting laser 100 can be suppressed.

The method for manufacturing the surface emitting laser 100 is a method for manufacturing a surface emitting laser including: a step of laminating a structure including a laminated structure in which the first active layer 104-1, the selected oxide layer 106S, the tunnel junction 108, and the second active layer 104-2 are laminated in that order on the first multilayer film reflector 102, and laminating at least the second multilayer film reflector 112 on the structure to generate the laminate L1; a step of etching the laminate L1 until at least a side surface of the selected oxide layer 106S is exposed to form the mesa M1; and a step of selectively oxidizing the selected oxide layer 106S from the side surface side to form the oxide confinement layer 106.

Accordingly, it is possible to manufacture the refractive index guide type surface emitting laser 100 capable of suppressing a decrease in luminous efficiency.

2. Surface Emitting Lasers According to Modifications 1 to 5 of First Embodiment of Present Technology Hereinafter, surface emitting lasers according to Modifications 1 to 5 of the first embodiment of the present technology will be described.

(Modification 1)

Figure 18:
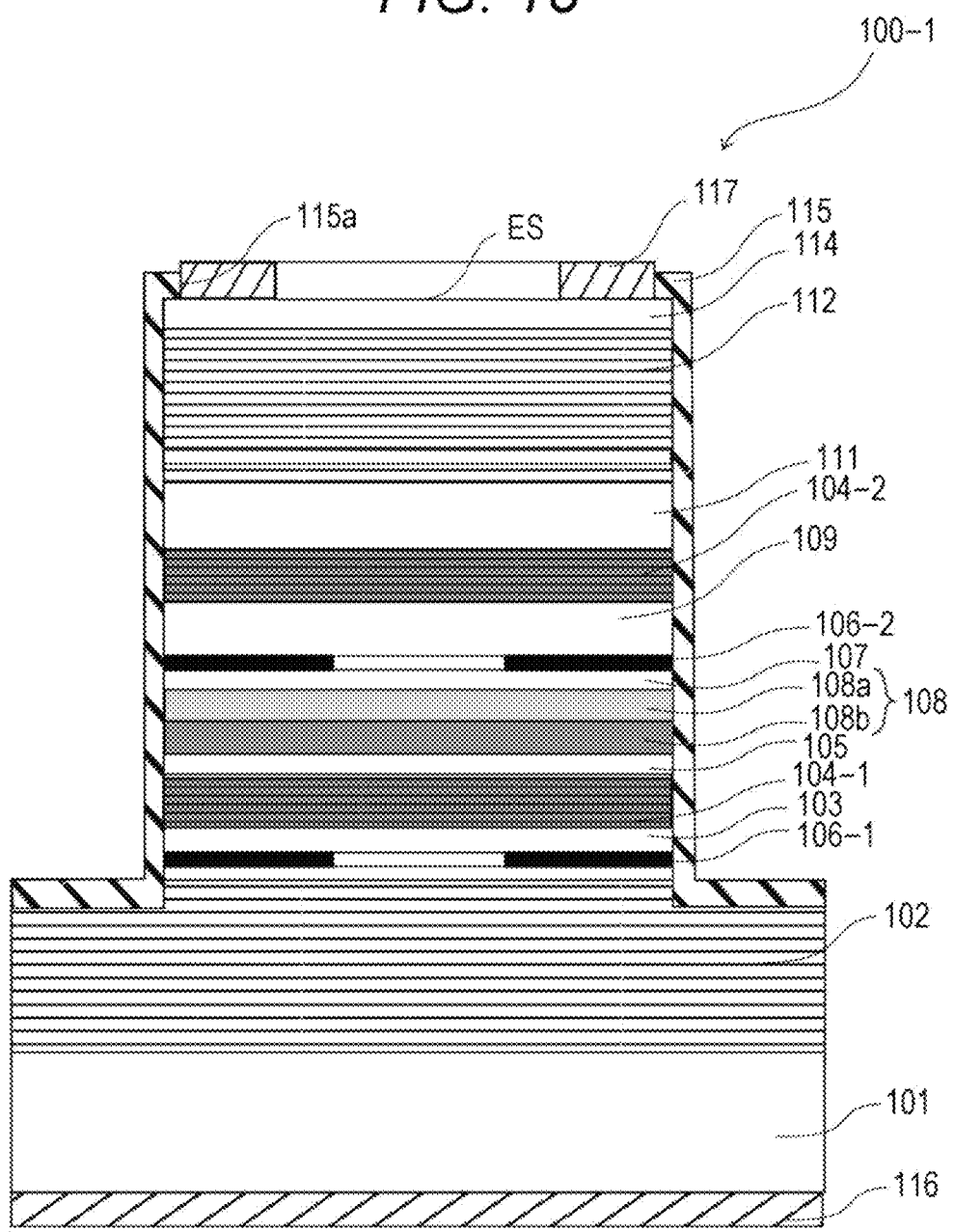
FIG. 18 is a cross-sectional view illustrating a configuration of a surface emitting laser according to Modification 1 of the first embodiment of the present technology.

As illustrated in FIG. 18, a surface emitting laser 100-1 of Modification 1 has a configuration similar to that of the surface emitting laser 100 (see FIG. 1) of the first embodiment except that the oxide confinement layer 106 (referred to as a second oxide confinement layer 106-2) is provided between the second active layer 104-2 and the tunnel junction 108, another oxide confinement layer 106 (referred to as a first oxide confinement layer 106-1) is provided between the first multilayer film reflector 102 and the first active layer 104-1 instead of the oxide confinement layer 113, and the conductivity type is opposite. In the surface emitting laser 100-4, the conductivity type of the first multilayer film reflector 102 is p-type and the conductivity type of the second multilayer film reflector 112 is n-type, the anode electrode 116 is disposed on the back surface side of the substrate 101, the cathode electrode 117 is disposed on the top of the mesa, and the n-type semiconductor layer 108b is disposed on the substrate 101 side of the p-type semiconductor layer 108a at the tunnel junction 108.

In the surface emitting laser 100-1, the second active layer 104-2, which is an active layer sandwiching the second oxide confinement layer 106-2 with the tunnel junction 108, is disposed at a position closer to the emission surface ES of the surface emitting laser 100 than the first active layer 104-1. Accordingly, the second oxide confinement layer 106-2 can be disposed at a position closer to the emission surface ES (at least a position closer to the emission surface ES than the tunnel junction 108), and a current confinement effect at the position can be obtained. That is, in the resonator provided between the first and second multilayer film reflectors 102 and 112, it is possible to obtain the current confinement effect at a position (at least a position closer to the emission surface ES than the oxide confinement layer 106, for example, an upper half portion of the resonator) closer to the emission surface ES, and it is possible to improve the current injection efficiency into the second active layer 104-2.

In the surface emitting laser 100-1, the second active layer 104-2, which is an active layer sandwiching the second oxide confinement layer 106-2 with the tunnel junction 108, is disposed at a position closer to the second multilayer film reflector 112, which is the other multilayer film reflector closer to the emission surface ES than the first multilayer film reflector 102, which is one multilayer film reflector farther from the emission surface ES, of the first and second multilayer film reflectors 102 and 112.

In the surface emitting laser 100-1, the current flowing in from the anode electrode 116 passes through the substrate 101 and the first multilayer film reflector 102, is confined by the first oxide confinement layer 106-1, and is injected into the first active layer 104-2. The current through the first active layer 104-1 passes through the tunnel junction 108, is confined by the oxide confinement layer 106-2, and is injected into the second active layer 104-2. Accordingly, a current can be efficiently injected into each active layer.

Note that the second active layer 104-2, which is an active layer sandwiching the oxide confinement layer 106-2 with the tunnel junction 108, may be disposed at a position (for example, a lower half portion of the resonator) closer to the first multilayer film reflector 102, which is the other of the first and second multilayer film reflectors 102 and 112 farther from the emission surface ES, than the second multilayer film reflector 112, which is the one of the first and second multilayer film reflectors closer to the emission surface ES. In this case, the oxide confinement layer 106, the tunnel junction 108, and the first active layer 104-1 may also be disposed at a position (for example, a lower half portion of the resonator) closer to the first multilayer film reflector 102 than the second multilayer film reflector 112.

The surface emitting laser 100-1 of Modification 1 can be manufactured by a manufacturing method similar to the method for manufacturing the surface emitting laser 100 (see FIG. 1) of the first embodiment except that another oxide confinement layer 106 is formed instead of the oxide confinement layer 113 and the lamination order is partially different in the laminate generation process.

(Modification 2)

Figure 19:
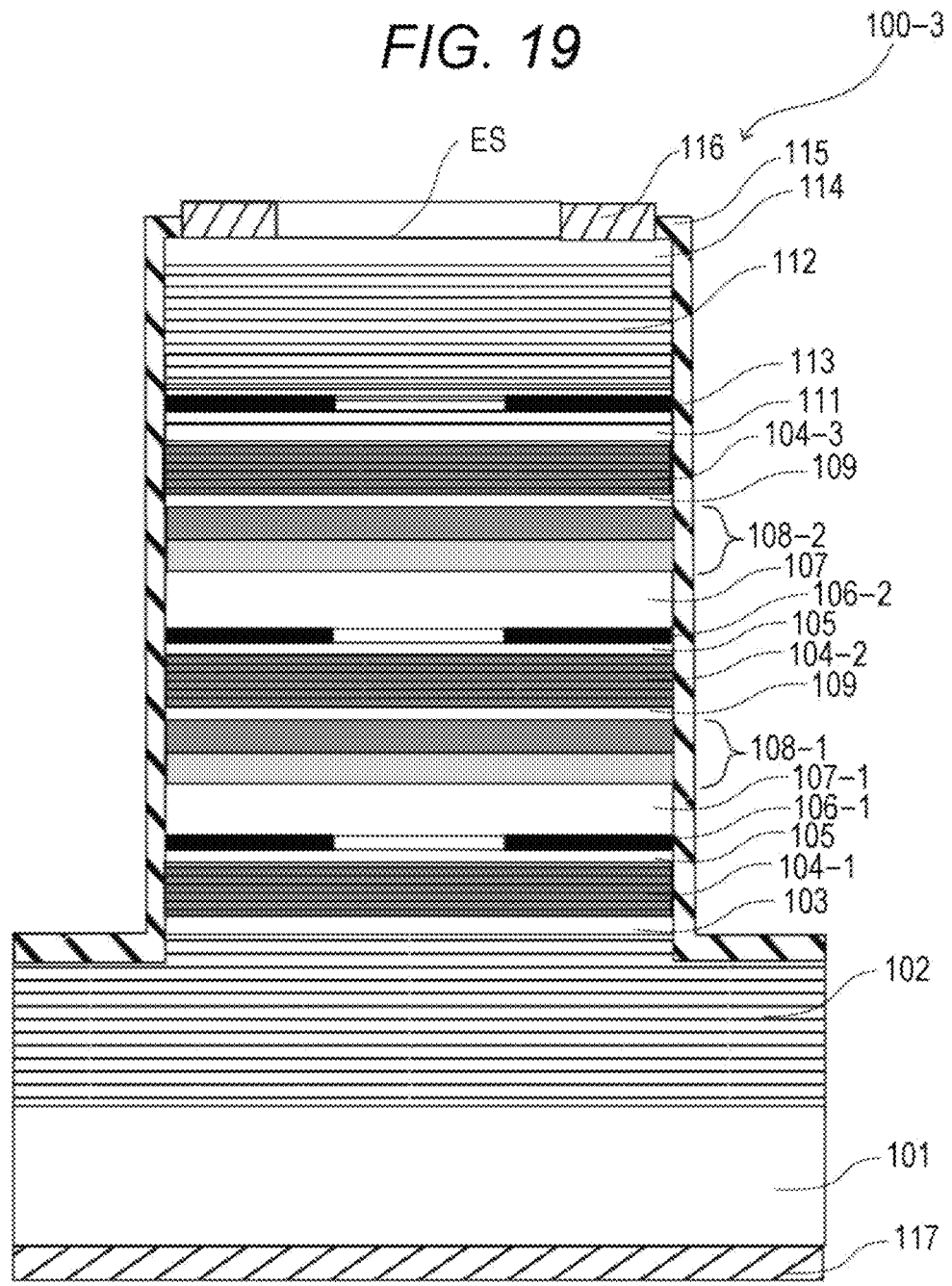
FIG. 19 is a cross-sectional view illustrating a configuration of a surface emitting laser according to Modification 2 of the first embodiment of the present technology.

As illustrated in FIG. 19, a surface emitting laser 100-3 of Modification 2 has a configuration similar to that of the surface emitting laser 100 (see FIG. 1) of the first embodiment except that it has a plurality of (for example, two) laminated structures in which an active layer, an oxide confinement layer, and a tunnel junction are laminated in that order from the first multilayer film reflector 102 side between the first and second multilayer film reflectors 102 and 112.

More specifically, the surface emitting laser 100-3 has a first laminated structure in which a first active layer 104-1, a first oxide confinement layer 106-1, and a first tunnel junction 108-1 are laminated in that order from the first multilayer film reflector 102 side. Further, the surface emitting laser 100-3 has a second laminated structure in which a second active layer 104-2, a second oxide confinement layer 106-2, and a second tunnel junction 108-2 are laminated in that order from the first multilayer film reflector 102 side on the first laminated structure. The first and second tunnel junctions 108-1 and 108-2 have substantially the same configuration and function as the tunnel junction 108. Further, the surface emitting laser 100-3 has a third active layer 104-3 on the second laminated structure.

That is, in the surface emitting laser 100-3, the plurality of active layers is three active layers (first to third active layers 104-1 to 104-3), the first tunnel junction 108-1 is disposed between the first and second active layers 104-1 and 104-2 which are two adjacent active layers of the first set of at least two sets of two adjacent active layers (first and second active layers 104-1 and 104-2 and second and third active layers 104-2 and 104-3) among the plurality of (for example, three) active layers, and the second tunnel junction 108-2 is disposed between the second and third active layers 104-2 and 104-3 which are two adjacent active layers of the second set. Further, the first oxide confinement layer 106-1 is disposed between the first active layer 104-1 which is one active layer of the first and second active layers 104-1 and 104-2 which are two adjacent active layers of the first set and the first tunnel junction 108-1 disposed between the first and second active layers 104-1 and 104-2 which are two adjacent active layers. Further, the second oxide confinement layer 106-2 is disposed between the second active layer 104-2 which is one active layer of the second and third active layers 104-2 and 104-3 which are two adjacent active layers of the second set and the second tunnel junction 108-2 disposed between the second and third active layers 104-2 and 104-3 which are two adjacent active layers.

The surface emitting laser 100-3 includes the first, second, and third active layers 104-1 to 104-3, and the first, second, and third active layers 104-1 to 104-3 are laminated in that order. The first tunnel junction 108-1 is disposed between the first and second active layers 104-1 and 104-2, and the second tunnel junction 108-2 is disposed between the second and third active layers 104-2 and 104-3. Further, the first oxide confinement layer 106-1 is disposed between the first active layer 104-1 and the first tunnel junction 108-1, and the second oxide confinement layer 106-2 is disposed between the second active layer 104-2 and the second tunnel junction 108-2.

In the surface emitting laser 100-3, the first active layer 104-1 is an active layer disposed at a position farthest from the emission surface ES of the surface emitting laser 100-3 among the three active layers 104-1 to 104-3 (for example, near the downstream end of the current path in the resonator).

According to the surface emitting laser 100-3, even in the case of a multi-active layer having three active layers, a current can be efficiently injected into each active layer, and a decrease in luminous efficiency of the active layer can be suppressed.

Figure 5:
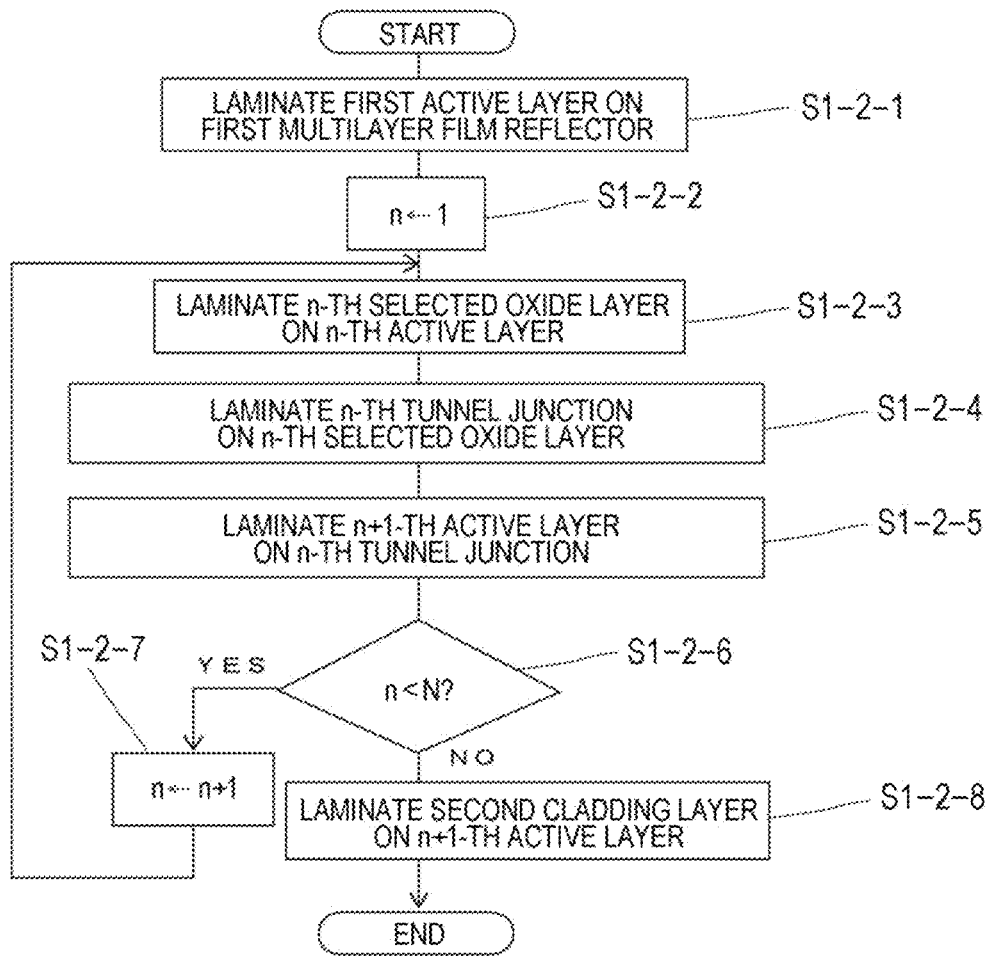
FIG. 5 is a flowchart for describing a second step (resonator base material generation step 1) in FIG. 3.

The surface emitting laser 100-3 is a derivative of the surface emitting laser 100, and can be manufactured by the procedure (where N=2 in step S1-2-6) of the flowchart in FIG. 5.

(Modification 3)

Figure 20:
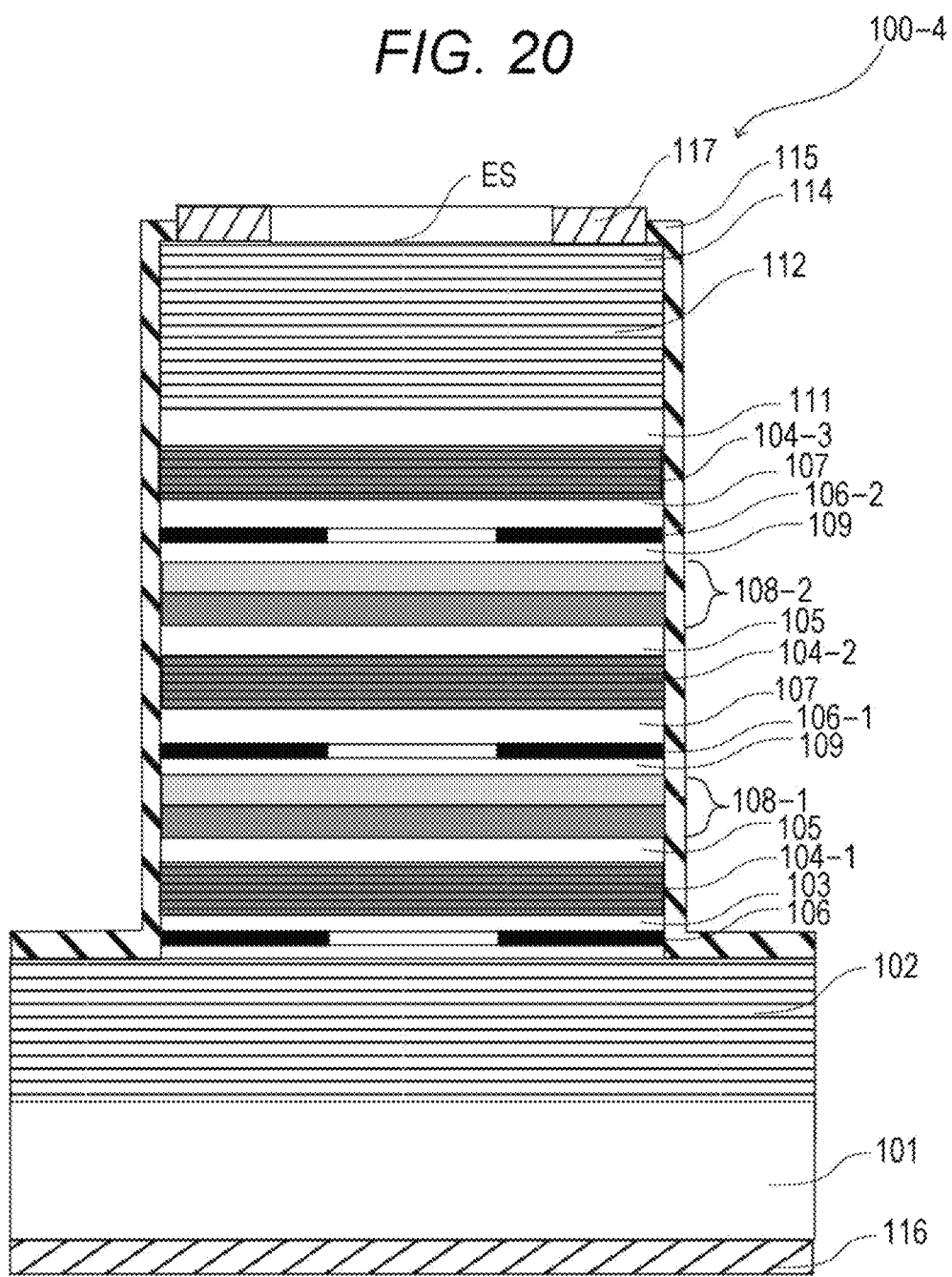
FIG. 20 is a cross-sectional view illustrating a configuration of a surface emitting laser according to Modification 3 of the first embodiment of the present technology.

As illustrated in FIG. 20, a surface emitting laser 100-4 of Modification 3 has a configuration similar to that of the surface emitting laser 100-3 (see FIG. 19) of Modification 2 except that it has a plurality of (for example, two) laminated structures in which a tunnel junction, an oxide confinement layer, and an active layer are laminated in that order from the first multilayer film reflector 102 side between the first and second multilayer film reflectors 102 and 112, another oxide confinement layer 106 is provided between the first multilayer film reflector 102 and the first active layer 104-1 instead of the oxide confinement layer 113, and the conductivity type is opposite.

That is, the surface emitting laser 100-4 has a configuration in which the surface emitting laser 100-3 is turned upside down. In the surface emitting laser 100-4, the conductivity type of the first multilayer film reflector 102 is p-type, the conductivity type of the second multilayer film reflector 112 is n-type, the anode electrode 116 is disposed on the back surface side of the substrate 101, the cathode electrode 117 is disposed on the top of the mesa, and the n-type semiconductor layer 108*b* (gray layer in FIG. 20) is disposed on the substrate 101 side of the p-type semiconductor layer 108*a* at each tunnel junction.

More specifically, the surface emitting laser 100-4 has a first laminated structure in which a first tunnel junction 108-1, a first oxide confinement layer 106-1, and a second active layer 104-2 are laminated in that order from the first multilayer film reflector 102 side. Further, the surface emitting laser 100-4 has a second laminated structure in which a second tunnel junction 108-2, a second oxide confinement layer 106-2, and a third active layer 104-3 are laminated in that order from the first multilayer film reflector 102 side on the first laminated structure. Further, the surface emitting laser 100-4 has a first active layer 104-1 under the first laminated structure.

According to the surface emitting laser 100-4, even in the case of a multi-active layer having three active layers, a current can be efficiently injected into each active layer, and a decrease in luminous efficiency of the active layer can be suppressed.

The surface emitting laser 100-4 can be manufactured by a manufacturing method similar to the method for manufacturing the surface emitting laser 100-3 (see FIG. 19) of Modification 2 except that the oxide confinement layer 106 is formed instead of the oxide confinement layer 113 and the lamination order is different in the laminate generation process.

(Modification 4)

Figure 21:
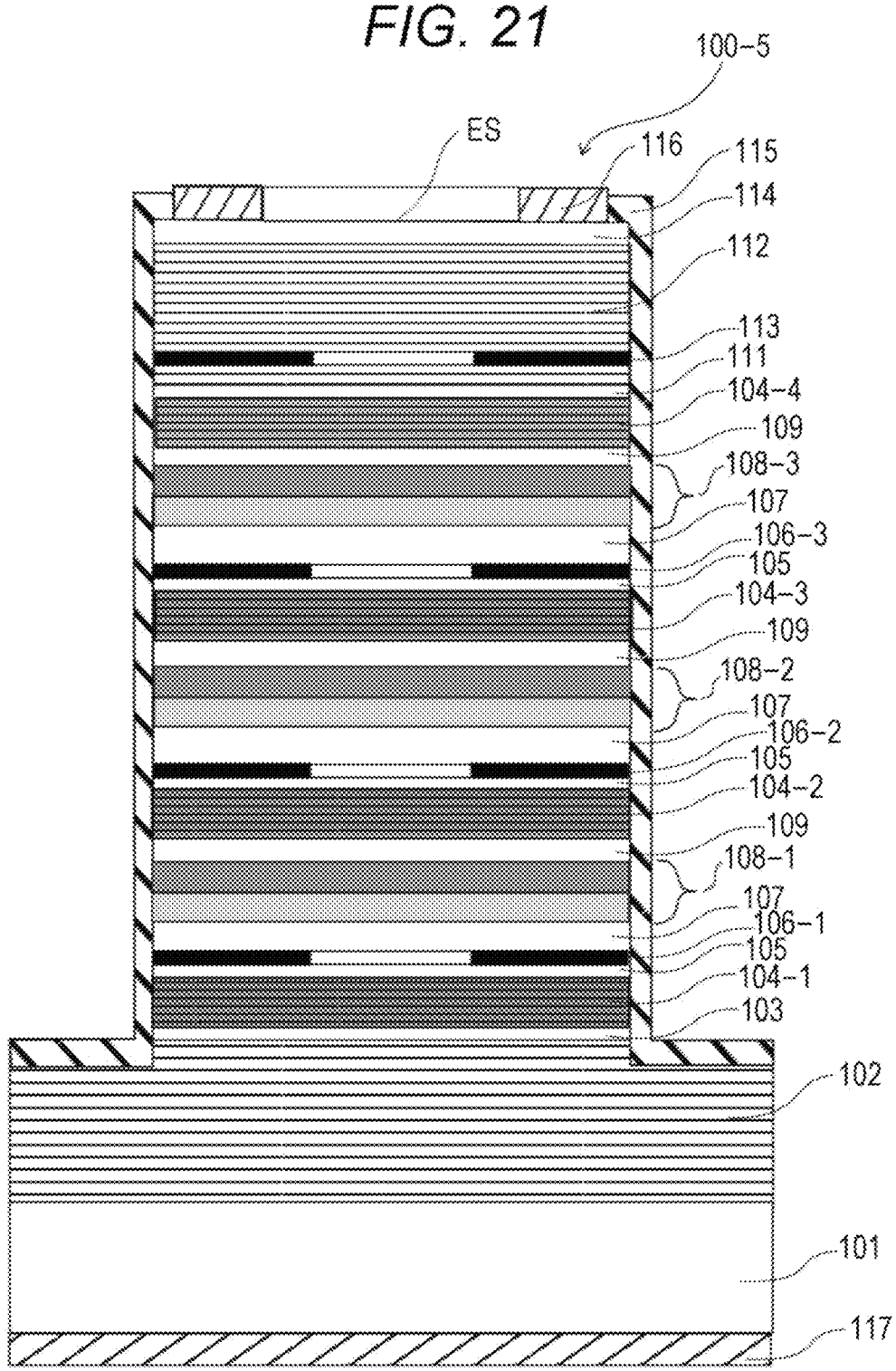
FIG. 21 is a cross-sectional view illustrating a configuration of a surface emitting laser according to Modification 4 of the first embodiment of the present technology.

As illustrated in FIG. 21, a surface emitting laser 100-5 of Modification 4 has a configuration similar to that of the surface emitting laser 100 (see FIG. 1) of the first embodiment except that it has a plurality of (for example, three) laminated structures in which an active layer, an oxide confinement layer, and a tunnel junction are laminated in that order from the first multilayer film reflector 102 side between the first and second multilayer film reflectors 102 and 112.

More specifically, the surface emitting laser 100-5 has a first laminated structure in which a first active layer 104-1, a first oxide confinement layer 106-1, and a first tunnel junction 108-1 are laminated in that order from the first multilayer film reflector 102 side. Further, the surface emitting laser 100-5 has a second laminated structure in which a second active layer 104-2, a second oxide confinement layer 106-2, and a second tunnel junction 108-2 are laminated in that order from the first multilayer film reflector 102 side on the first laminated structure. Further, the surface emitting laser 100-5 has a third laminated structure in which a third active layer 104-3, a third oxide confinement layer 106-3, and a third tunnel junction 108-3 are laminated in that order from the first multilayer film reflector 102 side on the second laminated structure. The third tunnel junction 108-3 has substantially the same configuration and function as the tunnel junction 108. Further, the surface emitting laser 100-5 has a fourth active layer 104-4 on the third laminated structure.

According to the surface emitting laser 100-5, even in the case of a multi-active layer having four active layers, a current can be efficiently injected into each active layer, and a decrease in luminous efficiency of the active layer can be suppressed. Note that, according to the surface emitting laser (a derivative of the surface emitting laser 100) having four or more of the laminated structures and having the oxide confinement layer 113, even in the case of a multi-active layer having five or more active layers, a current can be efficiently injected into each active layer, and a decrease in luminous efficiency of the active layer can be suppressed.

The surface emitting laser 100-5 is a derivative of the surface emitting laser 100, and can be manufactured by the procedure (where N=3 in step S1-2-6) of the surface emitting laser flowchart in FIG. 5. Note that a surface emitting laser having four or more of the laminated structures can be manufactured by a similar manufacturing method (where N 4 in step S1-2-6 of FIG. 5).

(Modification 5)

Figure 22:
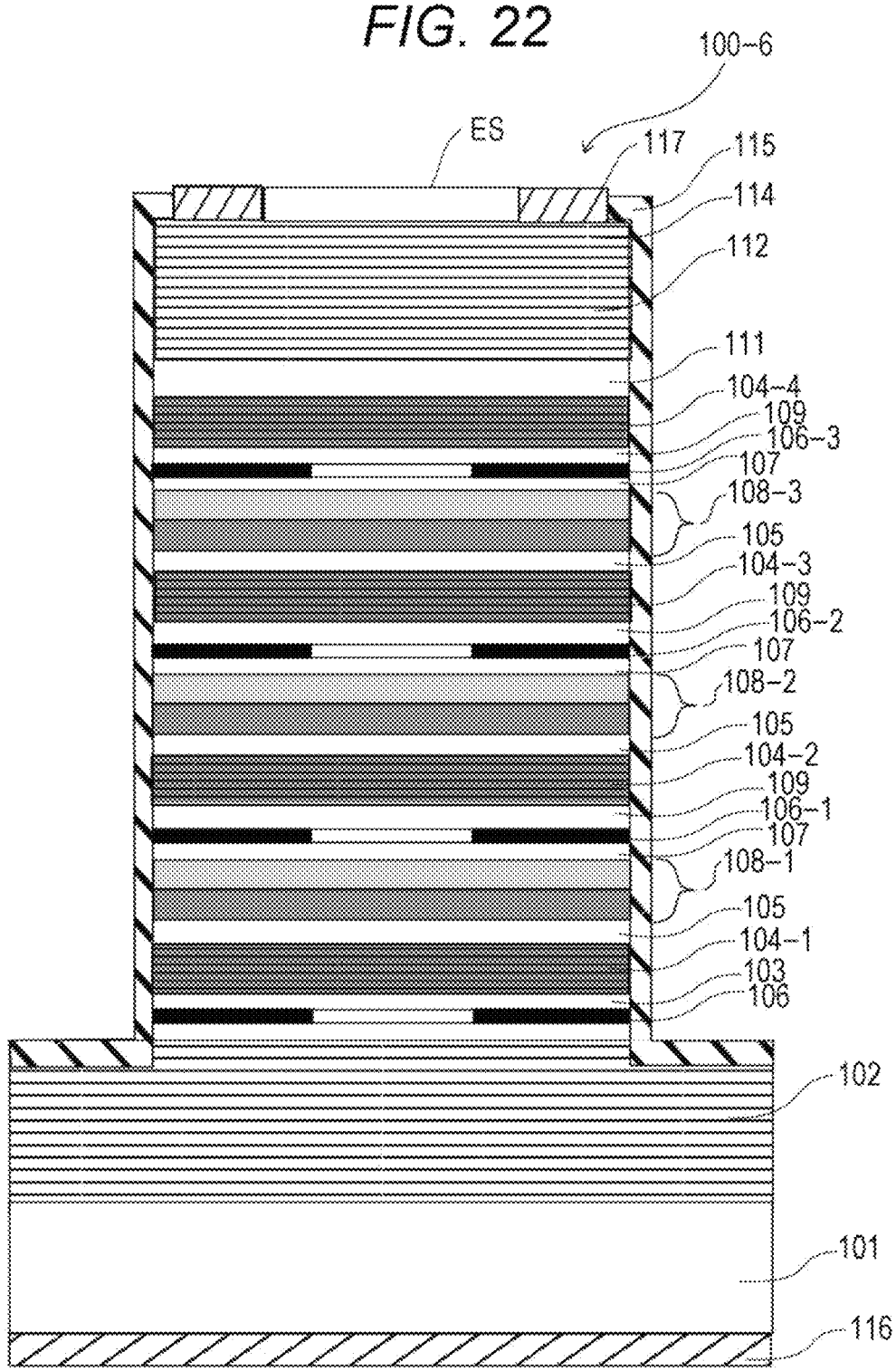
FIG. 22 is a cross-sectional view illustrating a configuration of a surface emitting laser according to Modification 5 of the first embodiment of the present technology.

As illustrated in FIG. 22, a surface emitting laser 100-6 of Modification 5 has a configuration similar to that of the surface emitting laser 100-5 (see FIG. 21) of Modification 4 except that it has a plurality of (for example, three) laminated structures in which a tunnel junction, an oxide confinement layer, and an active layer are laminated in that order from the first multilayer film reflector 102 side between the first and second multilayer film reflectors 102 and 112, another oxide confinement layer 106 is provided between the first multilayer film reflector 102 and the first active layer 104-1 instead of the oxide confinement layer 113, and the conductivity type is opposite. That is, the surface emitting laser 100-6 has a configuration in which the surface emitting laser 100-5 is turned upside down. In the surface emitting laser 100-6, the conductivity type of the first multilayer film reflector 102 is p-type, the conductivity type of the second multilayer film reflector 112 is n-type, the anode electrode 116 is disposed on the back surface side of the substrate 101, the cathode electrode 117 is disposed on the top of the mesa, and the n-type semiconductor layer 108b (gray layer in FIG. 22) is disposed on the substrate 101 side of the p-type semiconductor layer 108a at each tunnel junction.

More specifically, the surface emitting laser 100-6 has a first laminated structure in which a first tunnel junction 108-1, a first oxide confinement layer 106-1, and a second active layer 104-2 are laminated in that order from the first multilayer film reflector 102 side. Further, the surface emitting laser 100-6 has a second laminated structure in which a second tunnel junction 108-2, a second oxide confinement layer 106-2, and a third active layer 104-3 are laminated in that order from the first multilayer film reflector 102 side on the first laminated structure. Further, the surface emitting laser 100-6 has a third laminated structure in which a third tunnel junction 108-3, a third oxide confinement layer 106-3, and a fourth active layer 104-4 are laminated in that order from the first multilayer film reflector 102 side on the second laminated structure. Further, the surface emitting laser 100-6 has a first active layer 104-1 under the first laminated structure.

According to the surface emitting laser 100-6, even in the case of a multi-active layer having four active layers, a current can be efficiently injected into each active layer, and a decrease in luminous efficiency of the active layer can be suppressed. Note that, according to the surface emitting laser having four or more of the laminated structures and having the oxide confinement layer 113, even in the case of a multi-active layer having five or more active layers, a current can be efficiently injected into each active layer, and a decrease in luminous efficiency of the active layer can be suppressed.

The surface emitting laser 100-6 can be manufactured by a manufacturing method similar to the manufacturing method of the surface emitting laser 100-4 (see FIG. 20) of Modification 3 except that another oxide confinement layer 106 is formed instead of the oxide confinement layer 113 and the number of lamination steps is increased in the laminate generation process. Note that a surface emitting laser having four or more of the laminated structures can be manufactured by a similar manufacturing method.

3. Surface Emitting Laser According to Second Embodiment of Present Technology

Hereinafter, a surface emitting laser 200 according to a second embodiment of the present technology will be described.

(1) Configuration of Surface Emitting Laser

Figure 23:
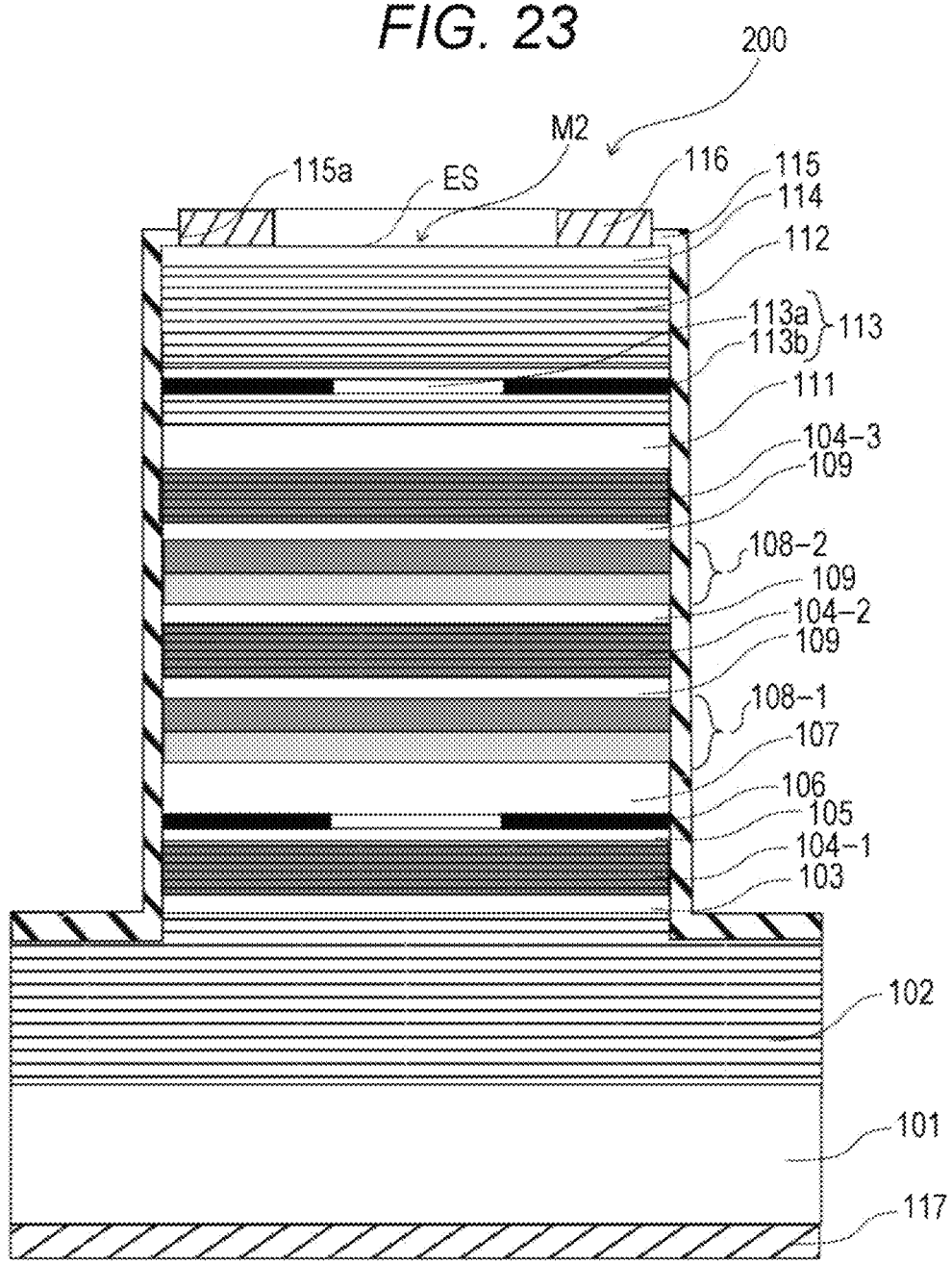
FIG. 23 is a cross-sectional view illustrating a configuration of a surface emitting laser according to a second embodiment of the present technology.

As illustrated in FIG. 23, the surface emitting laser 200 according to the second embodiment has a configuration similar to that of the surface emitting laser 100 (see FIG. 1) of the first embodiment except that a second tunnel junction 108-2 and a third active layer 104-3 are laminated in that order on a second active layer 104-2. That is, the surface emitting laser 200 has one pair of a tunnel junction and an active layer on the second active layer 104-2.

From another viewpoint, the surface emitting laser 200 is different from the surface emitting laser 100-3 (see FIG. 19) of Modification 2 in that an oxide confinement layer is not disposed between the second active layer 104-2 and the second tunnel junction 108-2.

(2) Operation of Surface Emitting Laser

In the surface emitting laser 200 illustrated in FIG. 23, if a voltage is applied between the anode electrode 116 and the cathode electrode 117 and a current flows from the anode electrode 116 into the resonator structure including the mesa M2, the current is confined by the oxide confinement layer 113 and injected into the third active layer 104-3, a current having substantially the same current value as the injected current is injected into the second active layer 104-2 due to a tunnel effect by the second tunnel junction 108-2, and a current having substantially the same current value as the injected current is confined by the oxide confinement layer 106 and injected into the first active layer 104-1 due to a tunnel effect by the first tunnel junction 108-1. Accordingly, when the first to third active layers 104-1, 104-2, and 104-3 emit light with substantially the same emission intensity, and these light beams reciprocate while being amplified by the respective active layers between the first and second multilayer film reflectors 102 and 112 to satisfy the oscillation conditions, the light beams are emitted as laser light from the top of the mesa M2.

(3) Method for Manufacturing Surface Emitting Laser

Figure 24:
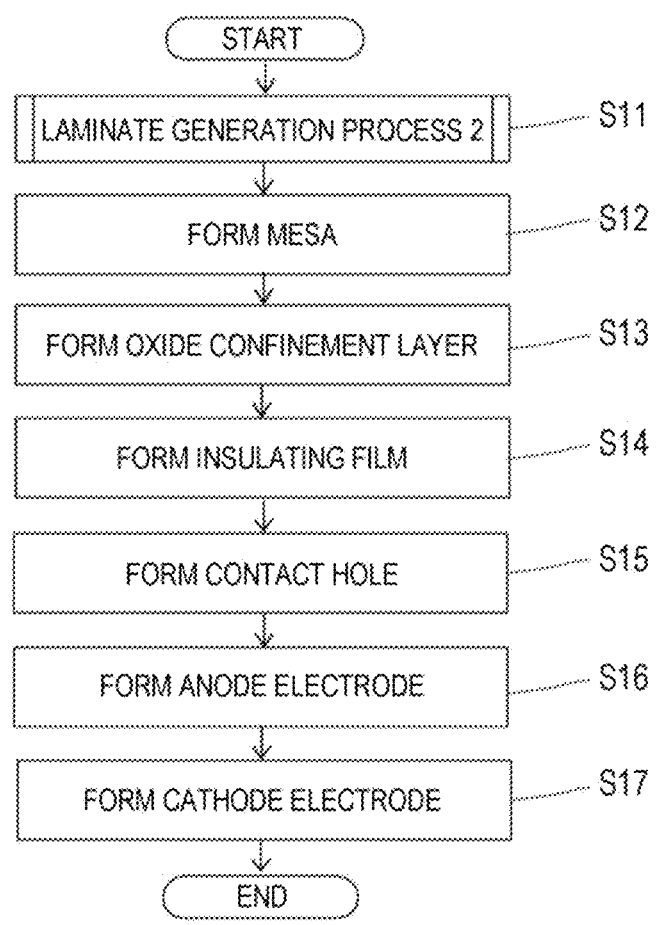
FIG. 24 is a flowchart for describing a method for manufacturing the surface emitting laser according to the second embodiment of the present technology.

Hereinafter, a method for manufacturing the surface emitting laser 200 will be described with reference to the flowchart (steps S11 to S17) in FIG. 24. FIG. 24 illustrates a procedure in which not only the surface emitting laser 200 but also a derived surface emitting laser of the surface emitting laser 200 can be manufactured. Here, as an example, a plurality of surface emitting laser arrays in which a plurality of surface emitting lasers 200 is two-dimensionally arranged is simultaneously generated on one wafer which is a base material of the substrate 101 by a semiconductor manufacturing method using a semiconductor manufacturing apparatus. Next, a series of a plurality of integrated surface emitting laser arrays is separated by dicing to obtain a plurality of chip-shaped surface emitting laser arrays (surface emitting laser array chips). Note that, by the manufacturing method described below, it is also possible to simultaneously generate a plurality of surface emitting lasers 200 on one wafer which is a base material of the substrate 101, and separate a series of the plurality of integrated surface emitting lasers 200 by dicing to obtain a chip-shaped surface emitting laser (surface emitting laser chip). The following series of steps is executed by the CPU of the semiconductor manufacturing apparatus.

<Step S11: Laminate Generation Process 2>

In the first step S11, a laminate generation process 2 is performed. In the laminate generation process 2, as an example, the layers constituting the surface emitting laser 200 are sequentially laminated in a growth chamber by a chemical vapor deposition (CVD) method, for example, a metal organic chemical vapor deposition (MOCVD) method to generate a laminate L2 (see FIG. 32). Specifically, in the case of manufacturing the surface emitting laser 200, as described in detail below, a structure including a laminated structure in which the active layer 104-1, the selected oxide layer 106S, the first tunnel junction 108-1, the second active layer 104-2, the second tunnel junction 108-2, and the third active layer 104-3 are laminated in that order from the first multilayer film reflector 102 side is laminated on the first multilayer film reflector 102, and the second multilayer film reflector 112 including the selected oxide layer 113S therein is laminated on the structure to generate the laminate L2 (see FIG. 32).

Figure 25:
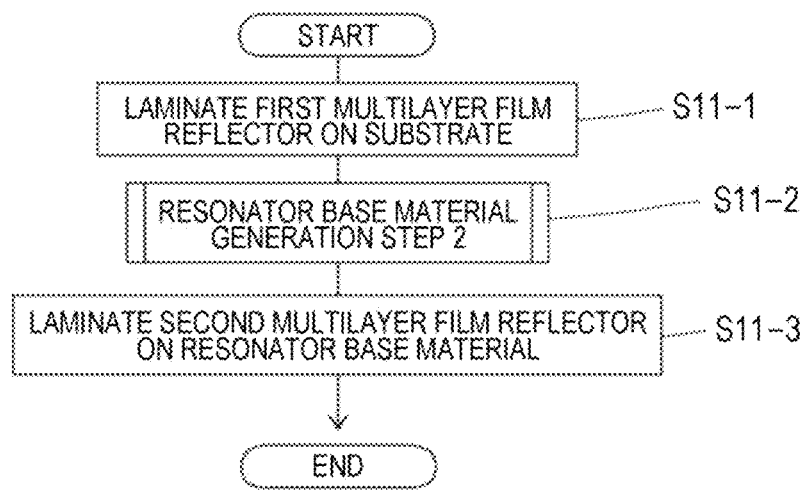
FIG. 25 is a flowchart for describing a first step (laminate generation process 2) in FIG. 24.

Hereinafter, the laminate generation process 2 (step S11 in FIG. 24) will be described with reference to the flowchart in FIG. 25.

(Step S11-1)

In step S11-1, the first multilayer film reflector 102 is laminated on the substrate 101 (see FIG. 4).

(Step S11-2: Resonator Base Material Generation Step 2)

In step S11-2, a resonator base material generation step 2 is performed. As described in detail below, the resonator base material generation step 2 is a step of laminating layers constituting a resonator on the first multilayer film reflector 102 to generate a resonator base material serving as the resonator.

Hereinafter, the resonator base material generation step 2 will be described with reference to the flowchart in FIG. 26, FIGS. 6 and 7, and FIGS. 27 to 31 (first lamination step diagram to seventh lamination step diagram).

In the first step S11-2-1, the first active layer 104-1 is laminated on the first multilayer film reflector 102 (see FIG. 6). More specifically, the first active layer 104-1 is laminated on the first multilayer film reflector 102 with the first cladding layer 103 interposed therebetween.

In the next step S11-2-2, n is set to 1.

In the next step S11-2-3, the n-th selected oxide layer 106S-n is laminated on the n-th active layer 104-$n$ (see FIG. 7). More specifically, the n-th selected oxide layer 106S-n is laminated on the first active layer 104-1 with the spacer layer 105 interposed therebetween. Here, the first selected oxide layer 106S-1 is the selected oxide layer 106S.

Figure 27:
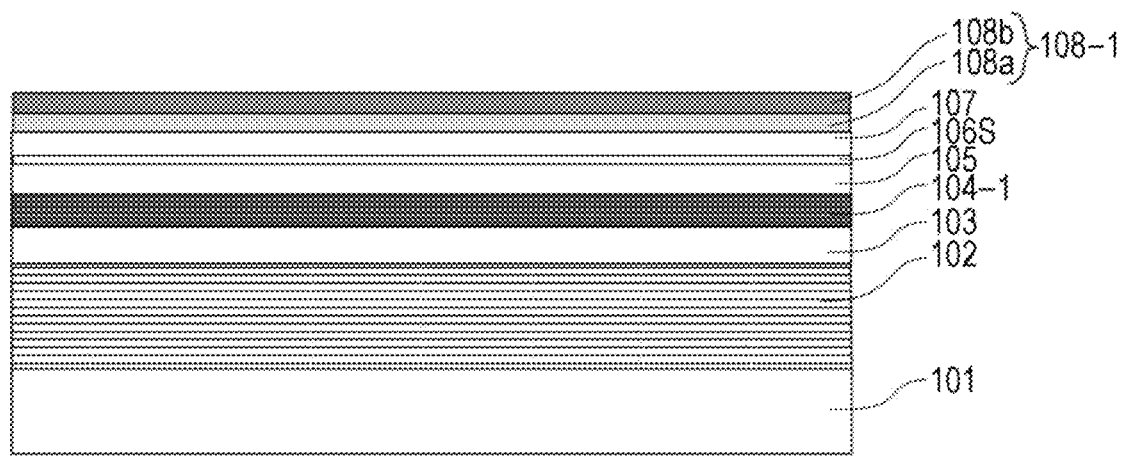
FIG. 27 is a third lamination step diagram of FIG. 26.

In the next step S11-2-4, the n-th tunnel junction 108-$n$ is laminated on the n-th selected oxide layer 106S-n (see FIG. 27). Here, more specifically, the p-type semiconductor layer 108$a$ and the n-type semiconductor layer 108$b$ constituting the n-th tunnel junction 108-$n$ are laminated in that order on the n-th selected oxide layer 106S with the spacer layer 107 interposed therebetween.

Figure 28:
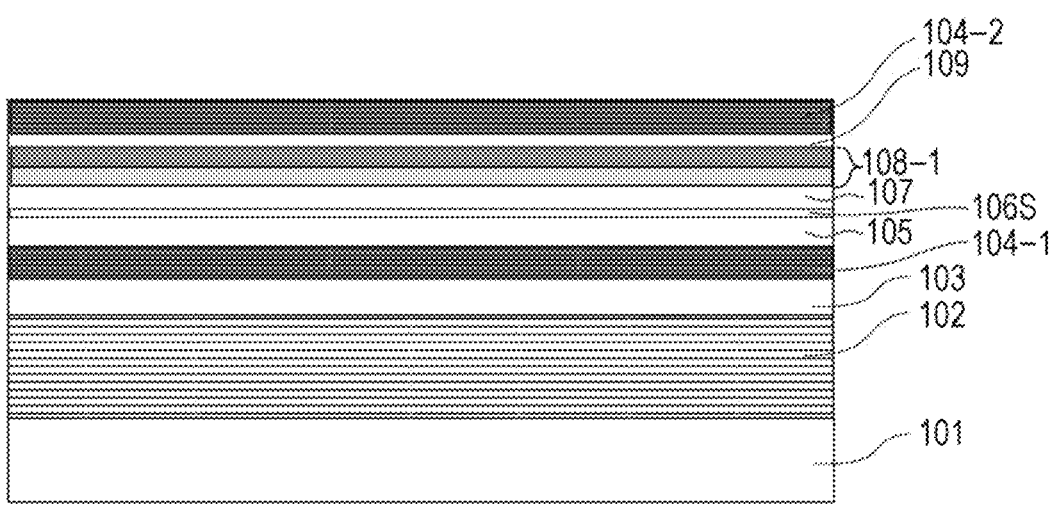
FIG. 28 is a fourth lamination step diagram of FIG. 26.

In the next step S11-2-5, the n+1-th active layer 104-($n$+1) is laminated on the n-th tunnel junction 108-$n$ (see FIG. 28). More specifically, the n+1-th active layer 104-($n$+1) is laminated on the n-th tunnel junction 108-$n$ with the spacer layer 109 interposed therebetween.

In the next step S11-2-6, it is determined whether or not n<N is satisfied. If the determination here is positive, the process proceeds to step S11-2-7, and if the determination is negative, the process proceeds to step S11-2-8. Here, N means the number of oxide confinement layers in the resonator. In the case of the surface emitting laser 200, since the number of oxide confinement layers in the resonator is one, N=1, and when n=1, the determination in step S11-2-6 is negative, and the process proceeds to step S11-2-8.

In step S11-2-7, n is incremented. After step S11-2-7 is executed, the process returns to step S11-2-3, and a series of processes of S11-2-3 to S11-2-5 is executed again. Accordingly, the selected oxide layer, the tunnel junction, and the active layer can be further laminated in that order on the second active layer 104-2 to generate a resonator base material for manufacturing a derivative of the surface emitting laser 200.

In step S11-2-8, m is set to 1.

Figure 29:
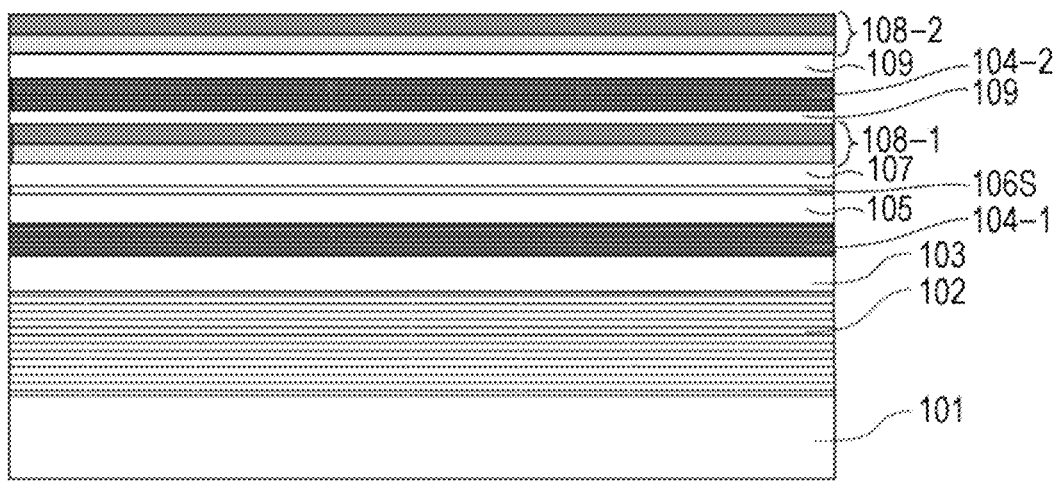
FIG. 29 is a fifth lamination step diagram of FIG. 26.

In the next step S11-2-9, the n+m-th tunnel junction 108-($n$+m) is laminated on the n+m-th active layer 104-($n$+m) (see FIG. 29). More specifically, the n+m-th tunnel junction 108-($n$+m) is laminated on the n+m-th active layer 104-($n$+m) with the spacer layer 109 interposed therebetween.

Figure 30:
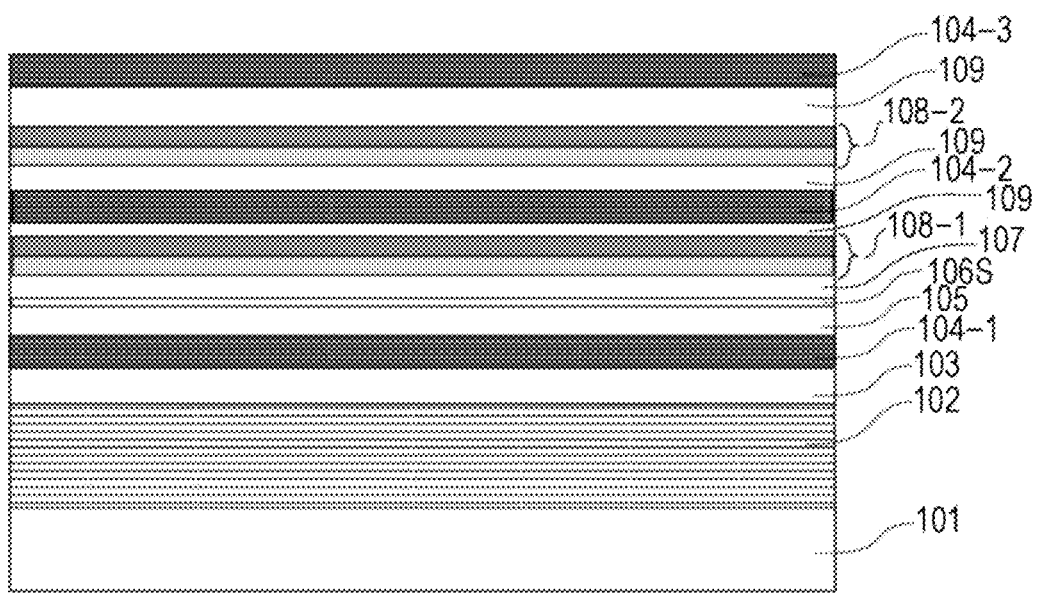
FIG. 30 is a sixth lamination step diagram of FIG. 26.

In step S11-2-10, the n+m+1-th active layer 104-($n$+m+1) is laminated on the n+m-th tunnel junction 108-($n$+m) (see FIG. 30). More specifically, the n+m+1-th active layer 104-($n$+m+1) is laminated on the n+m-th tunnel junction 108-($n$+m) with the spacer layer 109 interposed therebetween.

In the next step S11-2-11, it is determined whether or not m<M is satisfied. If the determination here is positive, the process proceeds to step S11-2-12, and if the determination is negative, the process proceeds to step S11-2-13. Here, M means the number of pairs of tunnel junctions and active layers on the second active layer 104-2. In the surface emitting laser 200, since the number of pairs is one, M=1, and when m=1, the determination in step S11-2-11 is negative, and the process proceeds to step S11-2-13.

In step S11-2-12, m is incremented. After step S11-2-12 is executed, the process returns to step S11-2-9, and a series of processes of S11-2-9 and S11-2-10 is executed again. Accordingly, a pair of a tunnel junction and an active layer can be further laminated on the second active layer 104-2 to generate a resonator base material for manufacturing a derivative of the surface emitting laser 200.

Figure 31:
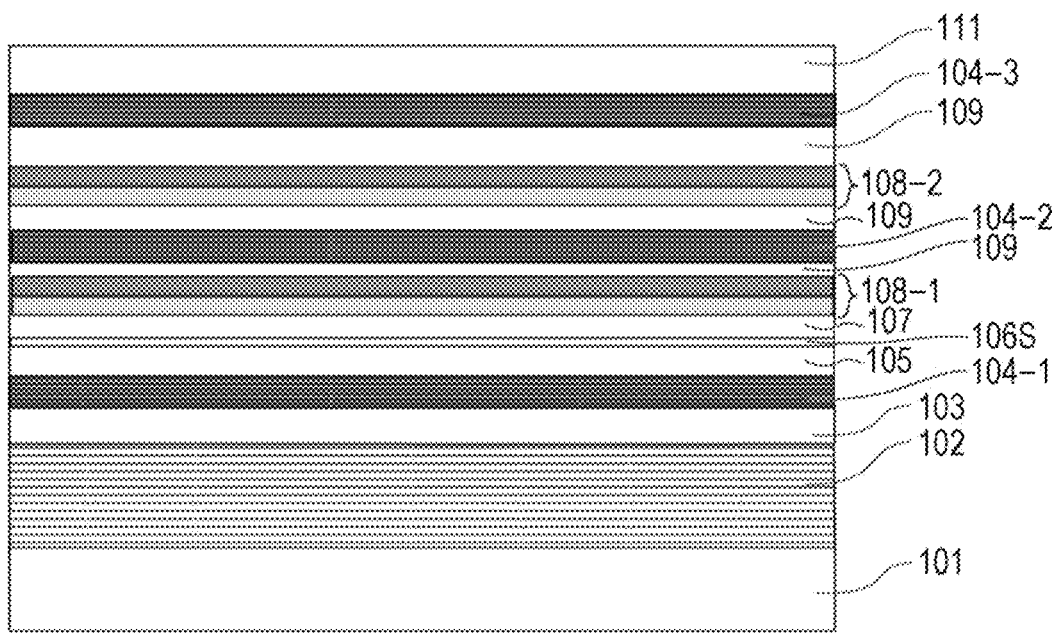
FIG. 31 is a seventh lamination step diagram of FIG. 26.

In step S11-2-13, the second cladding layer 111 is laminated on the n+m+1-th active layer 104-($n$+m+1) (see FIG. 31). Thereby, a resonator base material is generated. If step S11-2-13 is executed, the flow of the resonator base material generation step 2 illustrated in FIG. 26 ends.

(Step S11-3)

Figure 32:
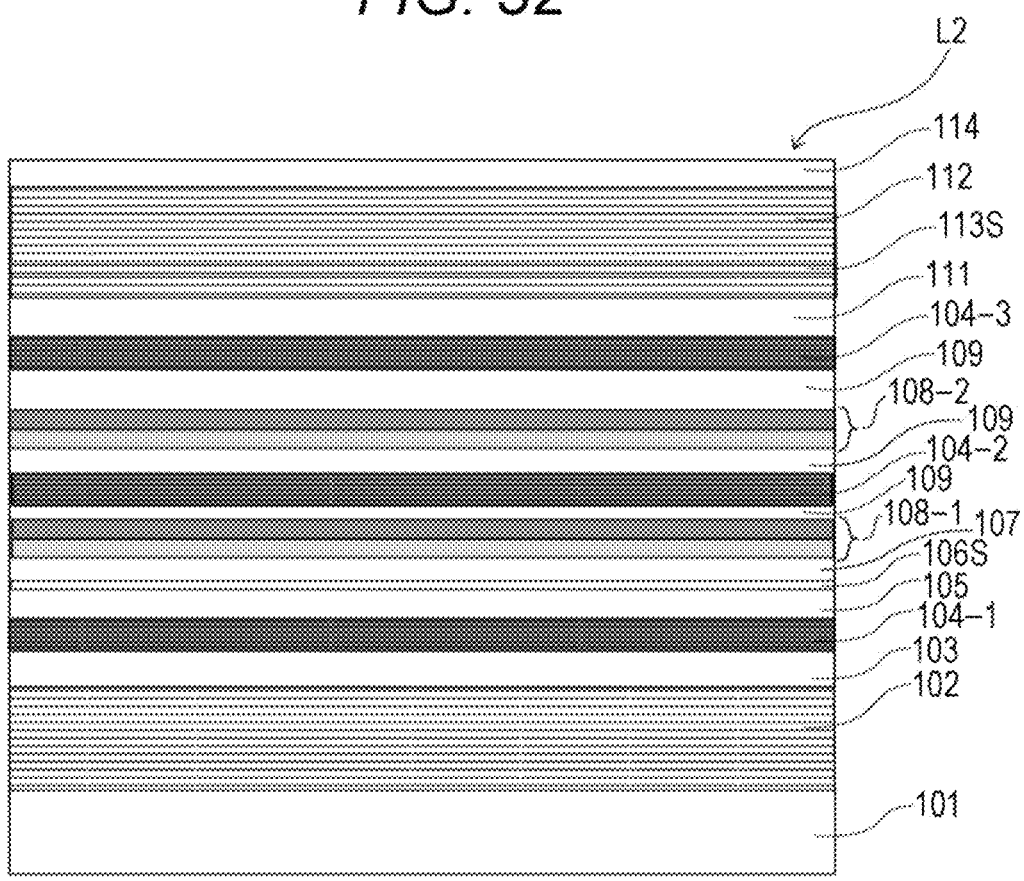
FIG. 32 is a third step diagram of FIG. 25.

In step S11-3, the second multilayer film reflector 112 is laminated on the resonator (see FIG. 32). More specifically, the second multilayer film reflector 112 including the selected oxide layer 113S therein and the contact layer 114 are laminated in that order on the cladding layer 111 of the resonator. As a result, a laminate (for example, the laminate L2) is generated. If step S11-3 is executed, the flow of the laminate generation process 2 illustrated in FIG. 25 ends.

<Step S12>

Figure 33:
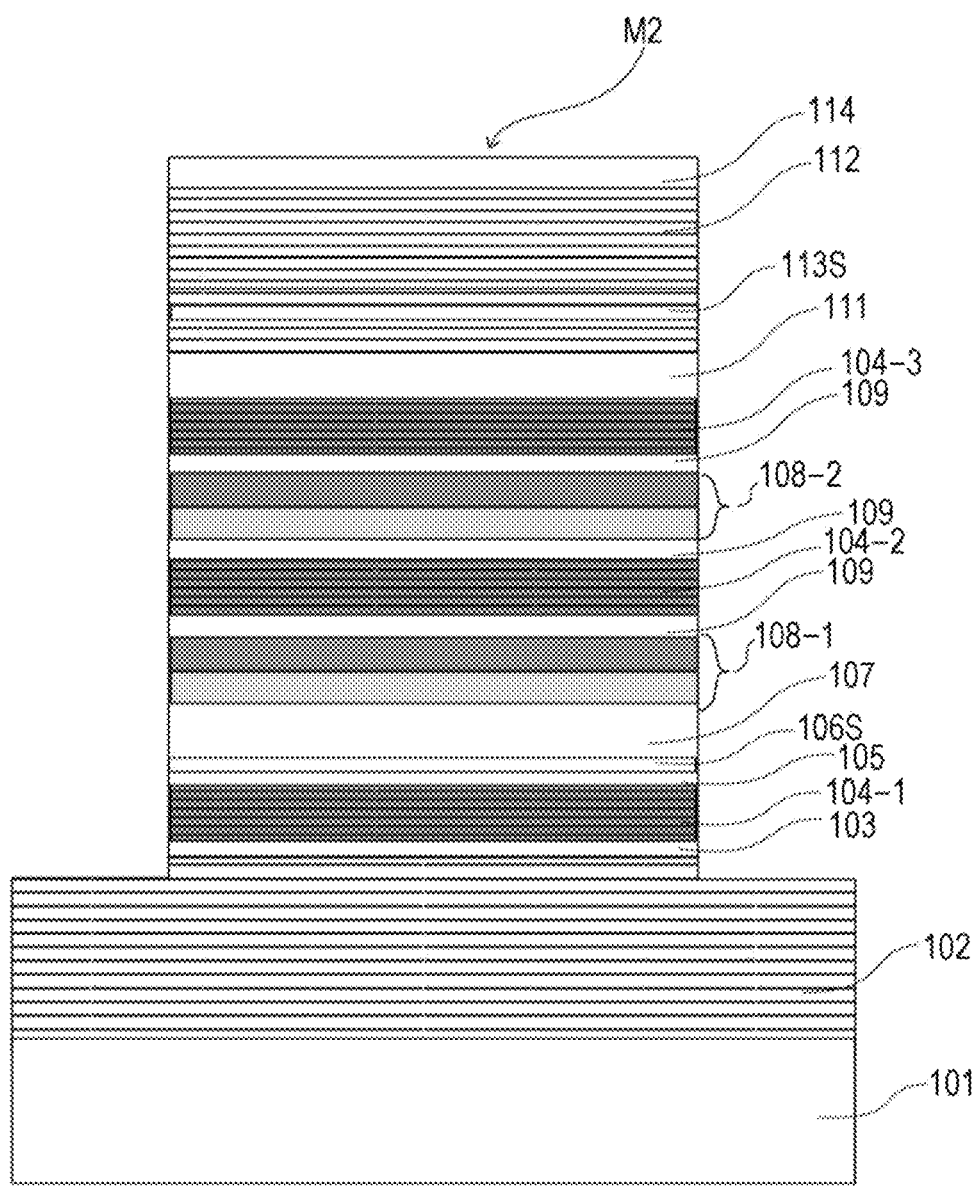
FIG. 33 is a second step diagram of FIG. 24.

In step S12, the laminate (for example, the laminate L2) is etched to form a mesa (for example, the mesa M1) (see FIG. 33).

Specifically, for example, a resist pattern is formed by photolithography on the laminate L2 taken out from the growth chamber. Next, using this resist pattern as a mask, the laminate L2 (see FIG. 32) is etched by, for example, RIE etching (reactive ion etching) until at least the side surface of the selected oxide layer 106S is exposed, thereby forming the mesa M2. Here, as an example, the etching is performed until the side surface of the first cladding layer 103 is completely exposed (for example, until the etching bottom surface is located in the first multilayer film reflector 102). Thereafter, the resist pattern is removed.

<Step S13>

Figure 34:
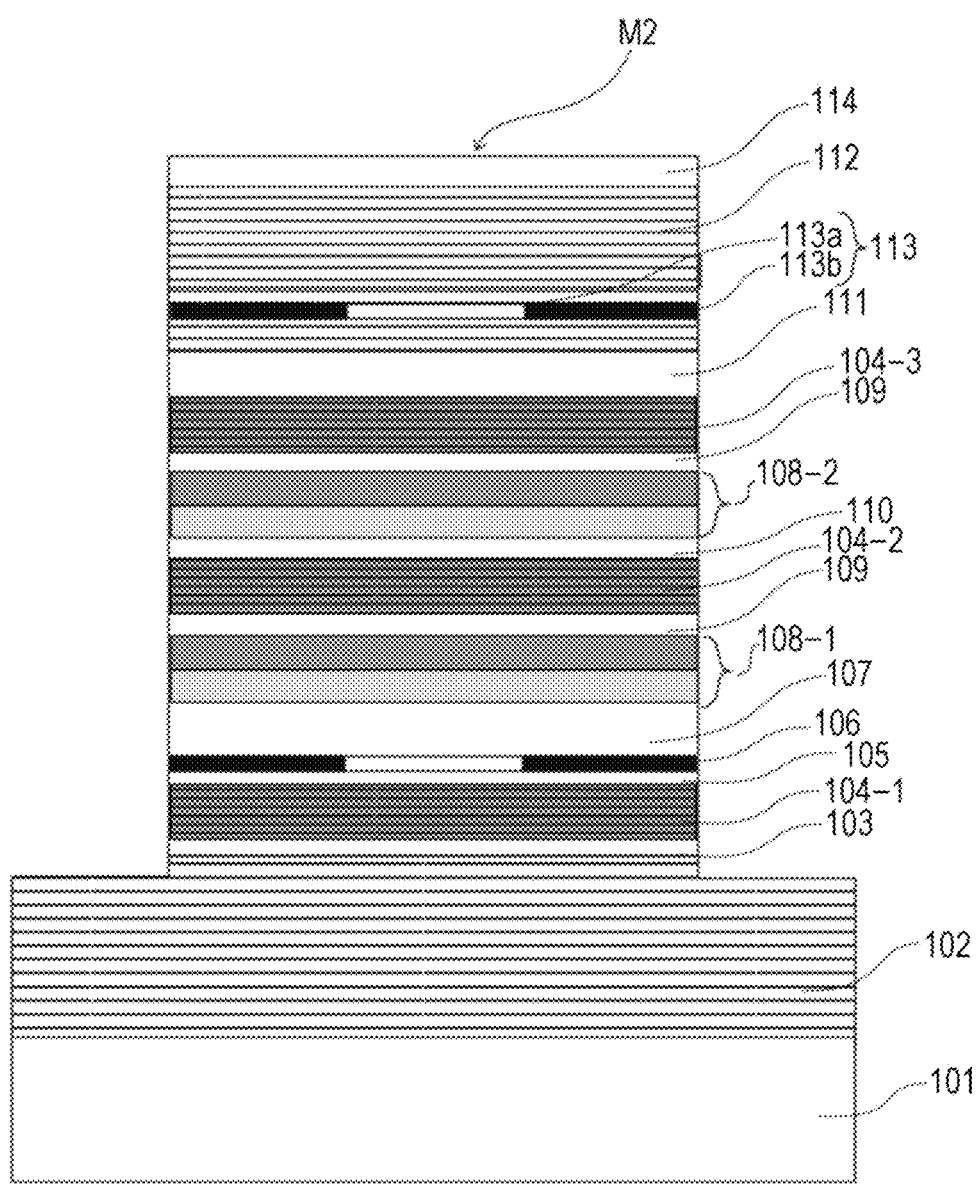
FIG. 34 is a third step diagram of FIG. 24.

In step S13, for example, peripheral portions of the selected oxide layers 106S and 113S to be selected (see FIG. 33) are oxidized to generate oxide confinement layers 106 and 113 (see FIG. 34).

Specifically, for example, the mesa M2 is exposed to a water vapor atmosphere, and the selected oxide layers 106S and 113S are oxidized (selectively oxidized) from the side surfaces to form the oxide confinement layer 106 in which the periphery of the non-oxidized region 106$a$ is surrounded by the oxidized region 106$b$ and to form the oxide confinement layer 113 in which the periphery of the oxidized region 113$a$ is surrounded by the oxidized region 113$b$.

<Step S14>

Figure 35:
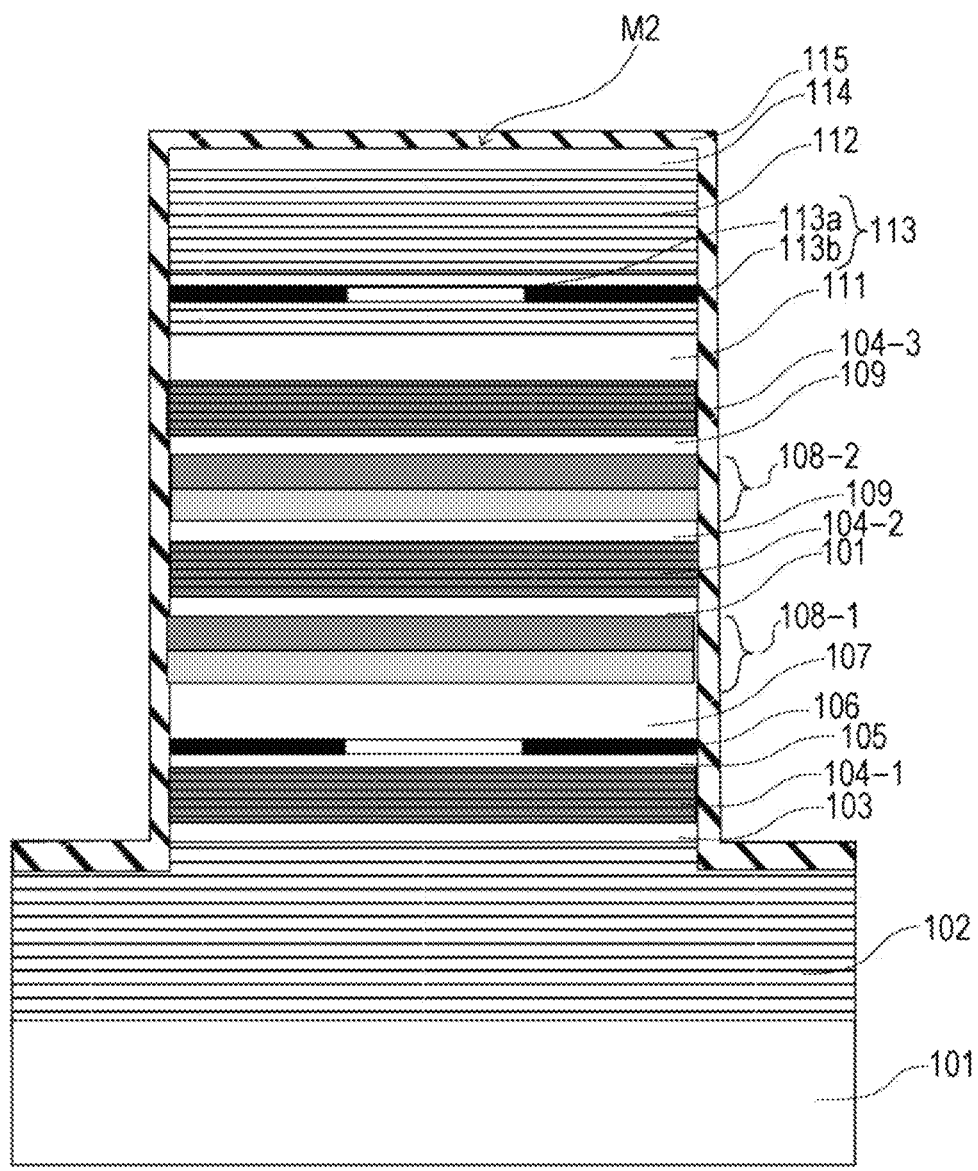
FIG. 35 is a fourth step diagram of FIG. 24.

In step S14, the insulating film 115 is formed (see FIG. 35). Specifically, for example, the insulating film 115 is formed over substantially the entire area of the laminate on which the mesa M2 is formed.

<Step S15>

Figure 36:
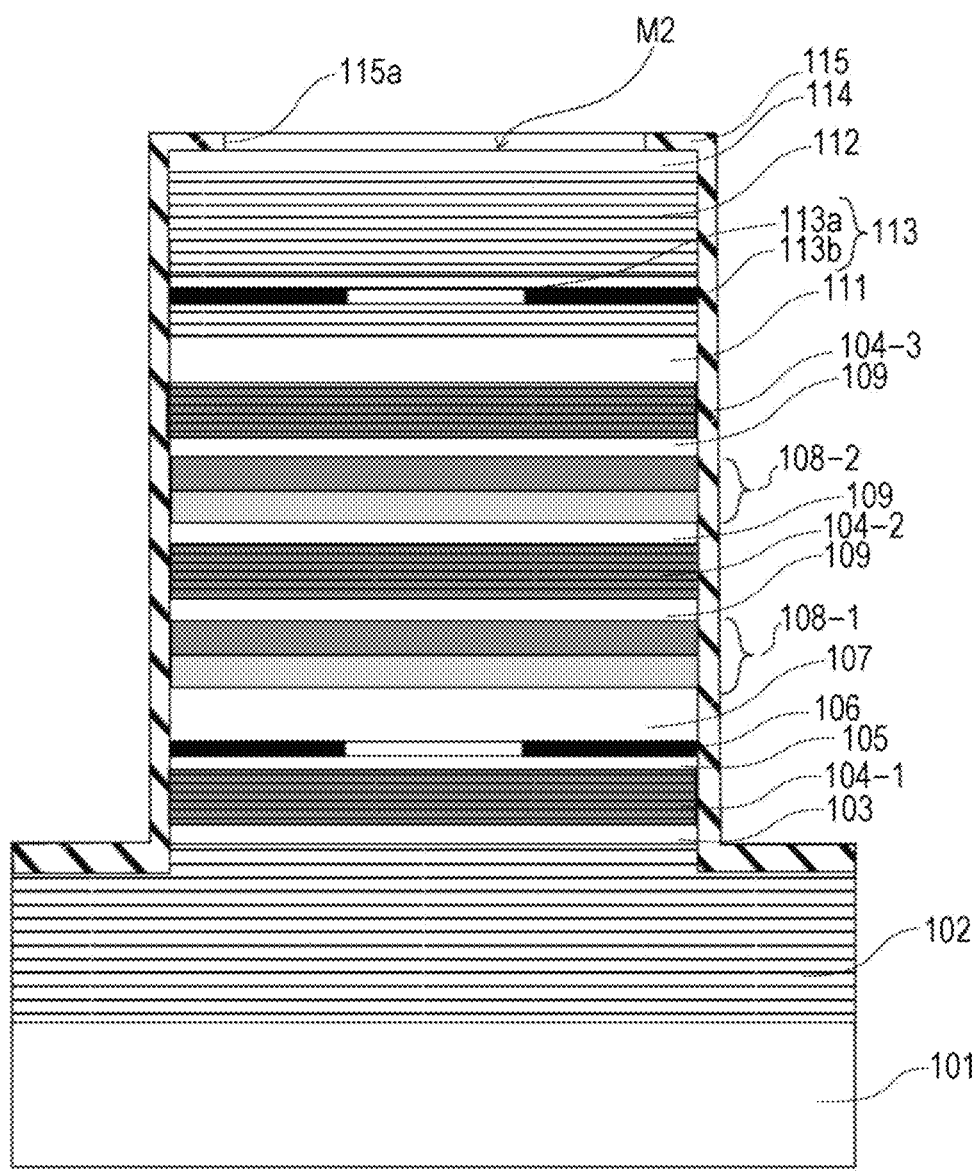
FIG. 36 is a fifth step diagram of FIG. 24.

In step S15, the contact hole 115a is formed (see FIG. 36). Specifically, for example, a resist pattern is formed by photolithography on the insulating film 115 other than the insulating film 115 formed on the top of the mesa M2. Next, using this resist pattern as a mask, the insulating film 115 formed on the top of the mesa M2 is removed by etching using, for example, a hydrofluoric acid-based etchant. Thereafter, the resist pattern is removed. As a result, the contact hole 115a is formed, and the contact layer 114 is exposed.

<Step S16>

Figure 37:
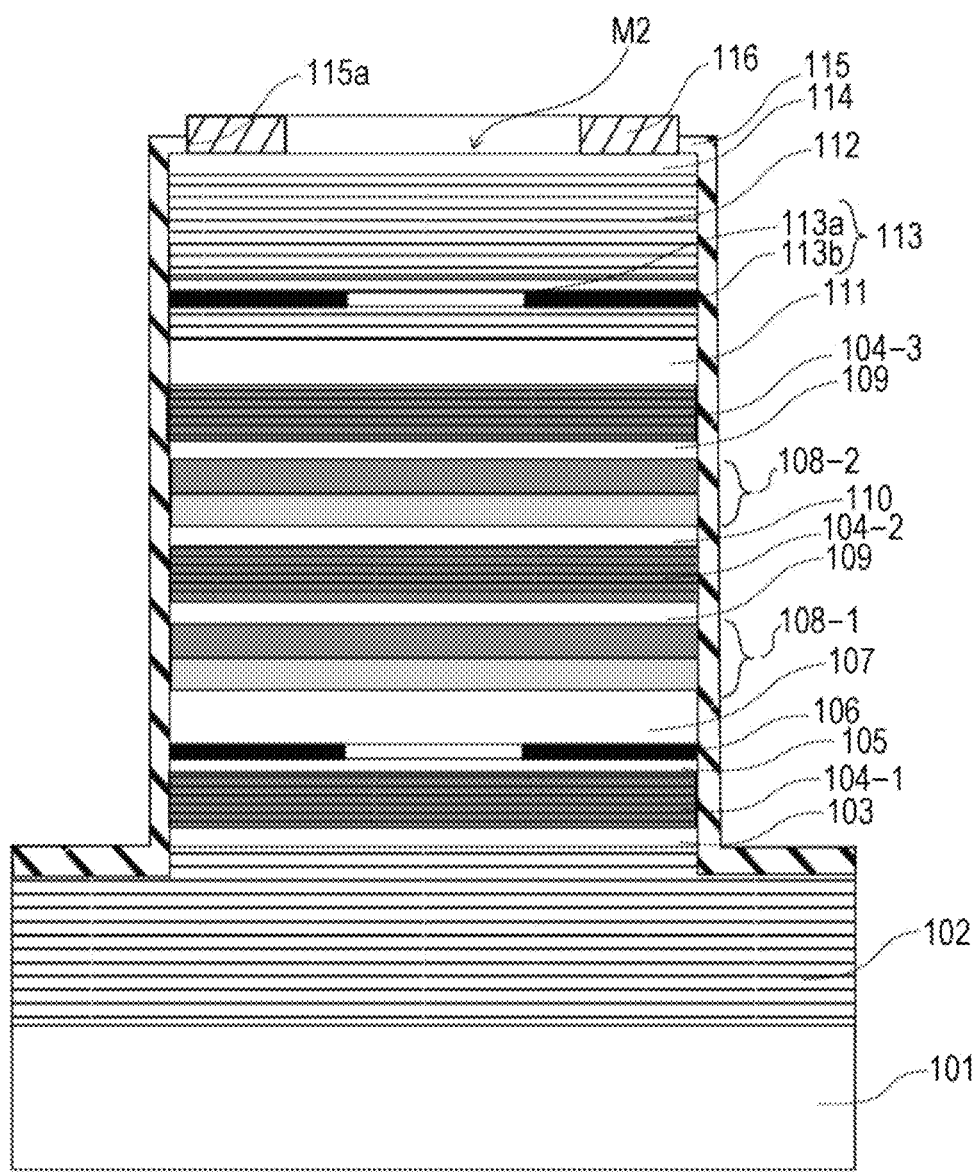
FIG. 37 is a sixth step diagram of FIG. 24.

In step S16, the anode electrode 116 is formed (see FIG. 37). Specifically, for example, a Ti/Pt/Au film is formed on the contact layer 114 via the contact hole 115a by an EB vapor deposition method, and the resist and, for example, Ti/Pt/Au on the resist are lifted off to form the annular anode electrode 116 in the contact hole 115a.

<Step S17>

Figure 38:
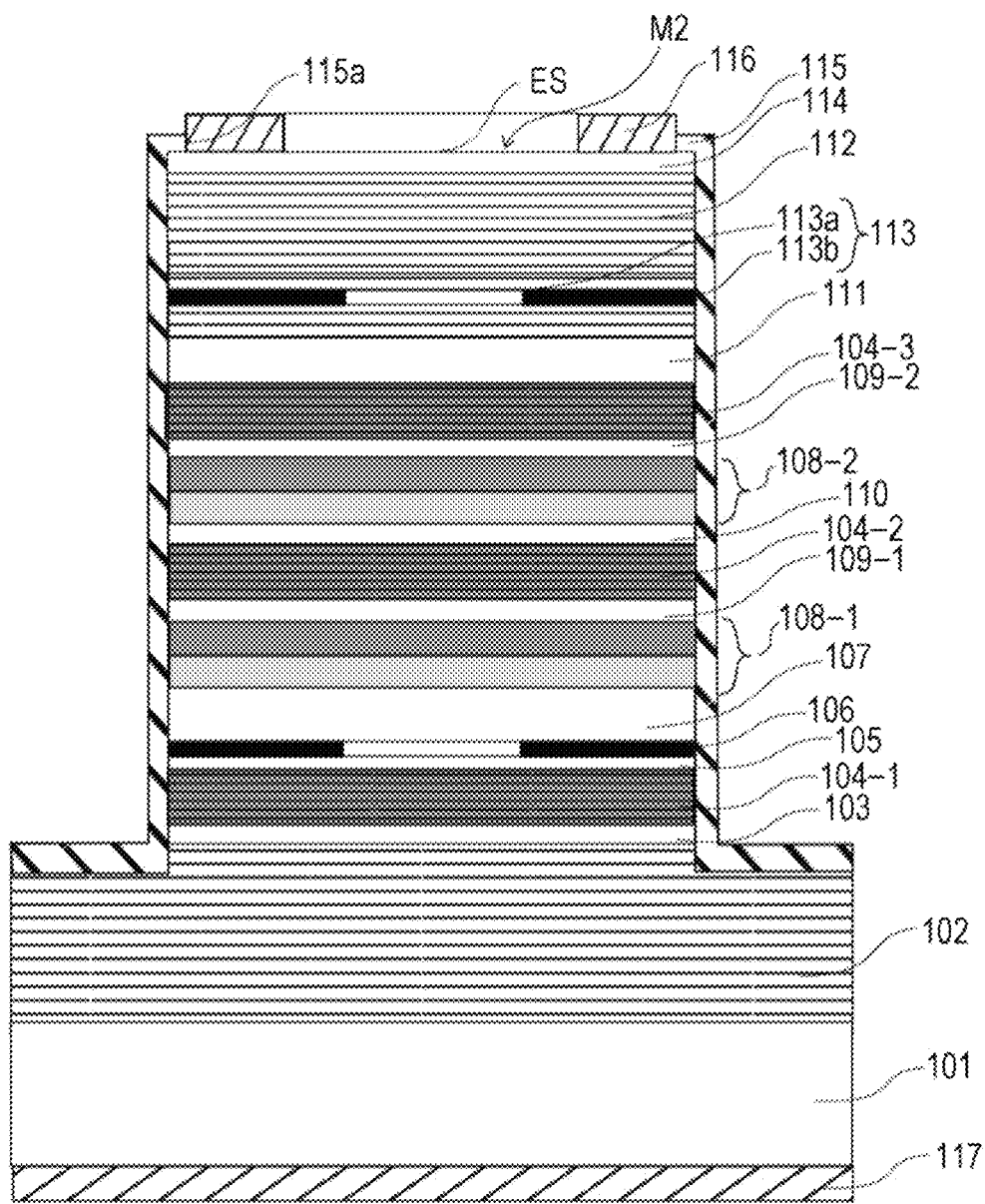
FIG. 38 is a seventh step diagram of FIG. 24.

In step S17, the cathode electrode 117 is formed (see FIG. 38). Specifically, after the back surface (lower surface) of the substrate 101 is polished, for example, an AuGe/Ni/Au film is formed on the back surface. If step S17 is executed, the flow of FIG. 24 ends.

(4) Effects of Surface Emitting Laser

Even in the case where the surface emitting laser 200 of the second embodiment, for example, has a multi-active layer having three active layers and has a long resonator length, a current can be efficiently injected into the first active layer 104-1 which is the active layer (for example, the active layer farthest from the emission surface ES) located in the vicinity of the downstream end of the current path in the resonator by the oxide confinement layer 106.

4. Surface Emitting Lasers According to Modifications 1 to 4 of Second Embodiment of Present Technology Hereinafter, surface emitting lasers according to Modifications 1 to 4 of the second embodiment of the present technology will be described.

(Modification 1)

Figure 39:
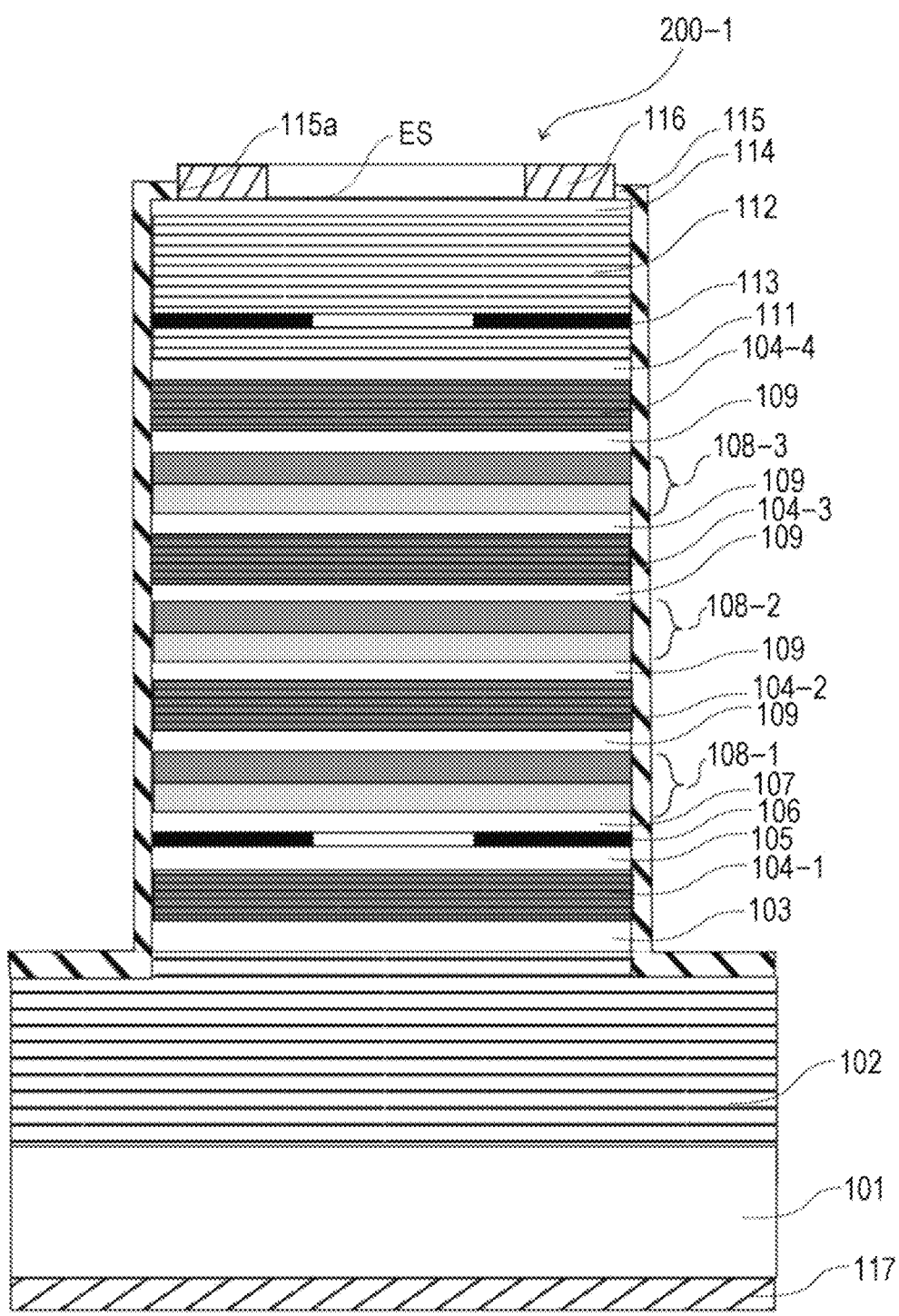
FIG. 39 is a cross-sectional view illustrating a configuration of a surface emitting laser according to Modification 1 of the second embodiment of the present technology.

As illustrated in FIG. 39, a surface emitting laser 200-1 of Modification 1 has a configuration similar to that of the surface emitting laser 200 (FIG. 23) of the second embodiment except that two pairs of a tunnel junction and an active layer are provided on the second active layer 104-2.

The surface emitting laser 200-1 has a configuration in which the third tunnel junction 108-3 and the fourth active layer 104-4 are laminated in that order on the third active layer 104-3 in the resonator of the surface emitting laser 200.

More specifically, in the surface emitting laser 200-1, the third tunnel junction 108-3 is laminated on the third active layer 104-3 with the spacer layer 109 interposed therebetween, and the fourth active layer 104-4 is laminated on the third tunnel junction 108-3 with the spacer layer 109 interposed therebetween.

Even in the case where the surface emitting laser 200-1 of Modification 1, for example, has a multi-active layer having four active layers and has a long resonator length, a current can also be efficiently injected into the first active layer 104-1 which is the active layer (for example, the active layer farthest from the emission surface ES) located in the vicinity of the downstream end of the current path in the resonator by the oxide confinement layer 106.

Figure 26:
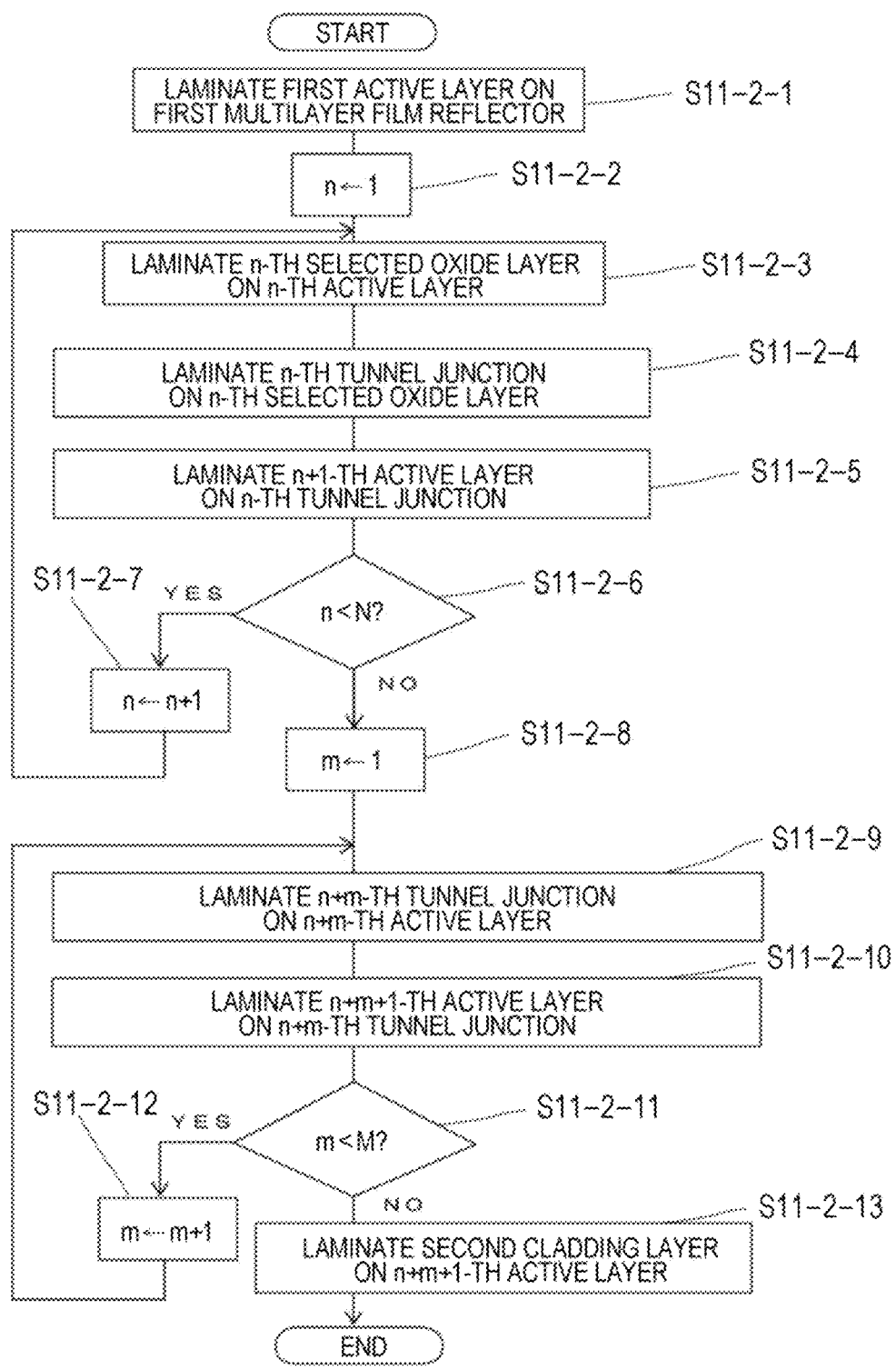
FIG. 26 is a flowchart for describing a second step (resonator base material generation step 2) in FIG. 25.

The surface emitting laser 200-1 is a derivative of the surface emitting laser 200, and can be manufactured by the procedure (where N=1 and M=2) of the flowchart in FIG. 26.

(Modification 2)

Figure 40:
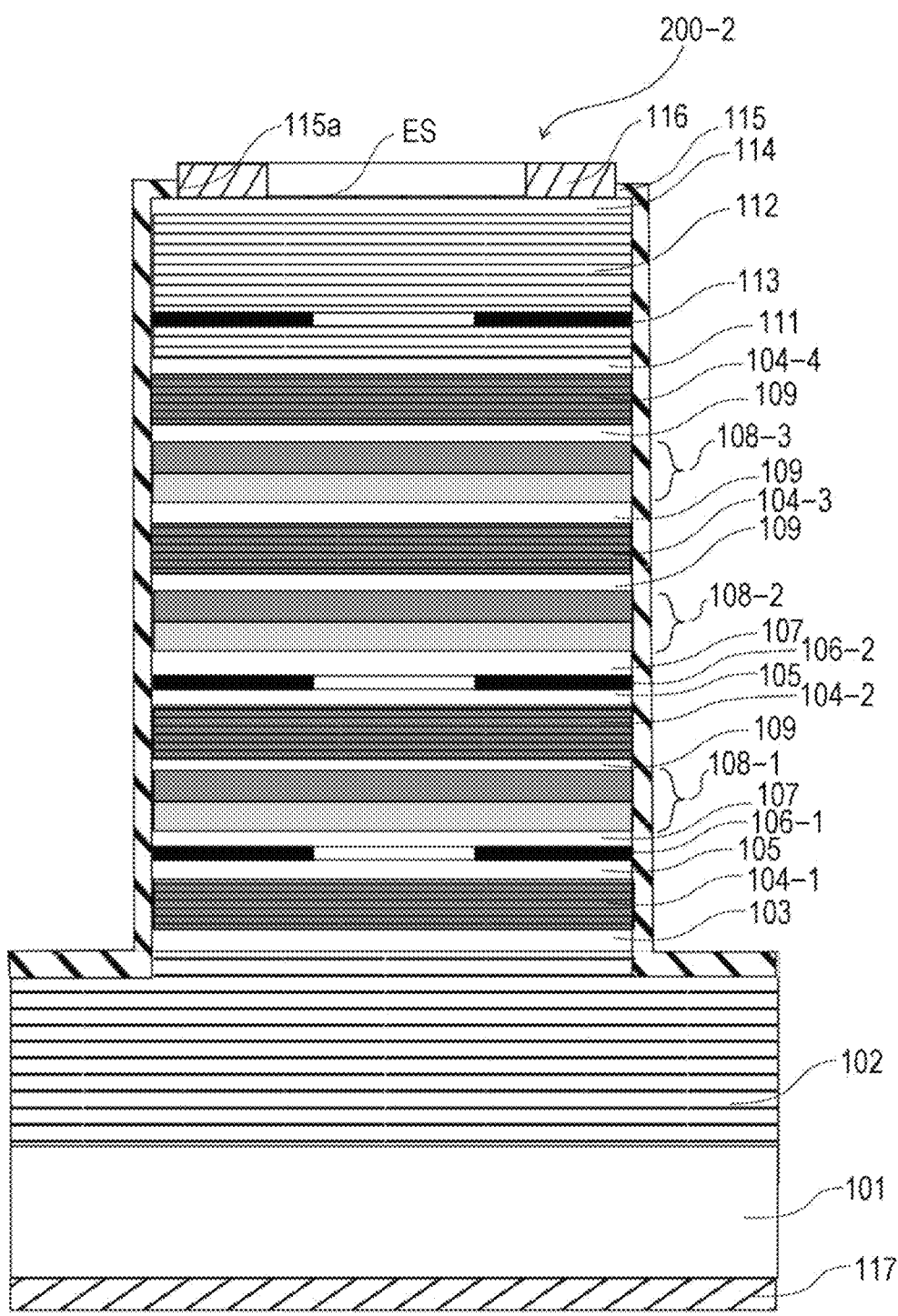
FIG. 40 is a cross-sectional view illustrating a configuration of a surface emitting laser according to Modification 2 of the second embodiment of the present technology.

As illustrated in FIG. 40, a surface emitting laser 200-2 of Modification 2 has a configuration similar to that of the surface emitting laser 200-1 (see FIG. 39) of Modification 1 except that the first oxide confinement layer 106-1 is provided between the first active layer 104-1 and the first tunnel junction 108-1, and the second oxide confinement layer 106-2 is provided between the second active layer 104-2 and the second tunnel junction 108-2.

Even in the case where the surface emitting laser 200-2 of Modification 2, for example, has a multi-active layer having four active layers and has a long resonator length, a current can also be efficiently injected into the first active layer 104-1 which is the active layer (for example, the active layer farthest from the emission surface ES) located in the vicinity of the downstream end of the current path in the resonator by the first and second oxide confinement layers 106-1 and 106-2, and a current can also be efficiently injected into the second active layer 104-2 by the second oxide confinement layer 106-2. For example, as in the surface emitting laser 200-2 having a long resonator length, it is effective to provide the oxide confinement layer in the vicinity of the intermediate portion in the vertical direction (height direction) of the resonator in that the spread of the current in the vicinity of the intermediate portion can be suppressed.

The surface emitting laser 200-2 is a derivative of the surface emitting laser 200, and can be manufactured by the procedure (where N=2 and M=1) of the flowchart in FIG. 26.

(Modification 3)

Figure 41:
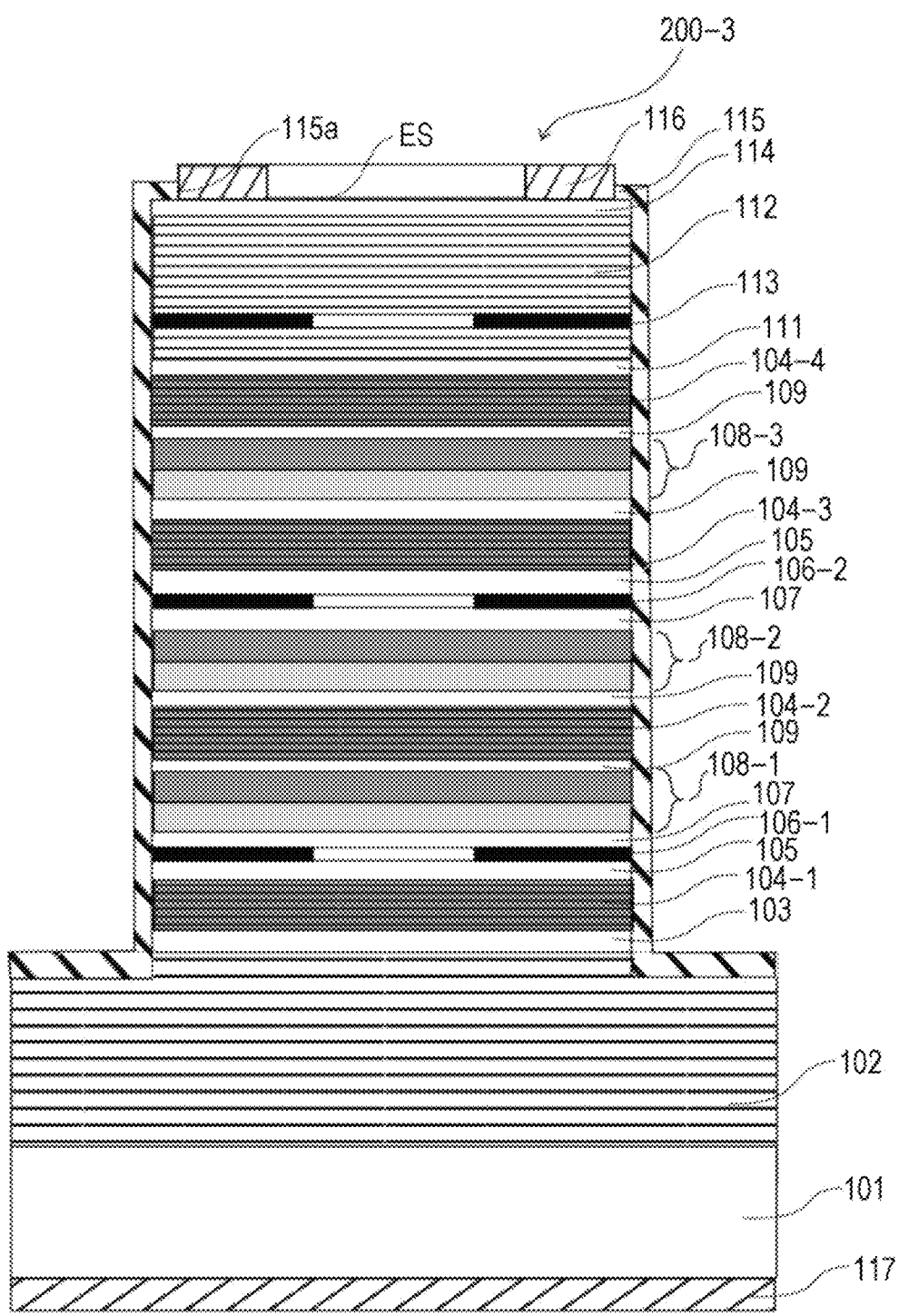
FIG. 41 is a cross-sectional view illustrating a configuration of a surface emitting laser according to Modification 3 of the second embodiment of the present technology.

As illustrated in FIG. 41, a surface emitting laser 200-3 of Modification 3 has a configuration similar to that of the surface emitting laser 200-1 (see FIG. 39) of Modification 1 except that the first oxide confinement layer 106-1 is provided between the first active layer 104-1 and the first tunnel junction 108-1, and the second oxide confinement layer 106-2 is provided between the second tunnel junction 108-1 and the third active layer 104-3.

Even in the case where the surface emitting laser 200-3 of Modification 3, for example, has a multi-active layer having four active layers and has a long resonator length, a current can also be efficiently injected into the first active layer 104-1 which is the active layer (for example, the active layer farthest from the emission surface ES) located in the vicinity of the downstream end of the current path in the resonator by the first and second oxide confinement layers 106-1 and 106-2, and a current can also be efficiently injected into the second active layer 104-2 by the second oxide confinement layer 106-2. For example, as in the surface emitting laser 200-3 having a long resonator length, it is effective to provide the oxide confinement layer in the vicinity of the intermediate portion in the vertical direction (height direction) of the resonator in that the spread of the current in the vicinity of the intermediate portion can be suppressed.

Since the surface emitting laser 200-3 needs to be provided with the second oxide confinement layer 106-2, the number of lamination steps increases accordingly, but it can be manufactured by a manufacturing method according to the manufacturing method of the surface emitting laser 200-1 (see FIG. 39) of Modification 1.

(Modification 4)

Figure 42:
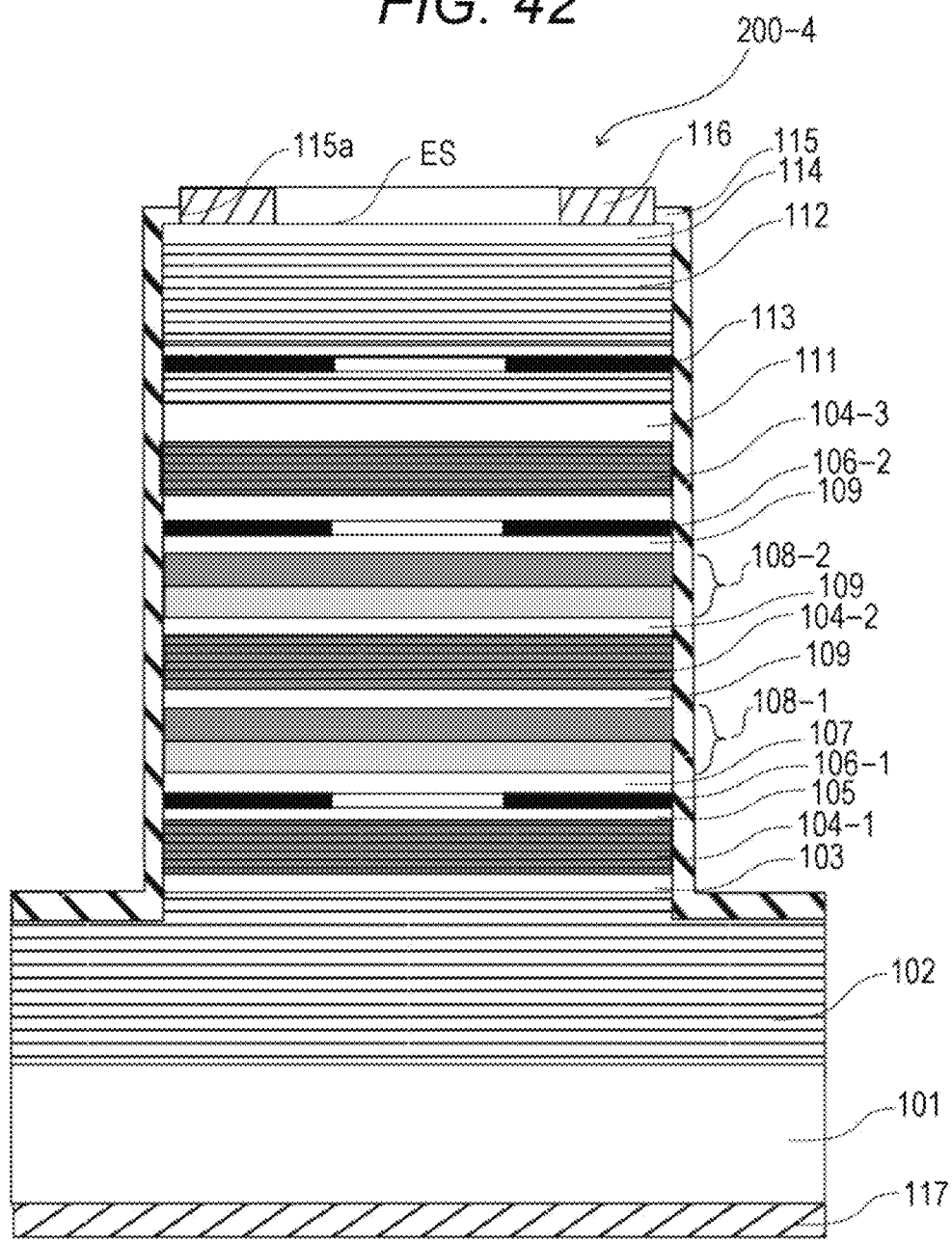
FIG. 42 is a cross-sectional view illustrating a configuration of a surface emitting laser according to Modification 4 of the second embodiment of the present technology.

As illustrated in FIG. 42, a surface emitting laser 200-4 of Modification 4 has a configuration similar to that of the surface emitting laser 200 (see FIG. 23) of the second embodiment except that the first oxide confinement layer 106-1 is provided between the first active layer 104-1 and the first tunnel junction 108-1, and the second oxide confinement layer 106-2 is provided between the second tunnel junction 108-1 and the third active layer 104-3.

Even in the case where the surface emitting laser 200-4 of Modification 4, for example, has a multi-active layer having three active layers, a current can also be efficiently injected into the first active layer 104-1 which is the active layer (for example, the active layer farthest from the emission surface ES) located in the vicinity of the downstream end of the current path in the resonator by the first and second oxide confinement layers 106-1 and 106-2, and a current can also be efficiently injected into the second active layer 104-2 by the second oxide confinement layer 106-2.

Since the surface emitting laser 200-4 needs to be provided with the second oxide confinement layer 106-2, the number of lamination steps increases accordingly, but it can be manufactured by a manufacturing method according to the manufacturing method of the surface emitting laser 200 of the second embodiment.

Figure 43:
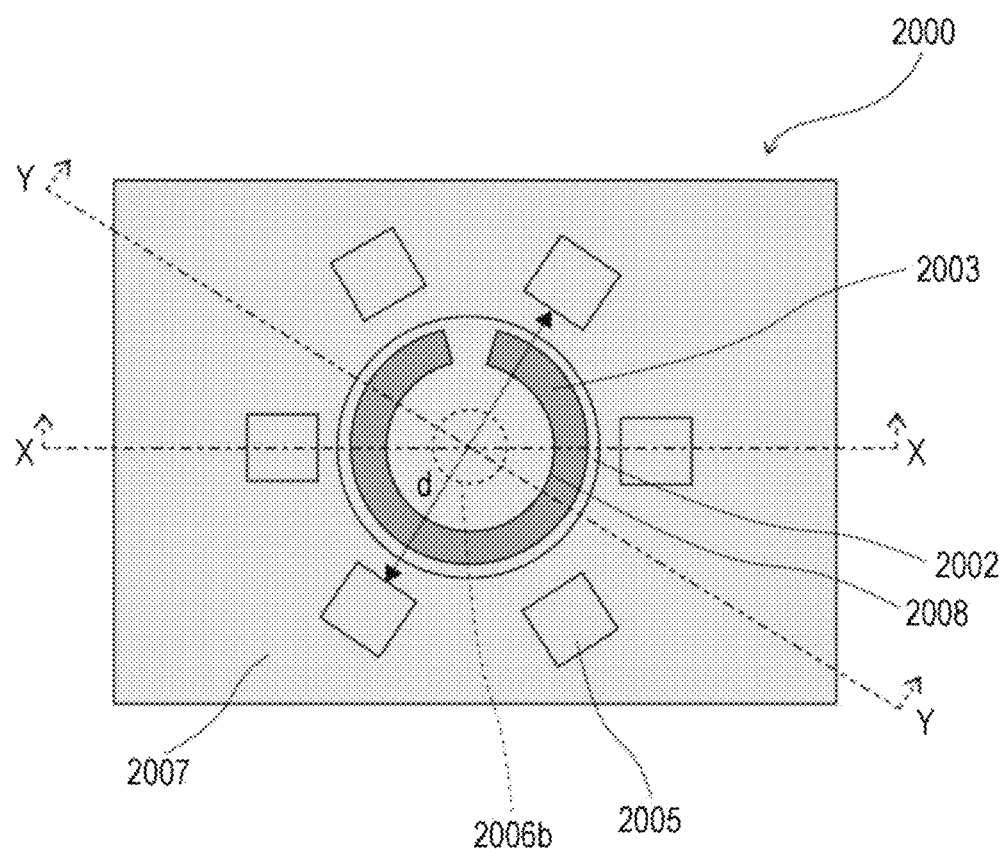
FIG. 43 is a plan view illustrating a configuration example of a surface emitting laser to which the present technology can be applied.

5. Configuration Example of Surface Emitting Laser to which Present Technology can be Applied FIG. 43 is a plan view illustrating a surface emitting laser 2000 which is a configuration example of a surface emitting laser to which the present technology can be applied. FIG. 44A is a cross-sectional view along line X-X of FIG. 43. FIG. 44B is a cross-sectional view along line Y-Y of FIG. 43.

Each component of the surface emitting laser 2000 is laminated on a substrate 2001. The substrate 2001 can include, for example, a semiconductor such as GaAs, InGaAs, InP, or InAsP.

The surface emitting laser 2000 includes a protective region 2002 (the transparent gray region in FIGS. 44A and 44B). As illustrated in FIG. 43, the protective region 2002 has a circular shape in plan view, but may have another shape such as an elliptical shape or a polygonal shape, but is not limited to a specific shape. The protective region 2002 includes a material that provides electrical isolation and is, for example, an ion-implanted region.

Further, as illustrated in FIGS. 44A and 44B, the surface emitting laser 2000 includes a first electrode 2003 and a second electrode 2004. As illustrated in FIG. 43, the first electrode 2003 has a ring shape having discontinuous portions (intermittent portions), that is, a split ring shape in plan view, but is not limited to a specific shape. As illustrated in FIG. 44A or 44B, the second electrode 2004 is in contact with the substrate 2001. The first electrode 2003 and the second electrode 2004 include, for example, a conductive material such as Ti, Pt, Au, AuGeNi, or PdGeAu. The first electrode 2003 and the second electrode 2004 may have a single layer structure or a laminated structure.

Further, the surface emitting laser 2000 includes a trench 2005 provided around the protective region 2002. FIG. 43 illustrates, as an example, a structure in which the trenches 2005 having a rectangular shape in plan view are provided at 6 portions, but the number of the trenches and the shape in plan view are not limited to specific ones. The trench 2005 is an opening for forming the oxide confinement layer 2006 (including an oxidized region 2006a and a non-oxidized region 2006b). In the manufacturing step of the surface emitting laser 2000, high-temperature water vapor is supplied via the trench 2005 to form the oxidized region 2006a of the oxide confinement layer 2006. For example, the oxidized region 2006a is $Al_2O_3$ formed as a result of the oxidation of the AlAs or AlGaAs layer. An arbitrary dielectric may be embedded in the trench 2005 after the step of forming the oxide confinement layer 2006. In addition, surface coating with a dielectric film may be performed.

Further, the surface emitting laser 2000 includes a dielectric opening 2008 (contact hole) provided in a dielectric layer 2007 on the first electrode 2003. The dielectric layer 2007 may have a laminated structure as illustrated in FIGS. 44A and 44B, or may have a single layer structure. As an example, the dielectric layer 2007 includes silicon oxide, silicon nitride, or the like. As illustrated in FIG. 43, the dielectric opening 2008 is formed in the same shape as the first electrode 2003. However, the shape of the dielectric opening 2008 is not limited to the shape of the first electrode 2003, and may be partially formed on the first electrode 2003. The dielectric opening 2008 is filled with a conductive material (not illustrated), and the conductive material comes into contact with the first electrode 2003.

Further, as illustrated in FIGS. 44A and 44B, the surface emitting laser 2000 includes an optical opening 2009 inside the first electrode 2003. The surface emitting laser 2000 emits a light beam through the optical opening 2009. Further, in the surface emitting laser 2000, the oxidized region 2006a of the oxide confinement layer 2006 functions as a current/light confinement region that confines current and light. The non-oxidized region 2006b of the oxide confinement layer 2006 is located below the optical opening 2009 and functions as a current/light passing region that passes current and light.

Further, the surface emitting laser 2000 includes a first multilayer reflector 2011 and a second multilayer reflector 2012. The multilayer reflector is a semiconductor multilayer reflector as an example, and is also referred to as a distributed Bragg reflector.

Further, the surface emitting laser 2000 includes an active layer 2013. The active layer 2013 is disposed between the first multilayer reflector 2011 and the second multilayer reflector 2012, confines the injected carriers, and defines the emission wavelength of the surface emitting laser 2000.

In the present configuration example, as an example, the case where the surface emitting laser 2000 is a front surface emitting type surface emitting laser has been described as an example, but the surface emitting laser 2000 can also constitute a back surface emitting type surface emitting laser.

As illustrated in FIGS. 43 and 44A, the substantial diameter of the surface emitting laser 2000 of the present configuration example is the diameter d of the virtual circle defined by the trench 2005.

As an example, the surface emitting laser 2000 of the present configuration example is manufactured by the procedure of the following steps 1 to 8.

(Step 1) Epitaxial growth of the first multilayer reflector 2011, the active layer 2013, a selected oxide layer serving as the oxide confinement layer 2006, and the second multilayer reflector 2012 is performed on the front surface of the substrate 2001.

(Step 2) The first electrode 2003 is formed on the second multilayer reflector 2012 using, for example, a lift-off method.

(Step 3) The trench 2005 is formed by, for example, photolithography.

(Step 4) A side surface of the selected oxide layer is exposed, and the oxide confinement layer 2006 is formed by selectively oxidizing the selected oxide layer from the side surface.

(Step 5) The protective region 2002 is formed by ion implantation or the like.

(Step 6) A film of the dielectric layer 2007 is formed by, for example, vapor deposition, sputtering, or the like.

(Step 7) The dielectric opening 2008 is formed in the dielectric layer 2007 by, for example, photolithography to expose the contact of the first electrode 2003.

(Step 8) After the back surface of the substrate 2001 is polished and thinned, the second electrode 2004 is formed on the back surface of the substrate 2001.

The number of layers, arrangement, thickness, arrangement order, symmetry, and the like of the layers constituting the surface emitting laser 2000 described above are examples, and can be appropriately changed. That is, the surface emitting laser 2000 may include more layers, fewer layers, different layers, layers of different structures, or layers of different arrangements than those illustrated in FIGS. 43, 44A, and 44B.

The present technology can be applied to the surface emitting laser 2000 described above and modifications thereof.

6. Modification of Present Technology

The present technology is not limited to each of the above-described embodiments and modifications, and various modifications can be made.

For example, the n-type semiconductor layer of the tunnel junction may be a GaAs layer doped with a GaAs-based compound semiconductor, for example, Si at a high concentration ($1 \times 19$ cm$^{-3}$), for example, having a thickness of 20 nm.

For example, the guide/barrier region of the active layer may include a GaAsP-based compound semiconductor (for example, GaAsP$_{0.10}$).

In the surface emitting laser of each of the above embodiments and modifications, the oxide confinement layer 113 may not necessarily be provided.

In the surface emitting laser of each of the above embodiments and modifications, the contact layer 114 may not necessarily be provided.

In the surface emitting laser of each of the above embodiments and modifications, each spacer layer and each cladding layer may be appropriately omitted as necessary.

In the surface emitting laser of each of the above embodiments and modifications, the active layer may have a single layer structure.

In the surface emitting laser of each of the above embodiments and modifications, the conductivity types (first and second conductivity types) may be interchanged.

In each of the above-described embodiments and modifications, both the first and second multilayer film reflectors 102 and 112 are semiconductor multilayer film reflectors, but the present technology is not limited thereto.

For example, the first multilayer film reflector 102 may be a semiconductor multilayer film reflector, and the second multilayer film reflector 112 may be a dielectric multilayer film reflector. The dielectric multilayer film reflector is also a kind of distributed Bragg reflector.

For example, the first multilayer film reflector 102 may be a dielectric multilayer film reflector, and the second multilayer film reflector 112 may be a semiconductor multilayer film reflector.

For example, both the first and second multilayer film reflectors 102 and 112 may be dielectric multilayer film reflectors.

The semiconductor multilayer film reflector has low light absorption and conductivity. From this viewpoint, the semiconductor multilayer film reflector is suitable for the second multilayer film reflector 112 on the emission side (front surface side) and on the current path from the anode electrode 116 to each active layer.

On the other hand, the dielectric multilayer film reflector has extremely low light absorption. From this viewpoint, the dielectric multilayer film reflector is suitable for the second multilayer film reflector 112 on the emission side (front surface side).

In each of the above embodiments and modifications, the front surface emitting type surface emitting laser that emits laser light from the mesa top has been described as an example, but the present technology is also applicable to a back surface emitting type surface emitting laser that emits laser light from the back surface of the substrate (the back surface of the substrate is used as an emission surface).

In this case, it is preferable to use a substrate transparent to the oscillation wavelength as the substrate, or to provide an opening serving as an emission port in the substrate.

In each of the above embodiments and modifications, the surface emitting laser 10 using an AlGaAs-based compound semiconductor has been described as an example, but the present technology is also applicable to, for example, a surface emitting laser using a GaN-based compound semiconductor.

Specifically, a GaN-based semiconductor multilayer film reflector may be used for at least one of the first multilayer film reflector 102 or the second multilayer film reflector 112, or a GaN-based dielectric multilayer film reflector may be used for at least one of the first and second multilayer film reflectors 102 and 112.

Examples of the GaN-based compound semiconductor used for at least one of the first multilayer film reflector 102 or the second multilayer film reflector 112 include GaN/AlGaN.

Some of the configurations of the surface emitting laser of each of the above embodiments and modifications may be combined within a range in which they do not contradict each other.

7. Application Example to Electronic Device

The technology according to the present disclosure (present technology) can be applied to various products (electronic devices). For example, the technology according to the present disclosure may be realized as a device mounted on any type of mobile body such as an automobile, an electric vehicle, a hybrid electric vehicle, a motorcycle, a bicycle, a personal mobility, an airplane, a drone, a ship, and a robot.

The surface emitting laser according to the present technology can also be applied as, for example, a light source of a device that forms or displays an image by laser light (for example, a laser printer, a laser copier, a projector, a head-mounted display, a head-up display, or the like).

8. <Example in which Surface Emitting Laser is Applied to Distance Measuring Device>

Hereinafter, application examples of the surface emitting laser according to each of the above embodiments and modifications will be described.

Figure 45:
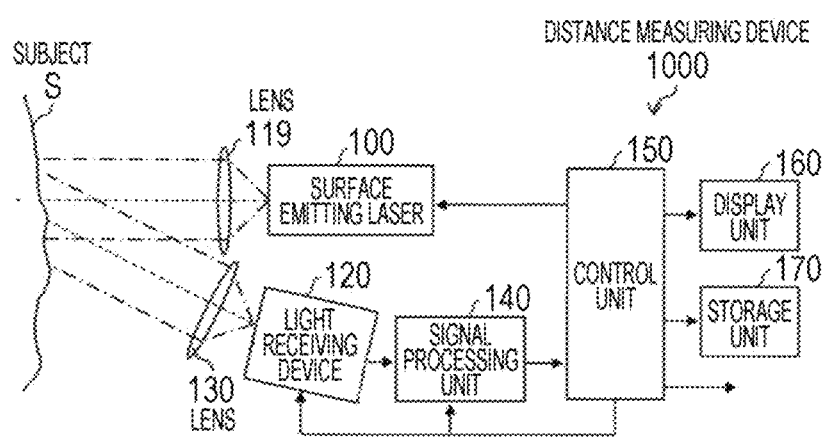
FIG. 45 is a diagram illustrating an application example of a surface emitting laser according to each embodiment of the present technology and its modification to a distance measuring device.

FIG. 45 illustrates an example of a schematic configuration of a distance measuring device 1000 including a surface emitting laser 100 as an example of an electronic device according to the present technology. The distance measuring device 1000 measures the distance to a subject S by a time of flight (TOF) method. The distance measuring device 1000 includes a surface emitting laser 100 as a light source. The distance measuring device 1000 includes, for example, a surface emitting laser 100, a light receiving device 120, lenses 119 and 130, a signal processing unit 140, a control unit 150, a display unit 160, and a storage unit 170.

The light receiving device 120 detects light reflected by the subject S. The lens 119 is a lens for collimating the light emitted from the surface emitting laser 100, and is a collimating lens. The lens 130 is a lens for condensing light reflected by the subject S and guiding the light to the light receiving device 120, and is a condensing lens.

The signal processing unit 140 is a circuit for generating a signal corresponding to a difference between a signal input from the light receiving device 120 and a reference signal input from the control unit 150. The control unit 150 includes, for example, a time to digital converter (TDC). The reference signal may be a signal input from the control unit 150, or may be an output signal of a detection unit that directly detects the output of the surface emitting laser 100. The control unit 150 is, for example, a processor that controls the surface emitting laser 100, the light receiving device 120, the signal processing unit 140, the display unit 160, and the storage unit 170. The control unit 150 is a circuit that measures the distance to the subject S on the basis of the signal generated by the signal processing unit 140. The control unit 150 generates a video signal for displaying information about the distance to the subject S, and outputs the video signal to the display unit 160. The display unit 160 displays information about the distance to the subject S on the basis of the video signal input from the control unit 150. The control unit 150 stores information about the distance to the subject S in the storage unit 170.

In the present application example, instead of the surface emitting laser 100, any one of the surface emitting lasers 100-1 to 100-6, 200, and 200-1 to 200-4 can be applied to the distance measuring device 1000.

9. <Example in which Distance Measuring Device is Mounted on Mobile Body>

Figure 46:
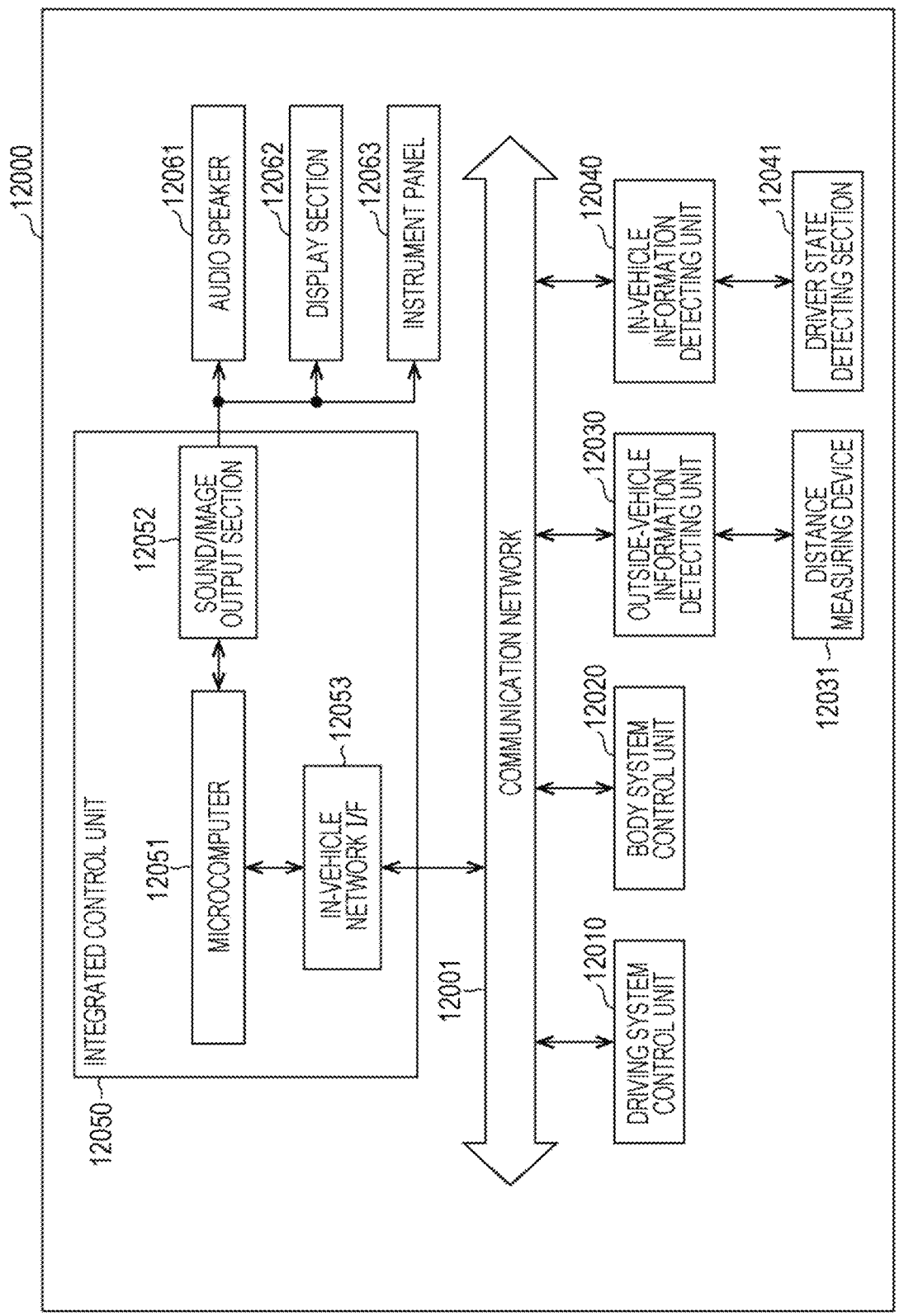
FIG. 46 is a block diagram illustrating an example of a schematic configuration of a vehicle control system.

FIG. 46 is a block diagram illustrating a schematic configuration example of a vehicle control system which is an example of a mobile body control system to which the technology according to the present disclosure can be applied.

A vehicle control system 12000 includes a plurality of electronic control units connected via a communication network 12001. In the example illustrated in FIG. 46, the vehicle control system 12000 includes a driving system control unit 12010, a body system control unit 12020, an outside-vehicle information detecting unit 12030, an in-vehicle information detecting unit 12040, and an integrated control unit 12050. Furthermore, as a functional configuration of the integrated control unit 12050, a microcomputer 12051, a sound/image output section 12052, and an in-vehicle network interface (I/F) 12053 are illustrated.

The driving system control unit 12010 controls the operation of devices related to the drive system of the vehicle according to various programs. For example, the driving system control unit 12010 functions as a control device of a driving force generation device for generating a driving force of the vehicle such as an internal combustion engine or a driving motor, a driving force transmission mechanism for transmitting the driving force to wheels, a steering mechanism for adjusting a steering angle of the vehicle, a braking device for generating a braking force of the vehicle, and the like.

The body system control unit 12020 controls operations of various devices mounted on the vehicle body according to various programs. For example, the body system control unit 12020 functions as a control device of a keyless entry system, a smart key system, a power window device, or various lamps such as a head lamp, a back lamp, a brake lamp, a blinker, or a fog lamp. In this case, radio waves transmitted from a portable device that substitutes for a key or signals of various switches can be input to the body system control unit 12020. The body system control unit 12020 receives input of these radio waves or signals, and controls a door lock device, a power window device, a lamp, and the like of the vehicle.

The outside-vehicle information detecting unit 12030 detects information outside the vehicle on which the vehicle control system 12000 is mounted. For example, a distance measuring device 12031 is connected to the outside-vehicle information detecting unit 12030. The distance measuring device 12031 includes the above-described distance measuring device 1000. The outside-vehicle information detecting unit 12030 causes the distance measuring device 12031 to measure a distance to an object (subject S) outside the vehicle, and acquires distance data obtained by the measurement. The outside-vehicle information detecting unit 12030 may perform object detection processing of a person, a vehicle, an obstacle, a sign, or the like on the basis of the acquired distance data.

The in-vehicle information detecting unit 12040 detects information inside the vehicle. For example, a driver state detecting section 12041 that detects a state of a driver is connected to the in-vehicle information detecting unit 12040. The driver state detecting section 12041 includes, for example, a camera that captures an image of the driver, and the in-vehicle information detecting unit 12040 may calculate the degree of fatigue or the degree of concentration of the driver or may determine whether or not the driver is dozing off on the basis of the detection information input from the driver state detecting section 12041.

The microcomputer 12051 can calculate a control target value of the driving force generation device, the steering mechanism, or the braking device on the basis of the information inside and outside the vehicle acquired by the outside-vehicle information detecting unit 12030 or the in-vehicle information detecting unit 12040, and output a control command to the driving system control unit 12010. For example, the microcomputer 12051 can perform cooperative control for the purpose of implementing functions of an advanced driver assistance system (ADAS) including collision avoidance or impact mitigation of the vehicle, follow-up traveling based on an inter-vehicle distance, vehicle speed maintenance traveling, vehicle collision warning, vehicle lane departure warning, or the like.

Furthermore, the microcomputer 12051 controls the driving force generation device, the steering mechanism, the braking device, or the like on the basis of the information around the vehicle acquired by the outside-vehicle information detecting unit 12030 or the in-vehicle information detecting unit 12040, thereby performing cooperative control for the purpose of automated driving or the like in which the vehicle autonomously travels without depending on the operation of the driver.

Furthermore, the microcomputer 12051 can output a control command to the body system control unit 12020 on the basis of the vehicle exterior information acquired by the outside-vehicle information detecting unit 12030. For example, the microcomputer 12051 can perform cooperative control for the purpose of preventing glare, such as switching from a high beam to a low beam, by controlling the head lamp according to the position of a preceding vehicle or an oncoming vehicle detected by the outside-vehicle information detecting unit 12030.

The sound/image output section 12052 transmits an output signal of at least one of a sound or an image to an output device capable of visually or audibly notifying an occupant of the vehicle or the outside of the vehicle of information. In the example of FIG. 46, an audio speaker 12061, a display section 12062, and an instrument panel 12063 are illustrated as the output device. The display section 12062 may include, for example, at least one of an on-board display or a head-up display.

Figure 47:
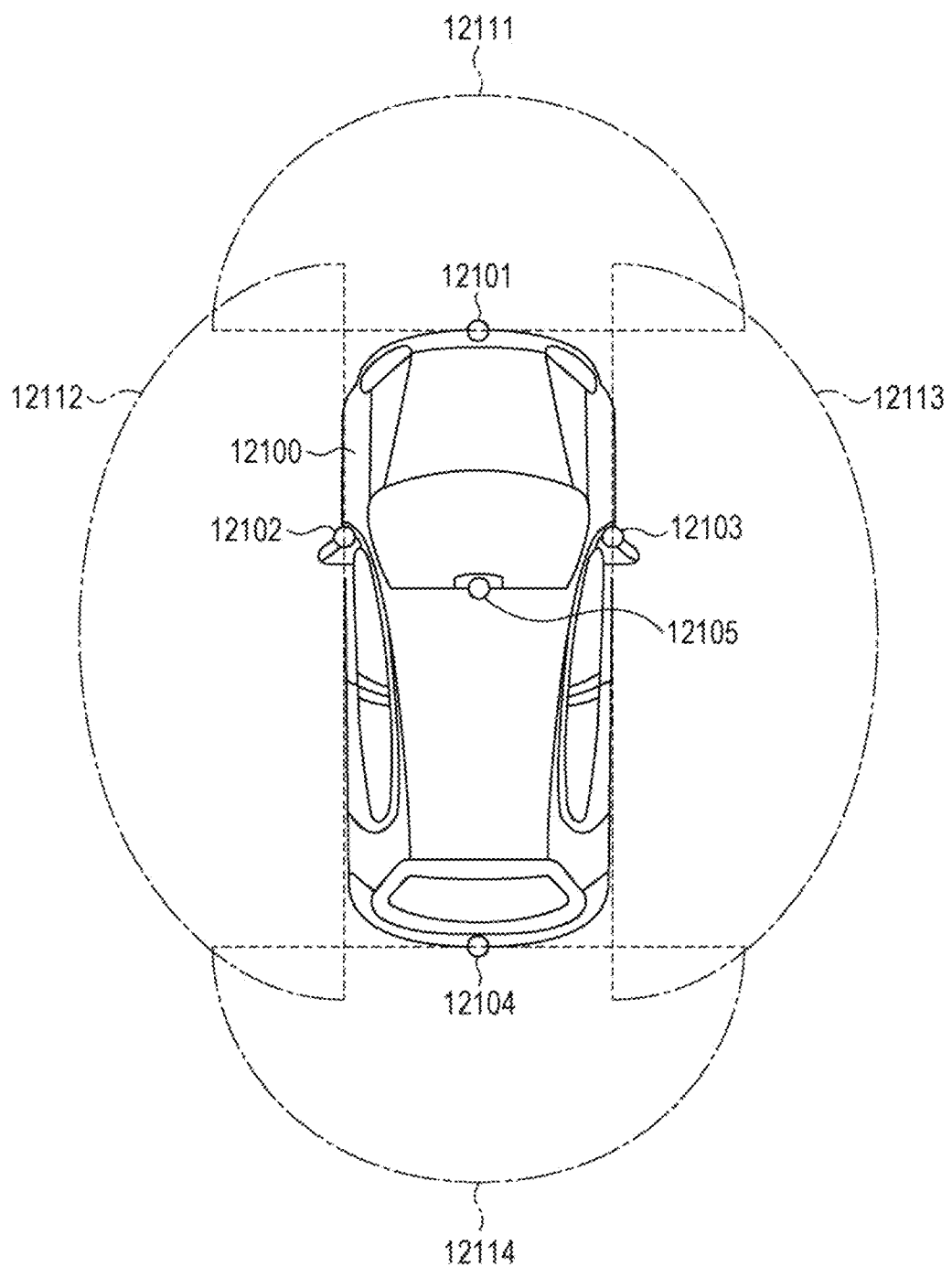
FIG. 47 is an explanatory view illustrating an example of installation positions of a distance measuring device.

FIG. 47 is a view illustrating an example of an installation position of the distance measuring device 12031.

In FIG. 47, a vehicle 12100 includes distance measuring devices 12101, 12102, 12103, 12104, and 12105 as the distance measuring device 12031.

The distance measuring devices 12101, 12102, 12103, 12104, and 12105 are provided, for example, at positions such as a front nose, side mirrors, a rear bumper, a back door, and an upper portion of a windshield in a vehicle interior of the vehicle 12100. The distance measuring device 12101 provided at the front nose and the distance measuring device 12105 provided at the upper portion of the windshield in the vehicle interior mainly acquire data in front of the vehicle 12100. The distance measuring devices 12102 and 12103 provided at the side mirrors mainly acquire data on the sides of the vehicle 12100. The distance measuring device 12104 provided on the rear bumper or the back door mainly acquires data behind the vehicle 12100. The data in front of the vehicle acquired by the distance measuring devices 12101 and 12105 is mainly used for detecting a preceding vehicle, a pedestrian, an obstacle, a traffic light, a traffic sign, or the like.

Note that FIG. 47 illustrates an example of detection ranges of the distance measuring devices 12101 to 12104. A detection range 12111 indicates a detection range of the distance measuring device 12101 provided on the front nose, detection ranges 12112 and 12113 indicate detection ranges of the distance measuring devices 12102 and 12103 provided on the side mirrors, respectively, and a detection range 12114 indicates a detection range of the distance measuring device 12104 provided on the rear bumper or the back door.

For example, the microcomputer 12051 obtains a distance to each three-dimensional object in the detection ranges 12111 to 12114 and a temporal change of the distance (relative speed with respect to the vehicle 12100) on the basis of the distance data obtained from the distance measuring devices 12101 to 12104, thereby extracting, as a preceding vehicle, a three-dimensional object traveling at a predetermined speed (for example, 0 km/h or more) in substantially the same direction as the vehicle 12100, in particular, the closest three-dimensional object on a traveling path of the vehicle 12100. Furthermore, the microcomputer 12051 can set an inter-vehicle distance to be secured in advance in front of the preceding vehicle, and can perform automatic brake control (including follow-up stop control), automatic acceleration control (including follow-up start control), and the like. In this way, it is possible to perform cooperative control for the purpose of automated driving or the like in which the vehicle autonomously travels without depending on the operation of the driver.

For example, on the basis of the distance data obtained from the distance measuring devices 12101 to 12104, the microcomputer 12051 can classify three-dimensional object data regarding three-dimensional objects into two-wheeled vehicles, ordinary vehicles, large vehicles, pedestrians, and other three-dimensional objects such as utility poles, extract the three-dimensional object data, and use the three-dimensional object data for automatic avoidance of obstacles. For example, the microcomputer 12051 identifies obstacles around the vehicle 12100 as obstacles that can be visually recognized by the driver of the vehicle 12100 and obstacles that are difficult to visually recognize. Then, the microcomputer 12051 determines a collision risk indicating a risk of collision with each obstacle, and when the collision risk is a setting value or more and there is a possibility of collision, the microcomputer can perform driving assistance for collision avoidance by outputting an alarm to the driver via the audio speaker 12061 or the display section 12062 or performing forced deceleration or avoidance steering via the driving system control unit 12010.

An example of a mobile body control system to which the technology according to the present disclosure can be applied has been described above. The technology according to the present disclosure can be applied to the distance measuring device 12031 among the configurations described above.

The specific numerical values, shapes, materials (including compositions), and the like described in the present specification are merely examples, and the present technology is not limited thereto.

Furthermore, the present technology can also have the following configurations.

(1) A surface emitting laser including:

first and second multilayer film reflectors;

a plurality of active layers laminated together between the first and second multilayer film reflectors;

a tunnel junction disposed between two active layers adjacent to each other in a lamination direction among the plurality of active layers; and an oxide confinement layer disposed between one active layer of the two adjacent active layers and the tunnel junction.

(2) The surface emitting laser according to (1), in which the one active layer is disposed at a position farther from an emission surface of the surface emitting laser than another active layer of the two adjacent active layers.

(3) The surface emitting laser according to (1) or (2), in which the one active layer is disposed at a position closer to one of the first and second multilayer film reflectors that is farther from an emission surface of the surface emitting laser than another of the first and second multilayer film reflectors that is closer to the emission surface.

(4) The surface emitting laser according to (1) or (2), in which the one active layer is disposed at a position closer to one of the first and second multilayer film reflectors that is closer to an emission surface of the surface emitting laser than another of the first and second multilayer film reflectors that is farther from the emission surface.

(5) The surface emitting laser according to (1), in which the one active layer is disposed at a position closer to an emission surface of the surface emitting laser than another active layer of the two adjacent active layers.

(6) The surface emitting laser according to (1) or (5), in which the one active layer is disposed at a position closer to one of the first and second multilayer film reflectors that is farther from an emission surface of the surface emitting laser than another of the first and second multilayer film reflectors that is closer to the emission surface.

(7) The surface emitting laser according to (1) or (5), in which the one active layer is disposed at a position closer to one of the first and second multilayer film reflectors that is closer to the emission surface than another of the first and second multilayer film reflectors that is farther from the emission surface.

(8) The surface emitting laser according to any one of (1) to (7), in which the plurality of active layers is at least three active layers, the tunnel junction is disposed between two adjacent active layers of each set of at least two sets of two adjacent active layers among the plurality of active layers, and the oxide confinement layer is disposed between one active layer of at least one set of two adjacent active layers of the at least two sets of two adjacent active layers and the tunnel junction disposed between the two adjacent active layers.

(9) The surface emitting laser according to (8), in which the at least three active layers include first, second, and third active layers, the first, second, and third active layers are laminated in that order, a first tunnel junction, which is the tunnel junction, is disposed between the first and second active layers, a second tunnel junction, which is the tunnel junction, is disposed between the second and third active layers, and the oxide confinement layer is disposed between the first active layer and the first tunnel junction and/or between the second active layer and the second tunnel junction.

(10) The surface emitting laser according to (9), in which the first active layer is an active layer disposed at a position farthest from an emission surface of the surface emitting laser among the plurality of active layers.

(11) The surface emitting laser according to (9) or (10), in which a first oxide confinement layer, which is the oxide confinement layer, is disposed between the first active layer and the first tunnel junction.

(12) The surface emitting laser according to any one of (9) to (11), in which a second oxide confinement layer, which is the oxide confinement layer, is disposed between the second active layer and the second tunnel junction.

(13) The surface emitting laser according to (9) to (11), in which the oxide confinement layer is not disposed between the second active layer and the second tunnel junction.

(14) The surface emitting laser according to any one of (1) to (13), in which another oxide confinement layer is disposed inside one of the first and second multilayer film reflectors closer to an emission surface of the surface emitting laser.

(15) The surface emitting laser according to (14), in which both the oxide confinement layer and the another oxide confinement layer are formed by selectively oxidizing a layer formed by an AlGaAs-based compound semiconductor.

(16) The surface emitting laser according to (14) or (15), in which the oxide confinement layer and the another oxide confinement layer are different from each other in Al composition and/or optical thickness.

(17) The surface emitting laser according to any one of (1) to (16), in which the tunnel junction has a layer structure in which a p-type semiconductor layer and an n-type semiconductor layer are laminated together, and the oxide confinement layer is disposed on the p-type semiconductor layer side.

(18) The surface emitting laser according to any one of (1) to (17), in which, if an oscillation wavelength of the surface emitting laser is $\lambda$, the one active layer, the tunnel junction, and the oxide confinement layer are disposed within an optical thickness of $3\lambda/4$.

(19) An electronic device including the surface emitting laser according to any one of (1) to (18).

(20) A method for manufacturing a surface emitting laser, the method including:

a step of laminating a structure including a laminated structure in which a first active layer, a selected oxide layer, a tunnel junction, and a second active layer are laminated in that order on a first multilayer film reflector, and laminating a second multilayer film reflector on the structure to generate a laminate;

a step of etching the laminate until at least a side surface of the selected oxide layer is exposed to form a mesa; and a step of selectively oxidizing the selected oxide layer from the side surface side to form an oxide confinement layer.

(21) A surface emitting laser array including a plurality of the surface emitting lasers according to any one of (1) to (20).

(22) An electronic device including the surface emitting laser according to any one of (1) to (20).

(23) An electronic device including the surface emitting laser array according to (21).

REFERENCE SIGNS LIST

100, 100-1 to 100-6, 200, 200-1 to 200-4 Surface emitting laser
101 Substrate
102 First multilayer film reflector
104-1 First active layer
104-2 Second active layer
104-3 Third active layer
106 Oxide confinement layer
106-1 First oxide confinement layer
106-2 Second oxide confinement layer
108 Tunnel junction
108-1 First tunnel junction
108-2 Second tunnel junction
108a p-type semiconductor layer
108b n-type semiconductor layer
112 Second multilayer film reflector
113 Oxide confinement layer (another oxide confinement layer)

The invention claimed is:

1. A surface emitting laser comprising:
first and second multilayer film reflectors;
first to third active layers laminated together between the first and second multilayer film reflectors;
a tunnel junction disposed between the first active layer and the second active layer;
a first oxide confinement layer disposed between the first active layer and a first multilayer film reflector;
a second oxide confinement layer disposed between the first active layer and the second active layer; and
a third oxide confinement layer disposed between the second active layer and the third active layer,
wherein the first to third oxide confinement layers are different from each other in optical thickness.

2. The surface emitting laser according to claim 1, wherein the third active layer is disposed at a position farther from an emission surface of the surface emitting laser than the first and second active layer.

3. The surface emitting laser according to claim 2, wherein the first active layer is disposed at a position closer to the first multilayer film reflector and farther from the second multilayer film reflector.

4. The surface emitting laser according to claim 2, wherein the one active layer is disposed at a position closer to one of the first and second multilayer film reflectors that is closer to the emission surface than another of the first and second multilayer film reflectors that is farther from the emission surface.

5. The surface emitting laser according to claim 1, wherein the one active layer is disposed at a position closer to an emission surface of the surface emitting laser than another active layer of the two adjacent active layers.

6. The surface emitting laser according to claim 5, wherein the one active layer is disposed at a position closer to one of the first and second multilayer film reflectors that is farther from the emission surface than another of the first and second multilayer film reflectors that is closer to the emission surface.

7. The surface emitting laser according to claim 5, wherein the one active layer is disposed at a position closer to one of the first and second multilayer film reflectors that is closer to the emission surface than another of the first and second multilayer film reflectors that is farther from the emission surface.

8. The surface emitting laser according to claim 1, wherein the plurality of active layers is at least three active layers,
the tunnel junction is disposed between two adjacent active layers of each set of at least two sets of two adjacent active layers among the plurality of active layers, and
the oxide confinement layer is disposed between one active layer of at least one set of two adjacent active layers of the at least two sets of two adjacent active layers and the tunnel junction disposed between the two adjacent active layers.

9. The surface emitting laser according to claim 8, wherein the at least three active layers include first, second, and third active layers,
the first, second, and third active layers are laminated in that order,
a first tunnel junction, which is the tunnel junction, is disposed between the first and second active layers,
a second tunnel junction, which is the tunnel junction, is disposed between the second and third active layers, and
the oxide confinement layer is disposed between the first active layer and the first tunnel junction and/or between the second active layer and the second tunnel junction.

10. The surface emitting laser according to claim 9, wherein the first active layer is an active layer disposed at a position farthest from an emission surface of the surface emitting laser among the plurality of active layers.

11. The surface emitting laser according to claim 10, wherein a first oxide confinement layer, which is the oxide confinement layer, is disposed between the first active layer and the first tunnel junction.

12. The surface emitting laser according to claim 11, wherein a second oxide confinement layer, which is the oxide confinement layer, is disposed between the second active layer and the second tunnel junction.

13. The surface emitting laser according to claim 11, wherein the oxide confinement layer is not disposed between the second active layer and the second tunnel junction.

14. The surface emitting laser according to claim 1, wherein both the first oxide confinement layer and the second oxide confinement layer are formed by selectively oxidizing a layer formed by an AlGaAs-based compound semiconductor.

15. The surface emitting laser according to claim 1, wherein the tunnel junction has a layer structure in which
a p-type semiconductor layer and an n-type semiconductor layer are laminated together, and
the oxide confinement layer is disposed on the p-type semiconductor layer side.

16. The surface emitting laser according to claim 1, wherein,
if an oscillation wavelength of the surface emitting laser is $\lambda$,
the first active layer, the tunnel junction, and the first oxide confinement layer are disposed within an optical thickness of $3\lambda/4$.

17. An electronic device comprising the surface emitting laser according to claim 1.

18. A method for manufacturing a surface emitting laser, the method comprising:
a step of laminating a structure including a laminated structure in which a first active layer, a selected oxide layer, a tunnel junction, and a second active layer are laminated in that order on a first multilayer film reflector, and laminating at least a second multilayer film reflector on the structure to generate a laminate;
a step of etching the laminate until at least a side surface of the selected oxide layer is exposed to form a mesa; and
a step of selectively oxidizing the selected oxide layer from the side surface side to form an oxide confinement layer, wherein
a second oxide confinement layer disposed between the first active layer and the second active layer,
a third oxide confinement layer disposed between the second active layer and the third active layer, and
the first oxide confinement layer, the second oxide confinement layer, and the third oxide confinement layer are different from each other in optical thickness.

19. The surface emitting laser of claim 1, further comprising a spacer layer disposed between the first active layer and the first oxide confinement layer.

* * * * *